(12) United States Patent
Williams et al.

(10) Patent No.: US 6,291,298 B1
(45) Date of Patent: Sep. 18, 2001

(54) PROCESS OF MANUFACTURING TRENCH GATE SEMICONDUCTOR DEVICE HAVING GATE OXIDE LAYER WITH MULTIPLE THICKNESSES

(75) Inventors: Richard K. Williams, Cupertino; Wayne B. Grabowski, Los Altos, both of CA (US)

(73) Assignee: Advanced Analogic Technologies, Inc., Sunnyvale, CA (US)

( * ) Notice: Subject to any disclaimer, the term of this patent is extended or adjusted under 35 U.S.C. 154(b) by 0 days.

(21) Appl. No.: 09/318,403

(22) Filed: May 25, 1999

(51) Int. Cl.$^7$ .................................................. H01L 21/336
(52) U.S. Cl. ...................... 438/270; 438/268; 438/274; 257/330
(58) Field of Search .................................. 438/270, 269, 438/268, 271, 272, 273, 274, 206, 212; 257/330, 333

(56) References Cited

U.S. PATENT DOCUMENTS 5,473,176 * 12/1995 Kakumoto ............................ 257/192
6,020,600 * 2/2000 Miyajima et al. ...................... 257/76
6,074,909 * 6/2000 Gruening .............................. 438/242

OTHER PUBLICATIONS

Wolf, S. et al., Silicon Processing for the VLSI Era, 1986, vol. 1, pp. 161–187 and 335–345, ISBN 0–961672–3–7, Copyright 1986 Lattice Press, P.O. Box 340, Sunset Beach, California 90742.

* cited by examiner

Primary Examiner—Charles Bowers
Assistant Examiner—Hsien-Ming Lee
(74) Attorney, Agent, or Firm—Skjerven Morrill MacPherson LLP; David E. Steuber

(57) ABSTRACT

The a trench semiconductor device such as a power MOSFET the high electric field at the corner of the trench is diminished by increasing the thickness of the gate oxide layer at the bottom of the trench. Several processes for manufacturing such devices are described. In one group of processes a directional deposition of silicon oxide is performed after the trench has been etched, yielding a thick oxide layer at the bottom of the trench. Any oxide which deposits on the walls of the trench is removed before a thin gate oxide layer is grown on the walls. The trench is then filled with polysilicon in or more stages. In a variation of the process a small amount of photoresist is deposited on the oxide at the bottom of the trench before the walls of the trench are etched. Alternatively, polysilicon can be deposited in the trench and etched back until only a portion remains at the bottom of the trench. The polysilicon is then oxidized and the trench is refilled with polysilicon. The processes can be combined, with a directional deposition of oxide being followed by a filling and oxidation of polysilicon. A process of forming a "keyhole" shaped gate electrode includes depositing polysilicon at the bottom of the trench, oxidizing the top surface of the polysilicon, etching the oxidized polysilicon, and filling the trench with polysilicon.

27 Claims, 82 Drawing Sheets

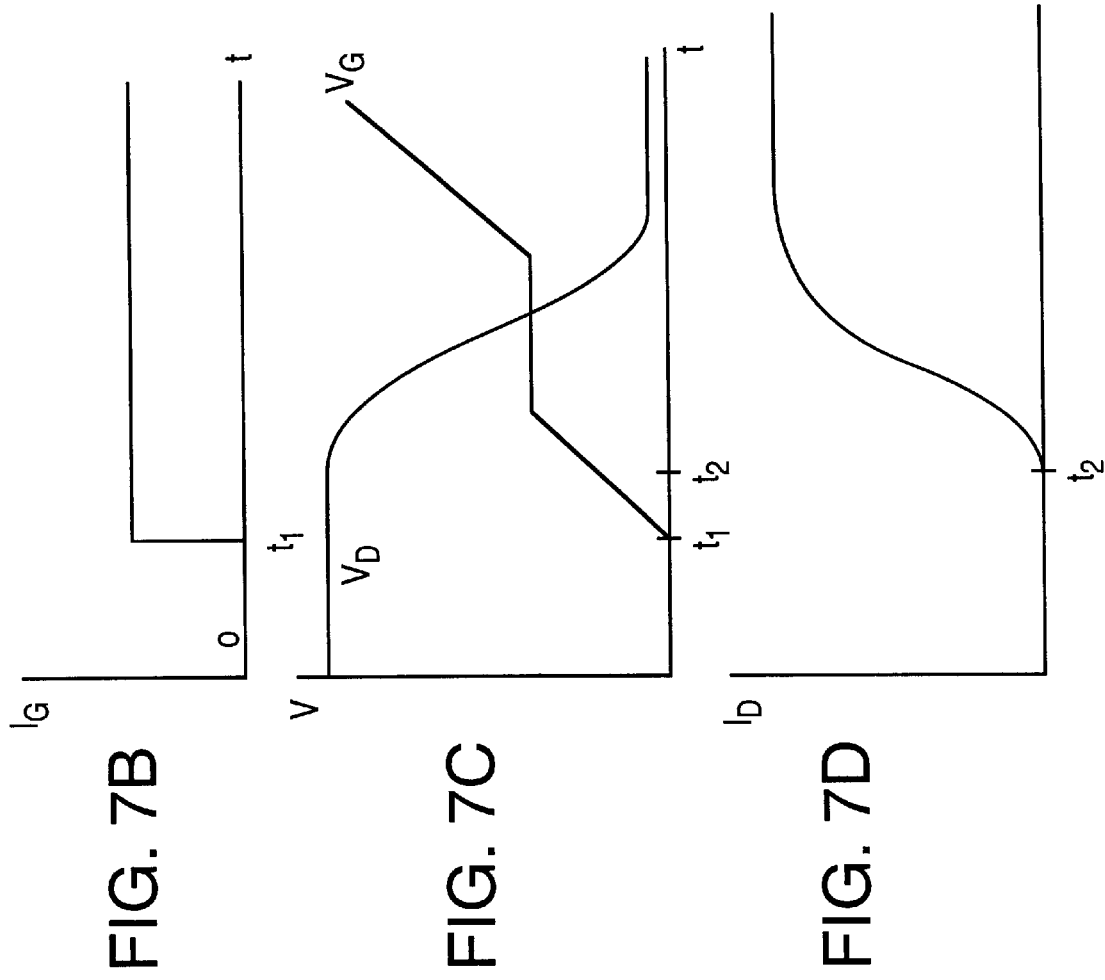
FIG. 7B
FIG. 7C
FIG. 7D
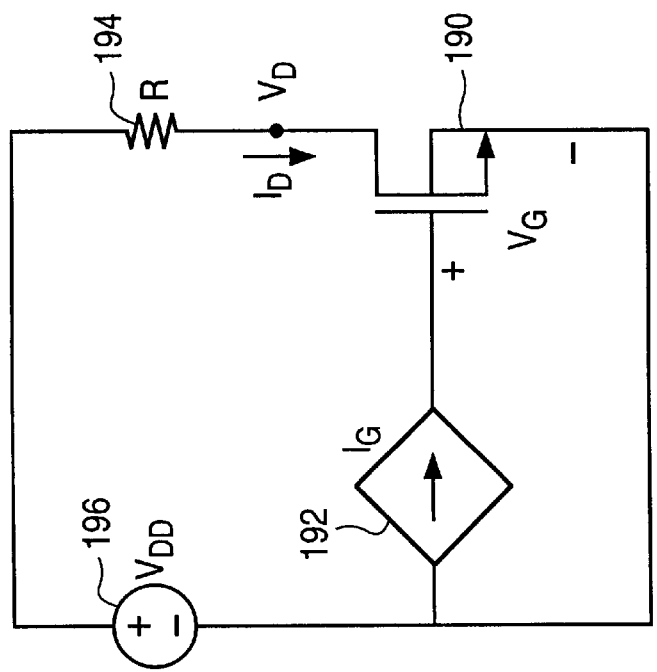
FIG. 7A

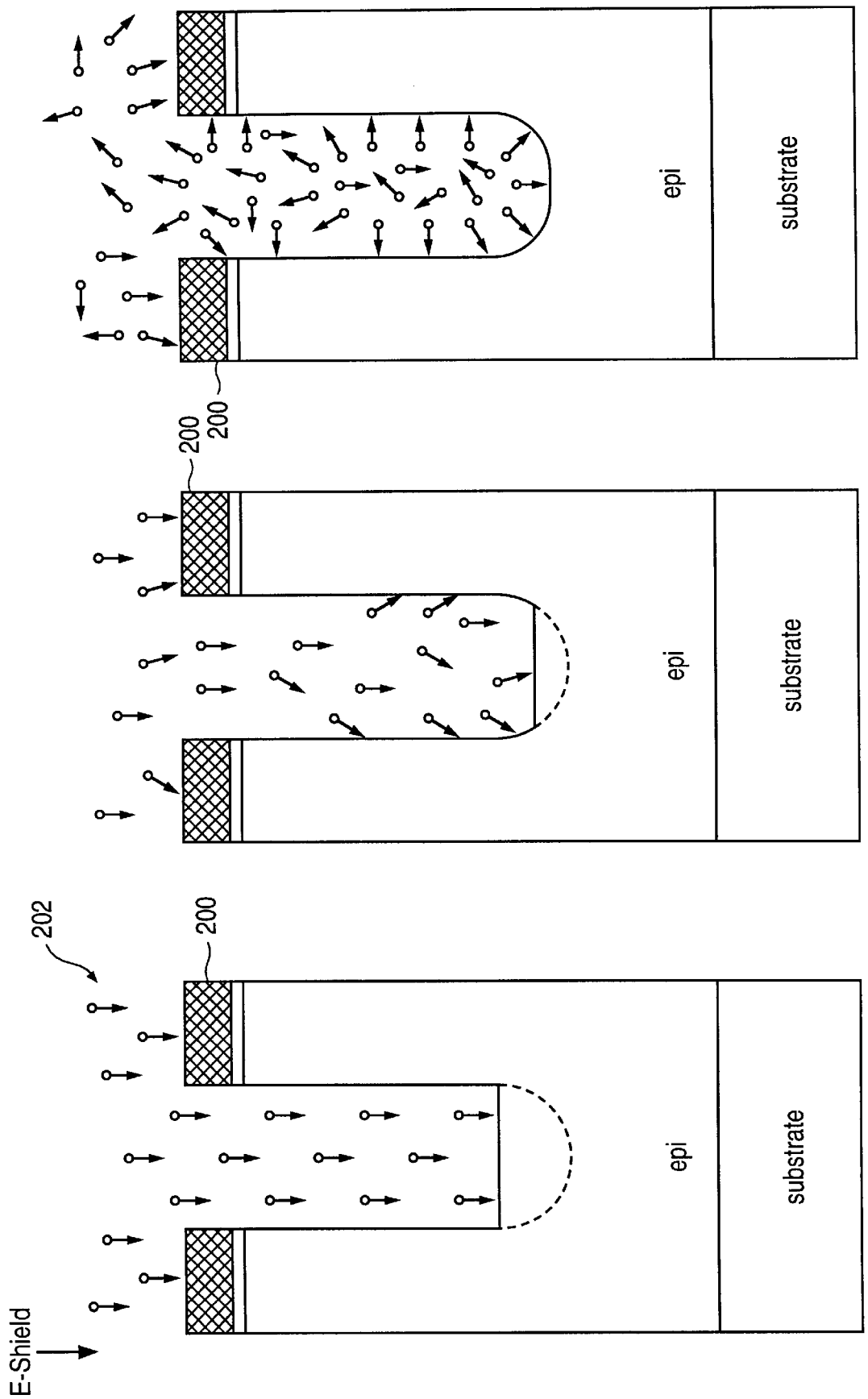

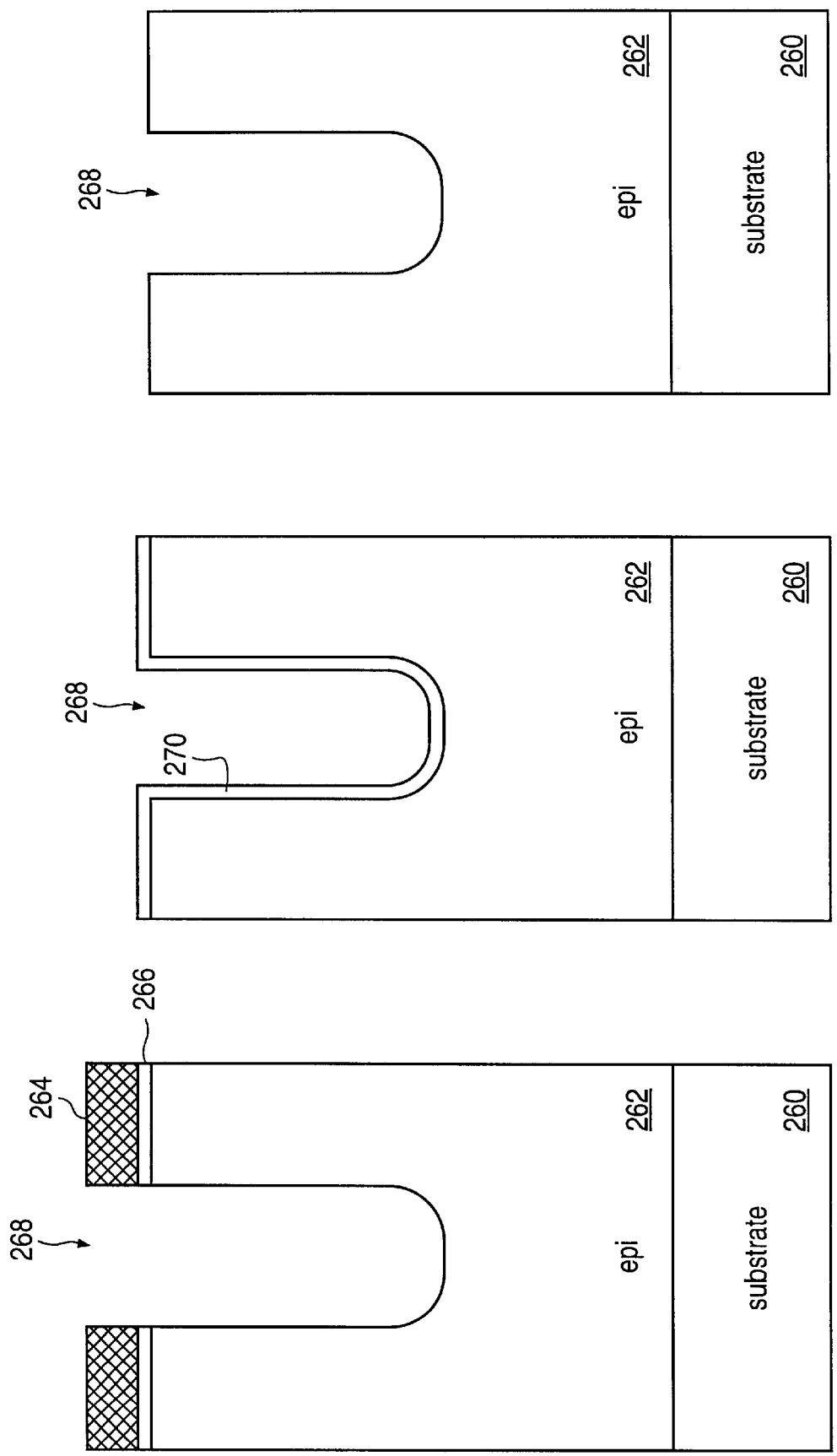

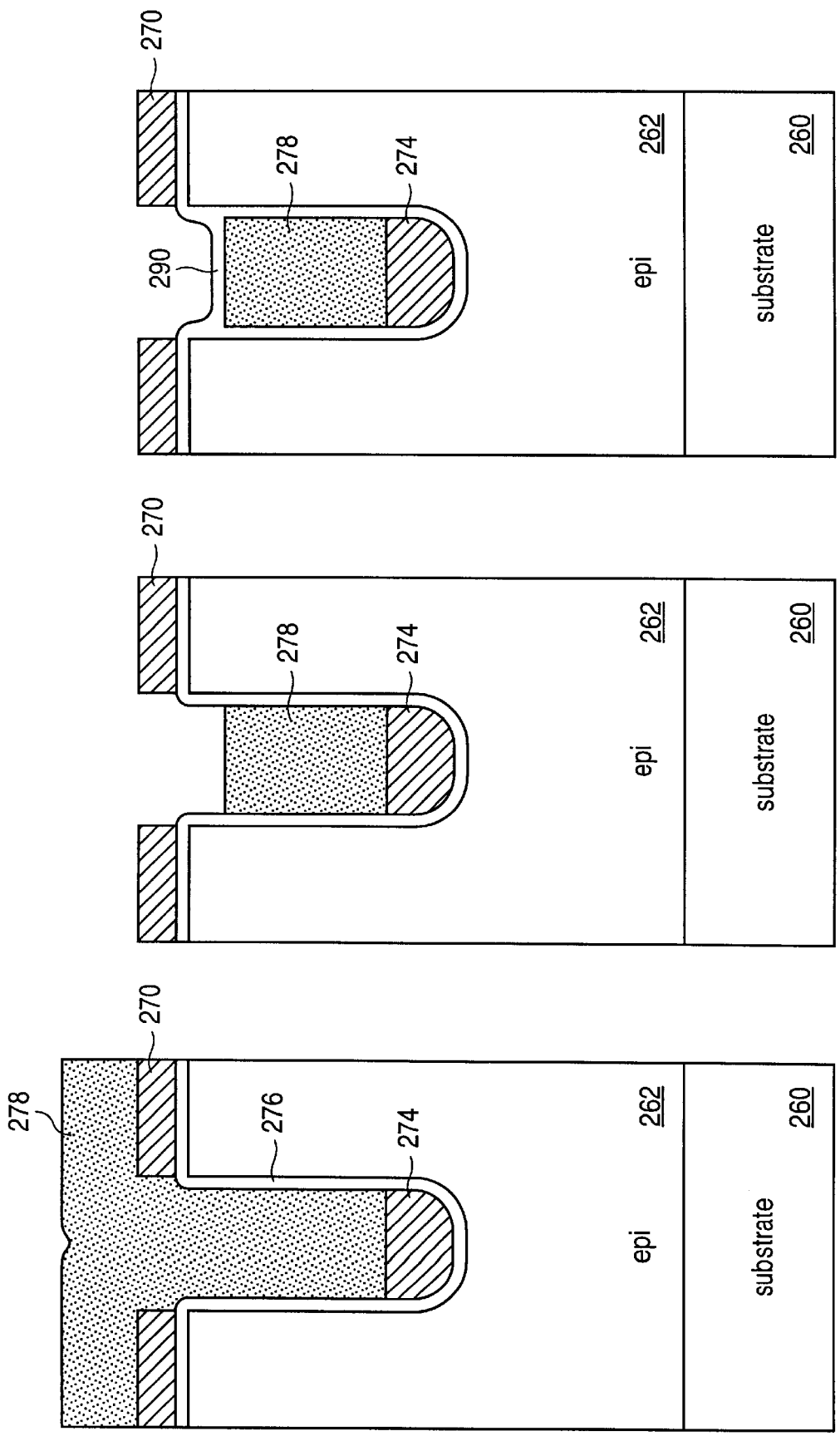

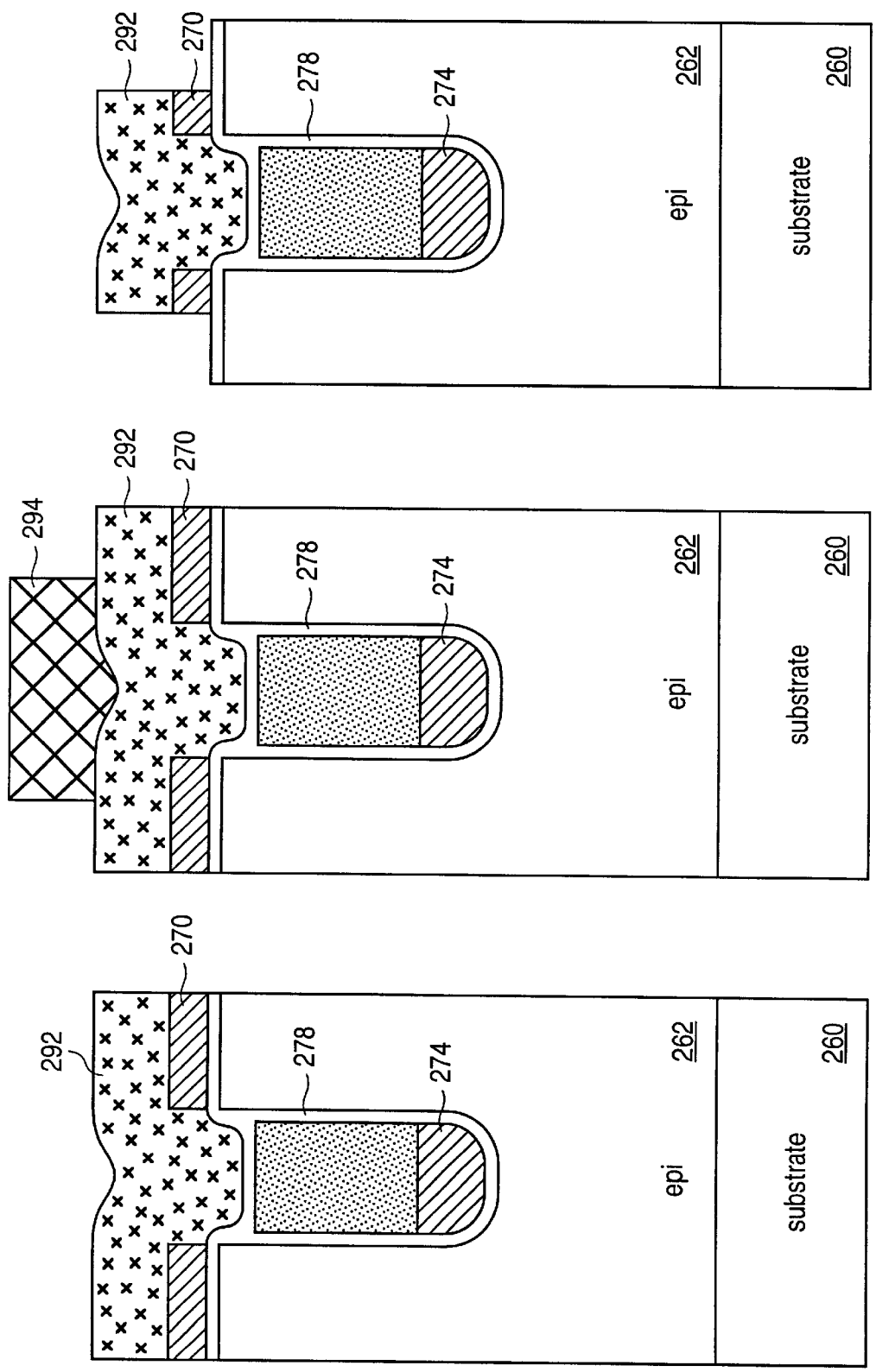

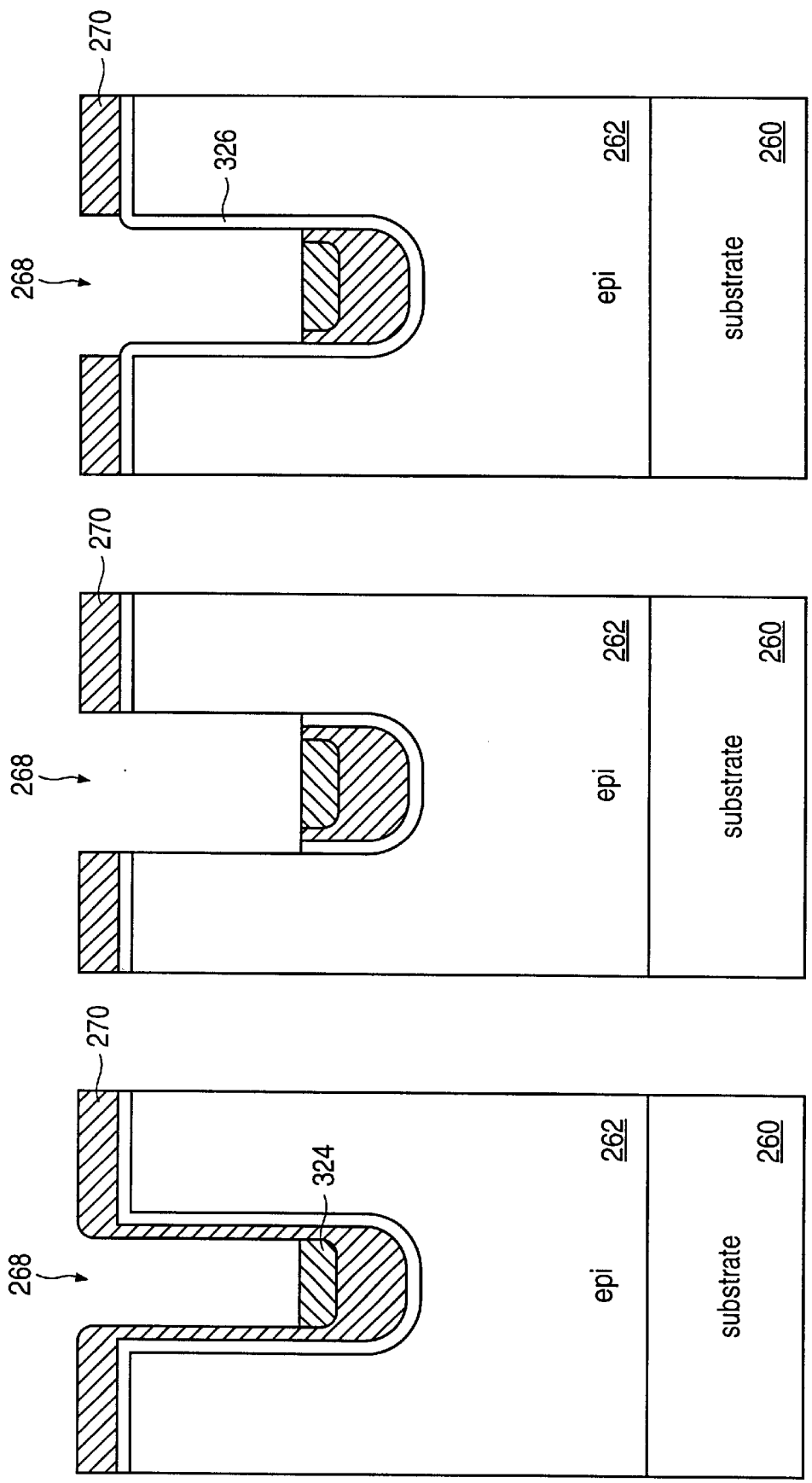

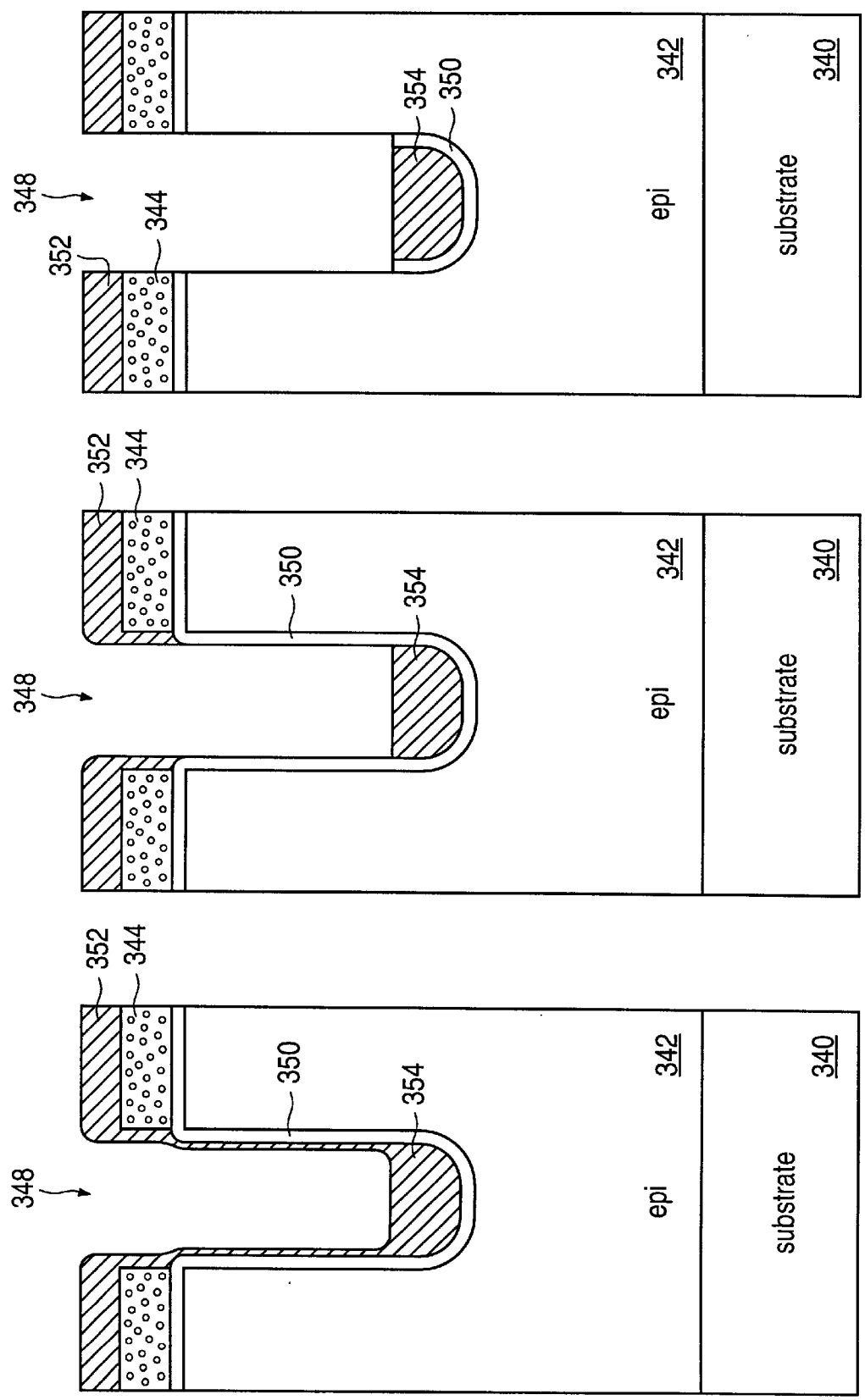

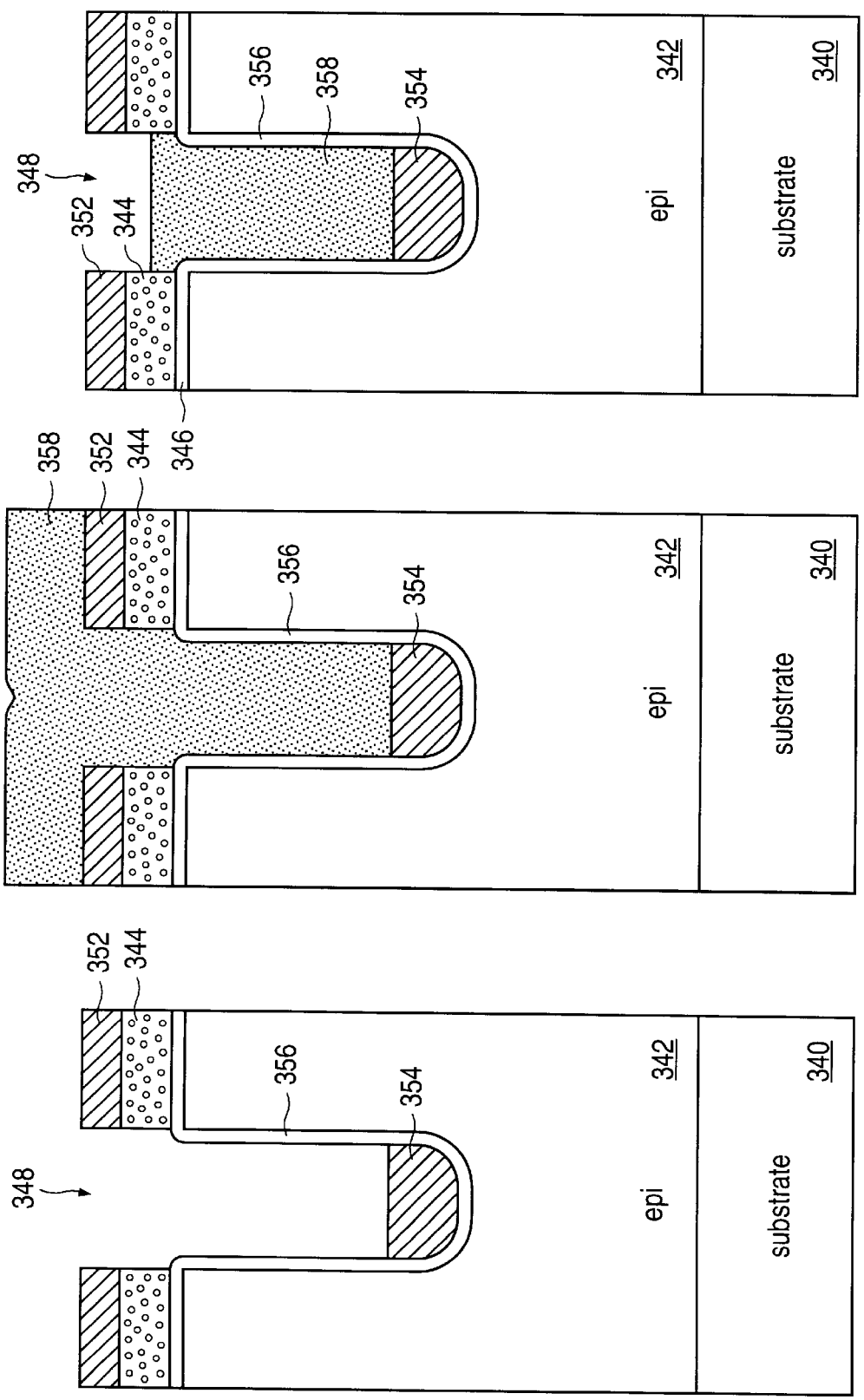

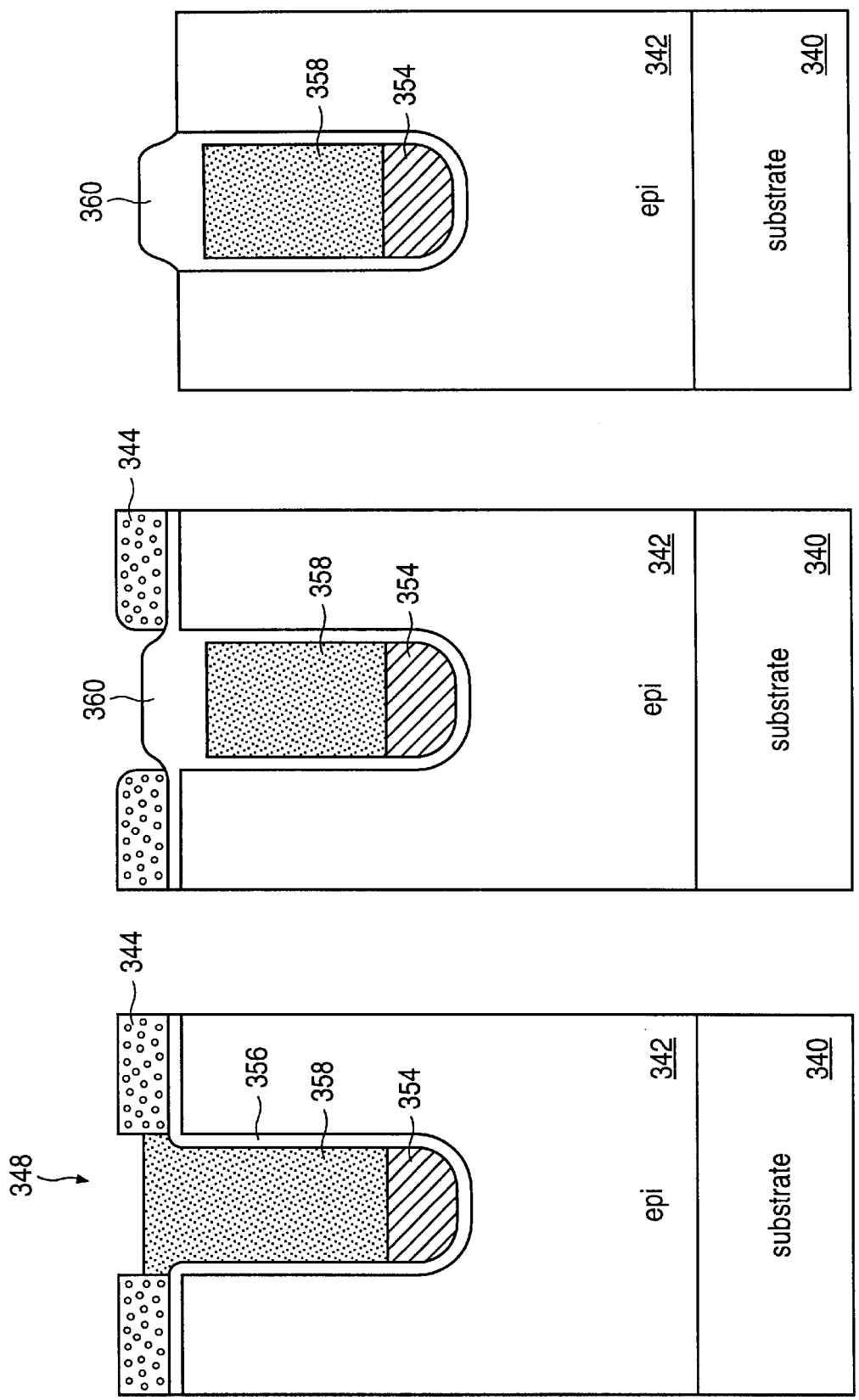

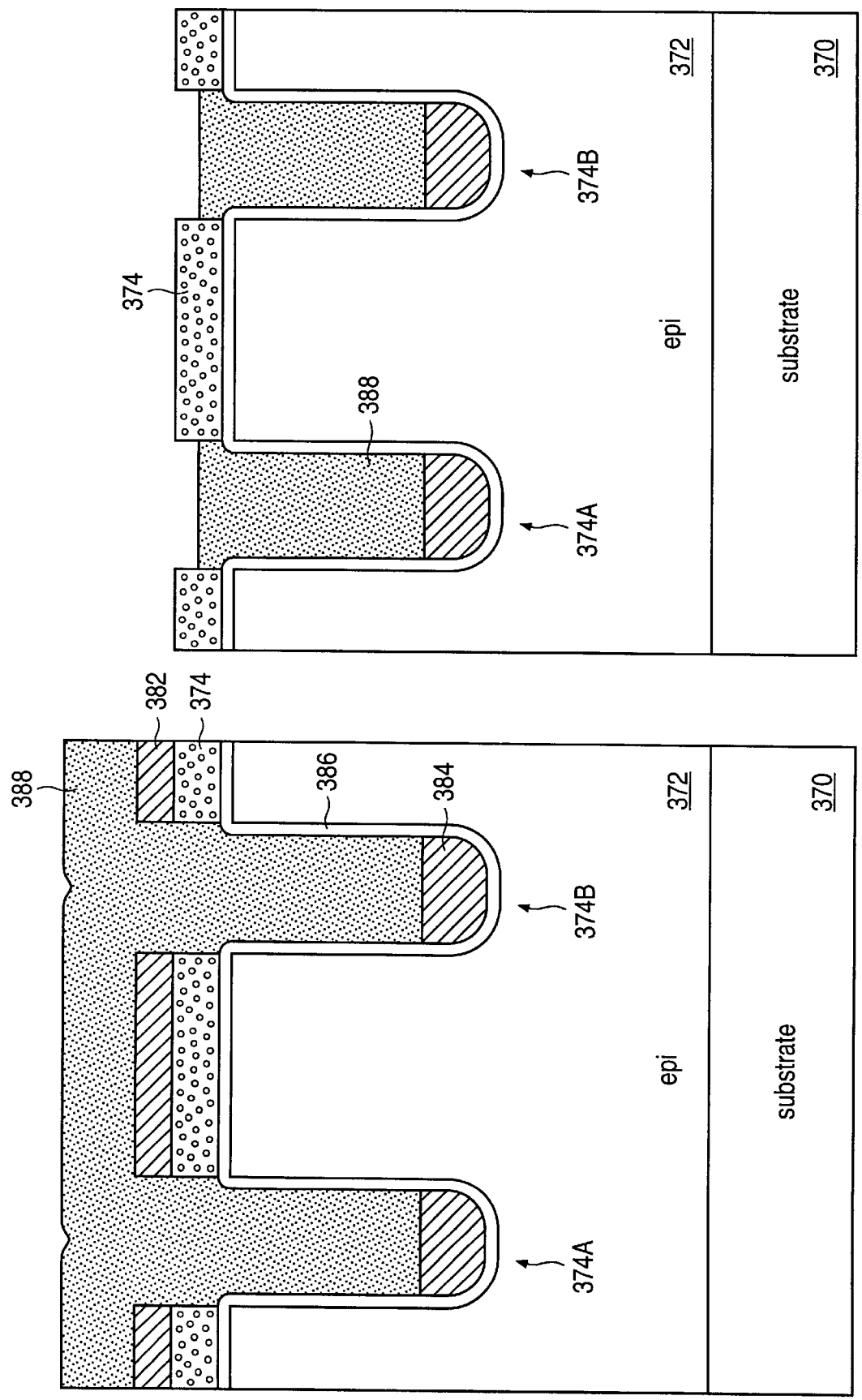

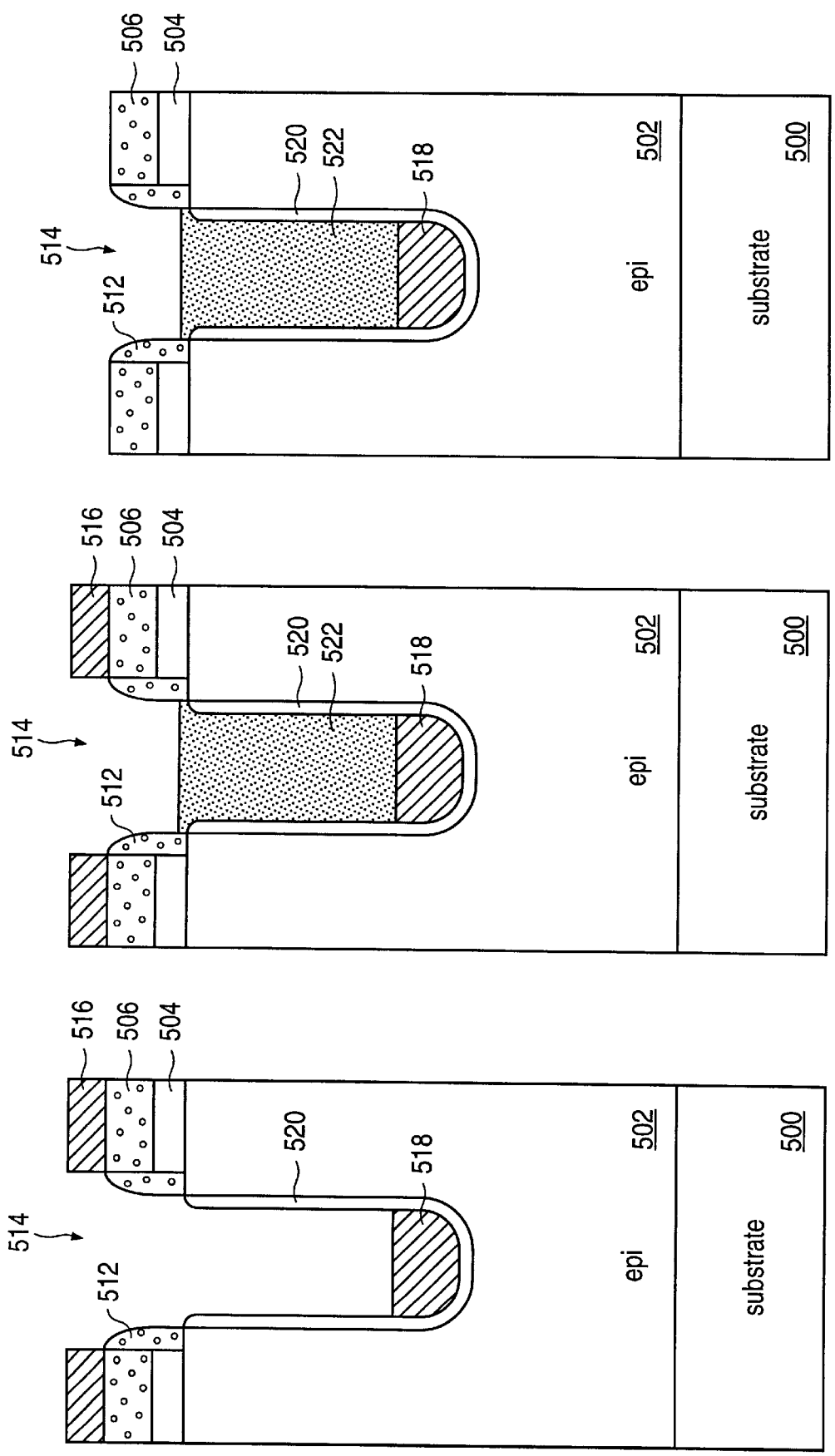

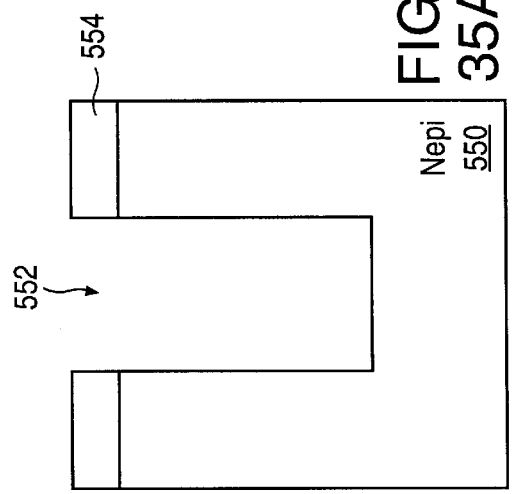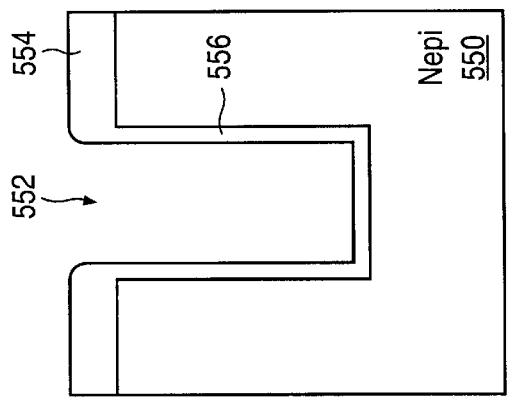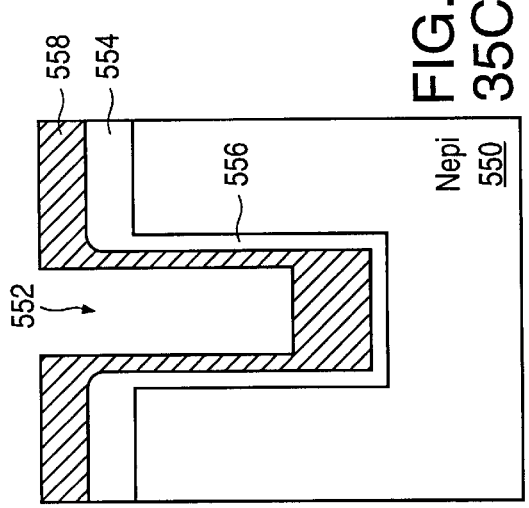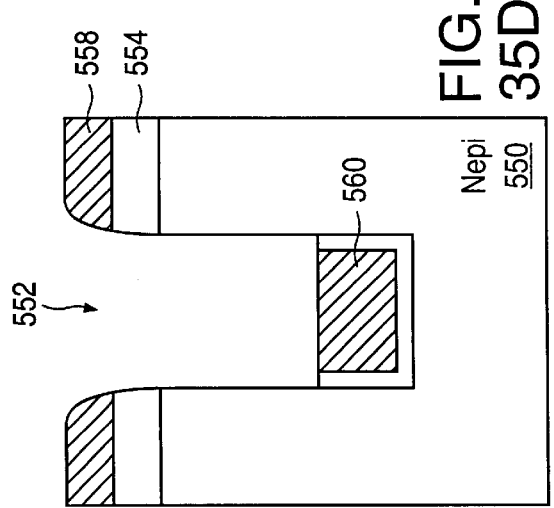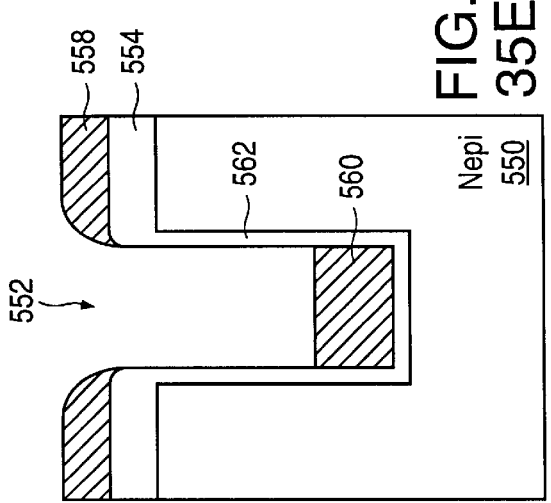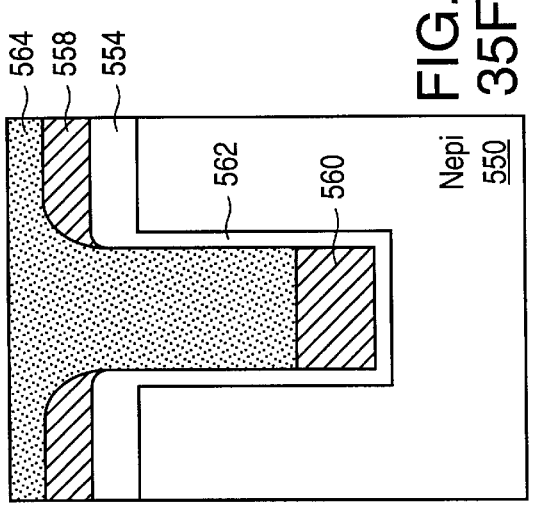

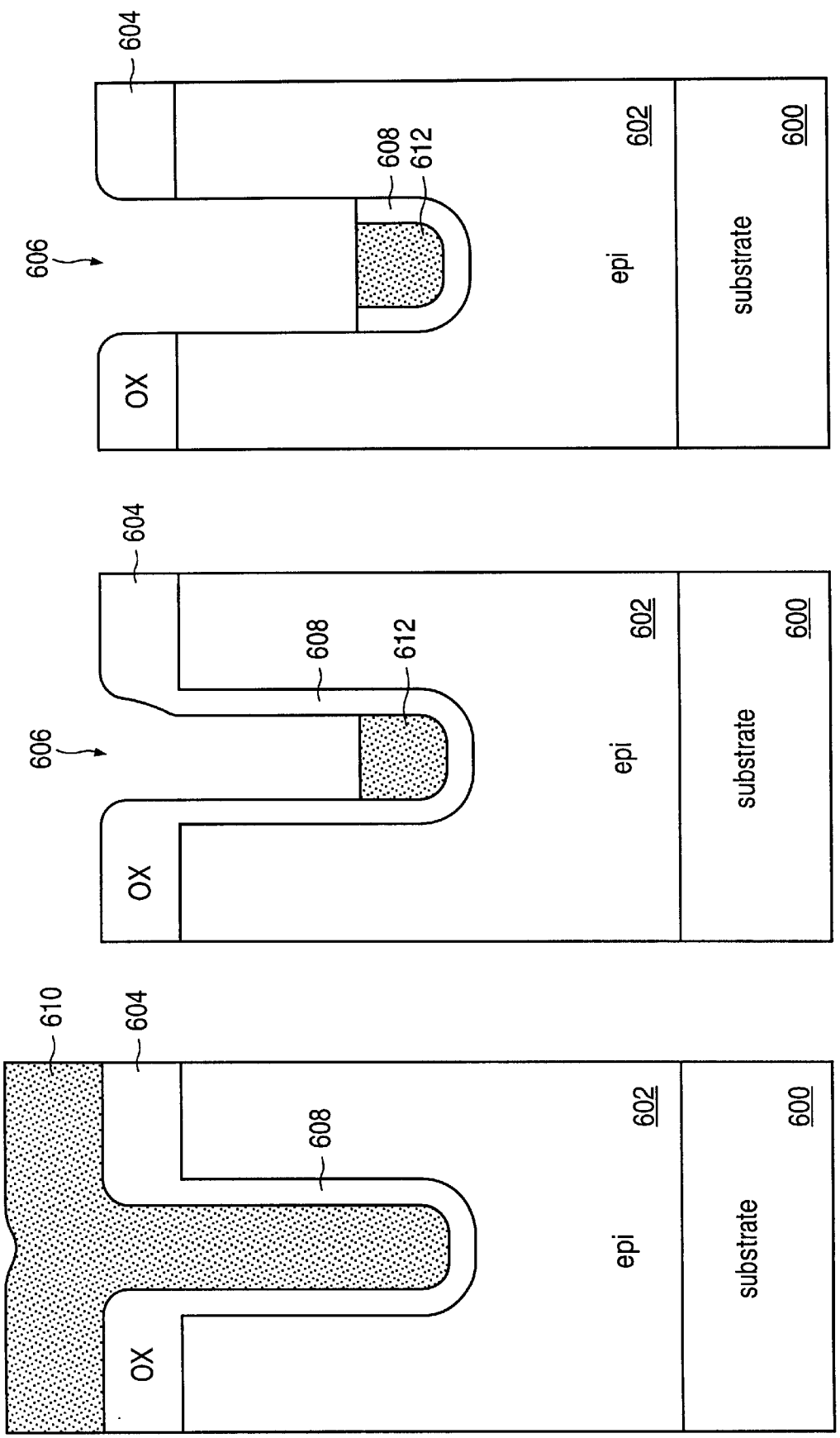

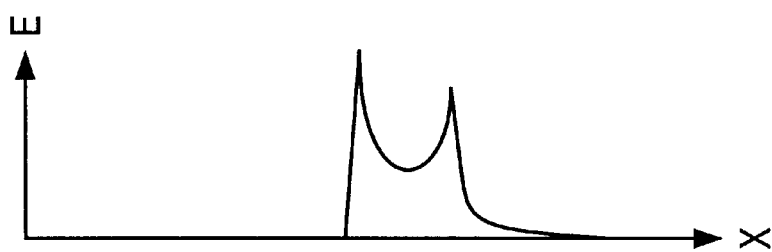
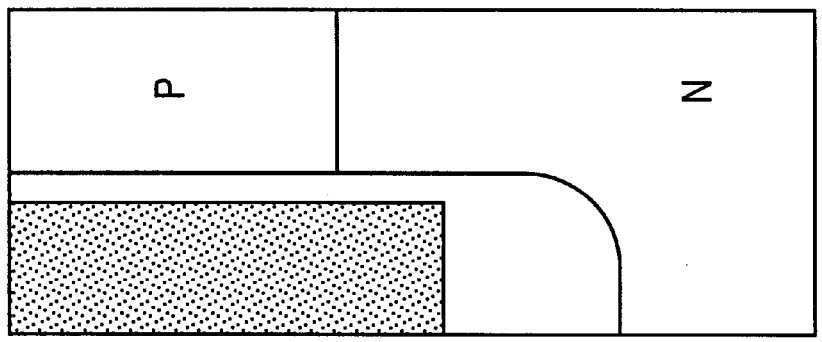
FIG. 42B
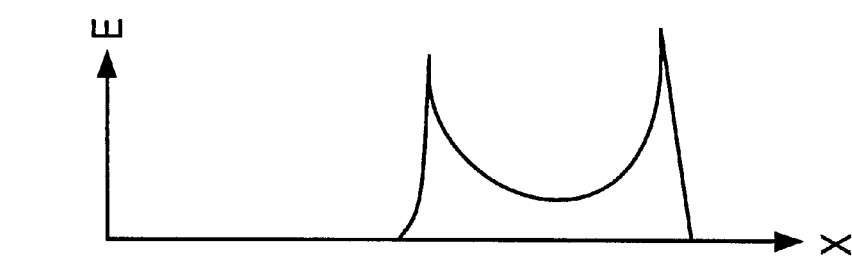
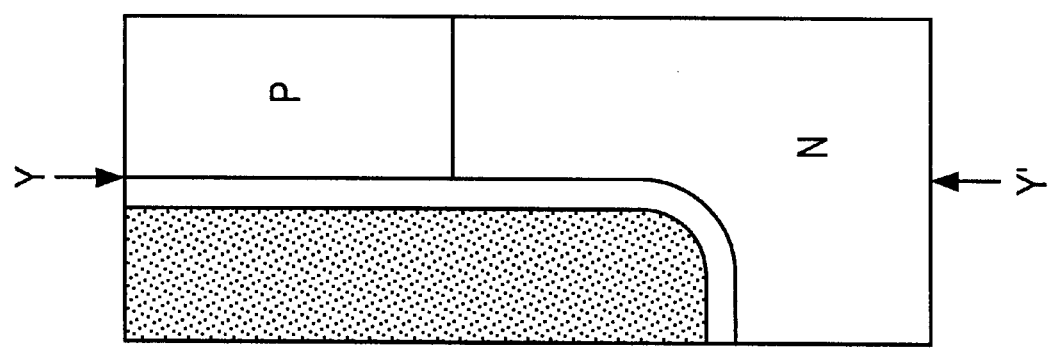
FIG. 42A

PROCESS OF MANUFACTURING TRENCH GATE SEMICONDUCTOR DEVICE HAVING GATE OXIDE LAYER WITH MULTIPLE THICKNESSES

FIELD OF THE INVENTION

This invention relates to semiconductor devices having a gate electrode that is embedded in a trench and in particular to structures and methods of protecting such devices against damage to the gate oxide layer when the devices are subjected to high voltage differences while in an off condition. The invention particularly relates to trench MOSFETs.

BACKGROUND OF THE INVENTION

There is a class of semiconductor devices in which a gate electrode is formed in a trench that extends from the surface of a semiconductor chip. One example is a trench-gated MOSFET, and other examples include insulated gate bipolar transistors (IGBTs), junction field-effect transistors (JFETs) and accumulation-mode field-effect transistors (ACCUFETs). All of these devices share the common characteristic of a trench structure where thie bottom of the trench for some reason can be exposed to high electric fields or where the bottom of the trench might form a parasitic capacitor including the gate electrode and the semiconductor material surrounding the trench.

FIGS. 1 through 10 show cross-sectional views and characteristics of known trench-gated devices. FIG. 1 shows a trench-gated MOSFET 100 having a top metal layer 102, a gate 104 formed in a trench 106 and separated from an epitaxial silicon layer 108 by a gate oxide layer 110. MOSFET 100 also includes an N+source region 112 and a P-body 114. The drain of MOSFET 100 includes the N-epi layer 108 and an N+substrate 116. A deep P+region 118 is created under P-body 114, as suggested in U.S. Pat. No. 5,072,266 to Bulucea et al. The PN junction between deep P+region 118 and N-epi layer 108 forms a voltage-clamping diode 117 where avalanche breakdown normally occurs. A P+body contact region 119 forms a contact between metal layer 102 and P-body 114. The gate, which is typically formed of polysilicon, is protected from the metal layer 102 by an oxide layer 120 that is above the gate 104 and that is patterned with a feature that does not correspond to the trench itself, typically a contact mask.

As shown, gate oxide layer 110 consists of a uniform thin layer of oxide along the three sides of the polysilicon gate 104. That is, the portions of gate oxide layer 110 on the sidewalls of the trench and also the curved and linear portions of the gate oxide layer 110 at the bottom of the trench (except for some stress-related and etch-related changes in the oxide thickness that occur at the trench bottom) are generally of a uniform thickness in the range of, for example, 150 Å to 1,200 Å.

There are many variations of this general type of MOSFET. For example, FIG. 2 shows a MOSFET 130 which is generally similar to MOSFEFT 100 but does not include a deep P+region 118. The gate of MOSFEFT 130 protrudes slightly through P-body 132 because the depth of P-body 132 and the depth of the trench 134 are determined in two unrelated processes. Thus, in vertical devices there is no guarantee of the net overlap of the polysilicon gate into the drain region. It turns out that this variation affects the operation of the device and may affect its reliability as well. Also, in FIG. 2 there is no additional diode formed by the deep P+region 118 to clamp the voltage, so breakdown can occur wherever the voltage is raised to the point that the device goes into avalanche.

MOSFET 140, shown in FIG. 3, is variation of MOSFETs 100 and 130, where the MOSFET cells 142 contain no deep P+region, and a diode cell 144 containing a deep P+region is distributed at predetermined intervals throughout the array to act as a voltage clamp and limit the strength of the electric fields in the MOSFET cells. In MOSFET 140, the gate oxide layer is of uniform thickness.

FIGS. 4A–4G illustrate various aspects of the breakdown phenomenon. FIG. 4A shows the electric field strength contours at breakdown in a trench-gated device 150 having a relatively thick gate oxide layer. Device 150 is in effect a gated diode, a structural element of most trench-gated vertical power MOSFETs. As indicated, the strongest electric field, where impact ionization would occur during avalanche breakdown, is located at the junction directly beneath the P+body region. In contrast, device 160, shown in FIG. 4B, has a relatively thin gate oxide layer. While some ionization still occurs underneath the P+region, the highest electric field levels are now located near the corner of the trench. A field plate induced breakdown mechanism causes the strength of the electric field to increase.

FIGS. 4C and 4D show the ionization contours of devices 150 and 160, respectively, when they go into avalanche breakdown. Whether there is a thick ate oxide layer, as in FIG. 4C, or thin gate oxide layer, as in FIG. 4D, eventually in "deep" avalanche, i.e., when the device is forced to conduct largie currents in avalanche, breakdown starts to occur at the corner of the trench. Even in the thick oxide case (FIG. 4C), where the peak electric field is not at the corner of the trench (FIG. 4A), as the drain voltage increases eventually ionization occurs at the corner of the trench. However, there are more contours in FIG. 4D, indicating a higher ionization rate where the gate oxide layer is thin.

FIG. 4E shows that if one introduces a diode clamp including a deep P+region, as shown on the right-hand side, the diode will break down at a lower voltage. and avalanche breakdown should not occur at the corner of the trench. If the resistance of the current path through the diode is low enough, then the diode will clamp the maximum voltage of the device. As a result, the voltage will never rise to the point that avalanche breakdown occurs near the corners of the trenches.

FIG. 4F is a graph showing the breakdown voltage (BV) as a function of gate oxide thickness ($X_{OX}$) for 20 V and 30 V devices. The doping concentration of the epitaxial (epi) layer in the 30 volt device is more lightly doped. The 30 V device would ideally have an avalanche breakdown of around 38 volts. In the 20 volt device the epi would be more heavily doped and the device would ideally have an avalanche breakdown of around 26 or 27 V. As the gate oxide is thinned from 1,000 Å to a few hundred Å, basically the breakdown voltages are relatively constant or may actually even increase somewhat as the shape of the field plate of the gate is actually beginning to help relax the electric field. At thicknesses of less a few hundred Å, however, breakdown degradation begins to occur.

Beyond the point where the breakdown voltage begins to drop (below 30 V for the 30 V device epi and below 20 V for the 20 V device) is the area labeled field plate induced (fpi) breakdown. In this area, breakdown occurs near the trench. For a reliable device one needs to add a diode clamp having a breakdown that is lower than the breakdown in the field plate induced area, so that the diode breaks down first. With a diode having a breakdown voltage as shown in FIG. 4F, breakdown would never occur near the gate in the 30 V device, but that diode would have too high a breakdown voltage to protect a 20 V device. To protect the 20 V device, the breakdown voltage of the diode clamp would have to be below the curve for the 20 V device.

FIG. 4G is a schematic diagram of the devices shown in FIGS. 4A–4D showing a gated diode in parallel with a MOSFET and a diode voltage clamp in parallel with both the MOSIFET and gated diode. The arrangement is designed such that the diode clamp breaks down first. The gated diode never "avalanches" before the diode clamp. This becomes more and more difficult to do as the gate oxide layer becomes thinner.

FIGS. 5A and 5B show the ionization contours in a device 170 having a sharp trench corner and a device 172 having a rounded trench corner. FIG. 5B indicates that rounding the trench corners does reduce the magnitude of the ionization, but ultimately if one drives the device deeply enough into breakdown, the breakdown still occurs at the trench corner, and the device is at risk.

FIGS. 6A–6C show the electric field strength contours, the equipotential lines and the electric field lines, respectively, in a MOSFET 180. The gate of MOSFET 180 is tied to the source and body and is grounded, ind the drain is biased at $V_D$). From FIG. 6B it is evident that the drain voltage $V_D$ is divided and spaced out across the region. On the left hand side of FIG. 6B, the equipotential lines are squeezed closer together, and particularly around the trench corner they are squeezed even tighter. This produces electric field lines that are at right angles to the equipotential lines, as shown in FIG. 6C. One can see why a high electric field occurs at the trench corner and why rounding the corner does not solve this problem. It is basically a volumetric problem in that there is an electric field that terminates on an electrode having a lower surface area, namely the gate, and so the electric field lines are crowded at the corner.

FIG. 6D shows MOSFET 180 when it is turned on by putting a positive voltage $V_G$ on the gate. A current flows down the side wall of the trench and then it also spreads out along the bottom of the trench and into the region below the mesa at an angle from the side of the trench. However, in the process the current flows through areas that have high electric fields, as shown by the electric field contours of FIG. 6A. When a high current flows through an area that has a high field (and that would be the case where the device is saturated), the current carriers collide with the atoms of the epi layer and knock off, by momentum transfer, additional carriers. This forms new electron-hole pairs that in turn are accelerated and create additional collisions, ionizing additional atoms.

FIG. 6E shows the ionization contours in MOSFET 180 when it is in the on state. The ionization contours shown in FIG. 6E are different from those shown in FIG. 4C, for example when device 150 is in the off state. The difference is that the ionization contours pull upwards all the way around the side of the trench, even up near the P-body. This has a number of damaging effects on the device. One effect is that it creates electron-hole pairs in the vicinity of the gate oxide that can be accelerated quite easily by the high electric field in that area. The electron-hole pairs can actually be trapped in the gate oxide and they can damage the gate oxide.

Furthermore, this phenomenon produces an upper limit in the amount of voltage that one can put on the device, because so many electron-hole pairs may be produced that they begin to modulate the effective doping concentration of the epitaxial layer, by making the region around the side of the trench seem more heavily doped than it actually is. That occurs because electrons from the newly generated electron-hole pairs are swept into the substrate by the positive drain voltage $V_D$, and the holes are swept into the P–body. The net effect is that, since the electrons and holes can only travel at a certain velocity, the local charge distribution adjusts itself to maintain charge neutrality. Specifically, surrounding the reverse-biased junction is a region known as a depletion region or space charge region, where (in the absence of impact ionization) no free charge carriers are present. The immobile charge residing within the depletion region, namely positive ions on the N–type side of the junction and negative ions on the P–type side of the junction. produces a "built-in" electric field across the junction. In the presence of impact ionization, the holes drifting across the N–type region add to the positive fixed charge and thereby increase the electric field, further enhancing the impact ionization process. These excess holes make the epitaxial region, which in this example is N-type material, appear more heavily doped because of the increase in the "built-in" field. The net effect is an increase in the electric field, which degrades the breakdown. This effect is shown in the current-voltage characteristics of FIG. 6F where the drain current $I_D$ increases dramatically at a certain drain voltage. The drain voltage at which this happens is the same for each of the gate voltages shown. This problem becomes worse as the gate oxide is thinned.

Another problem with the trench device relates to capacitance. FIG. 7A is a schematic diagram of a MOSFET 190 having a gate driven by a current source 192 and having resistive load 194. A voltage source 196 connected to the source and drain supplies a voltage $V_{DD}$ resulting in a drain voltage $V_D$ at the drain. As shown in FIGS. 7B–7D, at a time $t_1$ current source 192 begins to supply a constant current to the gate and the voltage on the gate relative to the source, labeled $V_G$ in FIG. 7C, starts to rise. But because it does not immediately hit threshold, the drain voltage $V_D$ does not start to fall because MOSFET 190 is not yet turned on. As soon as the $V_G$ hits threshold, at time $t_2$, MOSFET 192 saturates and turns on and carries current. $V_D$ starts to drop, but as it starts to drop it causes a capacitive coupling between the drain and the gate of MOSFET 192 and halts the upwards progression of the gate voltage $V_G$. $V_G$ remains flat until MOSFET 192 gets into its linear region. Then, MOSFET 192 begins to look like an on-resistance in a voltage divider, with a small voltage across MOSFET 192 and most of the voltage $V_{DD}$ across resistor 194.

At that point the capacitive coupling effect between gate and drain is satisfied and the $V_G$ continues its progiress to a higher voltage. The plateau is due to a gate-to-drain overlap capacitance similar to the Miller effect, but this is not a small signal effect. This is a large signal effect. At that time the drain current $I_D$ also continues to rise, but as shown in FIG. 7D its upward progression is slowed.

FIG. 7E shows a plot of $V_G$ as function of the charge on the gate $Q_G$, where $Q_G$ is equal to $I_G$ times the time t, $I_G$ being a constant. The gate voltage $V_G$ rises to a certain level, then it remains constant, and then it rises again. If there were no feedback capacitance between the drain and gate, the voltage would rise linearly, but instead the straight line is interrupted by the plateau.

In FIG. 7E, the point $V_{G1}$, $Q_{G1}$ corresponds to a certain capacitance because C is equal to $\Delta Q$ over $\Delta V$. Since it takes more charge to get to the point, $Q_{G2}$ and $V_{G1}$, then that point reflects more capacitance. So the capacitance in the device, as shown in FIG. 7F, starts at a low value $C_{ISS}$, which is relatively constant, and then it jumps to a higher effective value $C_G(\text{eff})$, and then it is relatively constant. Because of this effect the device has a higher effective capacitance than is desirable during the switching transition. As a result, there is an undue amount of energy lost in turning the device on.

As shown in FIG. 7G, the input capacitance actually has a number of components, including the gate-to-source capacitance $C_{GS}$ and the gate-to-body capacitance $C_{GB}$, neither of which exhibits the amplification effect of the gate-to-drain capacitance $C_{GD}$. The gate-to-drain capacitance $C_{GD}$ is shown in FIG. 7G, around the bottom and side wall of the trench. The equivalent schematic is shown in FIG. 7H. Even if $C_{GD}$ is the same order of magnitude as $C_{GS}$ and $C_{GB}$, electrically it will look much larger (e.g., 5 to 10 times larger) because it is amplified during the switching process.

As indicated above, rounding the trench bottom helps to limit the damage to the gate oxide layer, although it is not a complete solution to the problem. FIGS. 8A–8C illustrate a process for forming a trench with rounded corners. In FIG. 8A small reaction ions 202 etch the silicon through an opening in a mask 200 at the surface. Ions 202 are accelerated by an electric field in a downward direction such that they etch a trench having essentially a straight side wall. When the trench reaches a certain depth the electric field is relaxed, as shown in FIG. 8B. Alternatively, one could possibly change the chemistry. At the end of the process, as shown in FIG. 8C, the electric field is modified so that the etching ions are traveling in all different directions. That begins to not only widen the trench, but also rounds out the bottom. Hence, the process includes an anisotropic etch that is converted to an isotropic etch. The anisotropy is also influenced by the formation of a polymer as a by-product of the etching operation on the sidewall of the trench. If the chemistry removes the polymer as soon as it forms, the etch will behave in a more isotropic way. If the polymer remains on the sidewall, only the bottom of the trench will continue to etch.

FIGS. 9A–9D show a method that includes creating a mask 210 (FIG. 9A), etching the trench 212 (FIG. 9B), forming an oxide layer 214 on the walls of the trench (FIG. 9C), which may be removed and then re-grown to remove defects (this is called sacrificial oxidation), and then filling the trench with a polysilicon layer 216 (FIG. 9D).

FIGS. 10A–10F illustrate a typical process of forming a trench MOSFET. The process starts with an N-epitaxial layer 220 grown on an N+substrate 222 (FIG. 10A). Using the process of FIGS. 9A–9C, for example, a polysilicon-filled trench 224 is formed in N-epi layer 220 (FIG. 10B). The surface may or may not be planar depending on how the surface oxides are made in the process. Then a P–body 226 is introduced, although the P–body 226 could be introduced prior to the formation of the trench 224 (FIG. 10C). Both process flows are manufacturable, but forming the trench first is preferable because the etching process can influence the doping concentrations in the P–body. Then the surface is masked and an N+source region 228 is implanted (FIG. 10D). An optional shallow P+region 230 is implanted to ohmic contact between the P–body and a metal layer to be deposited later. P+region 230 can be implanted through an opening in an oxide layer 232 that is deposited across the region and then etched to form a contact mask (FIG. 10E). The contact mask may or may not be used to define the P+region 232. Finally, a metal layer 234 is deposited on the surface to contact the N+source region 228 and P+region 230 (FIG. 10F).

SUMMARY OF THE INVEFNTION

In accordance with this invention, a trench-gated semiconductor device is formed, having a dielectric layer separating the gate electrode from the semiconductor material surrounding the trench wherein the thickness of the dielectric layer is greater in a region at the bottom of the trench. This structure helps to reduce the strength of the electric field near the bottom of the trench, particularly at the corner or rounded portion where the bottom of the trench makes a transition to a sidewall of the trench, and to reduce capacitance.

Several processes are used to fabricate this structure. One process includes the following steps. A trench is etched in the semiconductor material. A directional deposition of a dielectric material is then performed such that the dielectric material is deposited preferentially on horizontal surfaces such as the bottom of the trench. This is done by creating an electric field in the deposition chamber (e.g., a chemical vapor deposition or sputtering chamber) so as to accelerate the charged ions of the dielectric towards the semiconductor material. The trench is filled with a conductive material that will form the gate electrode. Following the directional deposition, any of the dielectric that was deposited on the sidewall of the trench can be removed, and a convention dielectric layer can be grown on the sidewall of the trench. In many processes, the dielectric material is silicon dioxide and the conductive material is polysilicon.

In one process, the conductive material is etched back to a level roughly coplanar with the surface of the semiconductor material, and a dielectric layer is deposited over the top surface of the dielectric material. In one variant, the conductive material (e.g., polysilicon) is oxidized to form on oxide layer, preferably after the conductive material has been etched back into the trench. The conductive material can be oxidized to a thickness such that the oxide itself is adequate to insulate the gate electrode, or another conductive material, such as glass, can be deposited over the oxidized conductive material.

In another variant, the conductive material that forms the gate electrode is deposited in two stages.

In another alternative, a masking material such as photoresist is applied after the preferential deposition of the dielectric material. The masking material is removed from all locations except the bottom of the trench, and the trench is subjected to an etch or dip to remove dielectric material from the sidewalls of the trench. A dielectric layer is then formed on the sidewalls of the trench.

In yet another alternative, following the directional deposition of the dielectric, a material such as polysilicon that can be oxidized to form a dielectric is deposited and etched back until only a portion of the material remains on top of the dielectric at the bottom of the trench. The material is then oxidized to form a thicker dielectric layer at the bottom of the trench.

Another group of alternatives avoids the directional deposition of a dielectric material. Instead a material such as polysilicon that can be oxidized to form a dielectric is deposited and etched back until only a portion remains at the bottom of the trench.

Processes in accordance with this invention may include a process for self aligning the trench with a contact to the top surface of the "mesa" between the trenches. A "hard" layer of a material such as silicon nitride is used as a trench mask. The hard mask remains in place until a dielectric layer has been formed over the gate electrode, preferably by oxidizing polysilicon gate. The hard mask is then removed, exposing the entire top surface of the mesa and allowing a contact to be made thereto with a metal layer.

A process of this invention may include the use of a sidewall spacer near the top corners of the trench to prevent a short between the gate electrode and the semiconductor mesa. After the trench mask has been deposited and an opening defining the location of the trench has been made in the trench mask, a layer of a "hard" material such as silicon nitride, and optionally an overlying oxide, is isotropically deposited into the opening in the trench mask. The "hard" material is deposited on the exposed edges of the trench mask. An etch is then performed, following which the surface of the semiconductor material is exposed in the central region of the opening but some of the deposited dielectric remains on the side edges of the trench mask, forming sidewall spacers. The trench is then etched. The dielectric sidewall spacers provide additional insulation between the later formed gate electrode and the semiconductor material in the mesa.

Another group of processes provide a "keyhole" shaped trench, wherein a thick dielectric layer extends some distance upward on the sidewalls of the trench. After the trench has been etched, a relatively thick oxide lining is grown or deposited on the bottom and sidewalls of the trench. The trench is filled with polysilicon, and the polysilicon is then etched back such that only a portion remains at the bottom of the trench, overlying the oxide lining. The exposed oxide lining is removed from the sidewalls of the trench. The polysilicon is then partially oxidized by heating to form an oxide layer at its exposed surface, and during the same heating process an oxide layer is formed on the sidewalls of the trench. The trench is then subjected to an oxide etch, which removes the oxide layer formed from the polysilicon as well as some of the oxide layer from the sidewalls of the trench. The trench is then refilled with polysilicon to yield a keyhole-shaped gate electrode.

In a variant of the above process for forming a keyhole-shaped gate electrode, after the oxide lining has been formed on the bottom and sidewalls of the trench, an amount of a masking material such as photoresist is deposited over the oxide lining at the bottom of the trench. An oxide etch is then performed to removed the oxide lining from the sidewalls of the trench, and the masking material is removed from the bottom of the trench. A relatively thin gate oxide layer is grown on the sidewalls of the trench, and the trench is filled with a conductive material such as polysilicon which forms the gate electrode.

BRIEF DESCRIPTION OF THE DRAWINGS

FIG. 6E is a cross-sectional view showing the ionization contours in a trench power MOSFET when it is turned on.

FIG. 7A is a schematic diagram of a gate charging circuit for a power MOSFET.

FIG. 7B is a graph illustrating the step function application of a gate drive current to a power MOSFET.

FIG. 7C is a graph illustrating how the gate voltage and drain voltage vary under the conditions of FIG. 7B.

FIG. 7D is a graph showing how the drain current varies under the conditions of FIG. 7B.

FIG. 7F is a graph showing how the effective input capacitance varies as a power MOSFET is turned on.

FIGS. 8A–8C are cross-sectional views showing how a gate trench having rounded corners is formed.

FIGS. 14A–14F illustrate an alternative process sequence in which the polysilicon is etched to a level below the surface of the semiconductor material and then oxidized.

FIGS. 17A–17F illustrate a process in which the polysilicon is etched to a level near the bottom of the trench and then oxidized.

FIGS. 19A–19L illustrate a process of fabricating a trench power MOSFET having an oxide layer over the gate electrode which is self-aligned with the walls of the trench.

FIGS. 20A–20F illustrate a process sequence for fabricating a trench gate in an active array portion of a power MOSFET as well as a gate bus.

FIGS. 25A–25H illustrate a process of fabricating a trench power MOSFET with a thick bottom oxide layer and a nitride side spacer.

FIGS. 35A–35L illustrate cross-sectional views showing the process of FIG. 34.

FIGS. 40A–40L illustrate a process sequence for fabricating a MOSFET having a keyhole-shaped gate electrode.

FIGS. 42A–42C illustrate the strength of the electric field in a conventional power MOSFET, a power MOSFET having a thick bottom gate oxide, and a power MOSFET having a keyhole-shaped gate electrode, respectively.

DESCRIPTION OF THE INVENTION

The problems associated with interactions between the gate and the drain of a MOSFET can be solved in part by reducing the coupling capacitance between them. In accordance with this invention, this is done by thickening the gate oxide layer at the bottom of the trench. FIGS. 11–27 show various structures and sequences for forming a thick gate oxide on the bottom of the trench.

Figure 1:
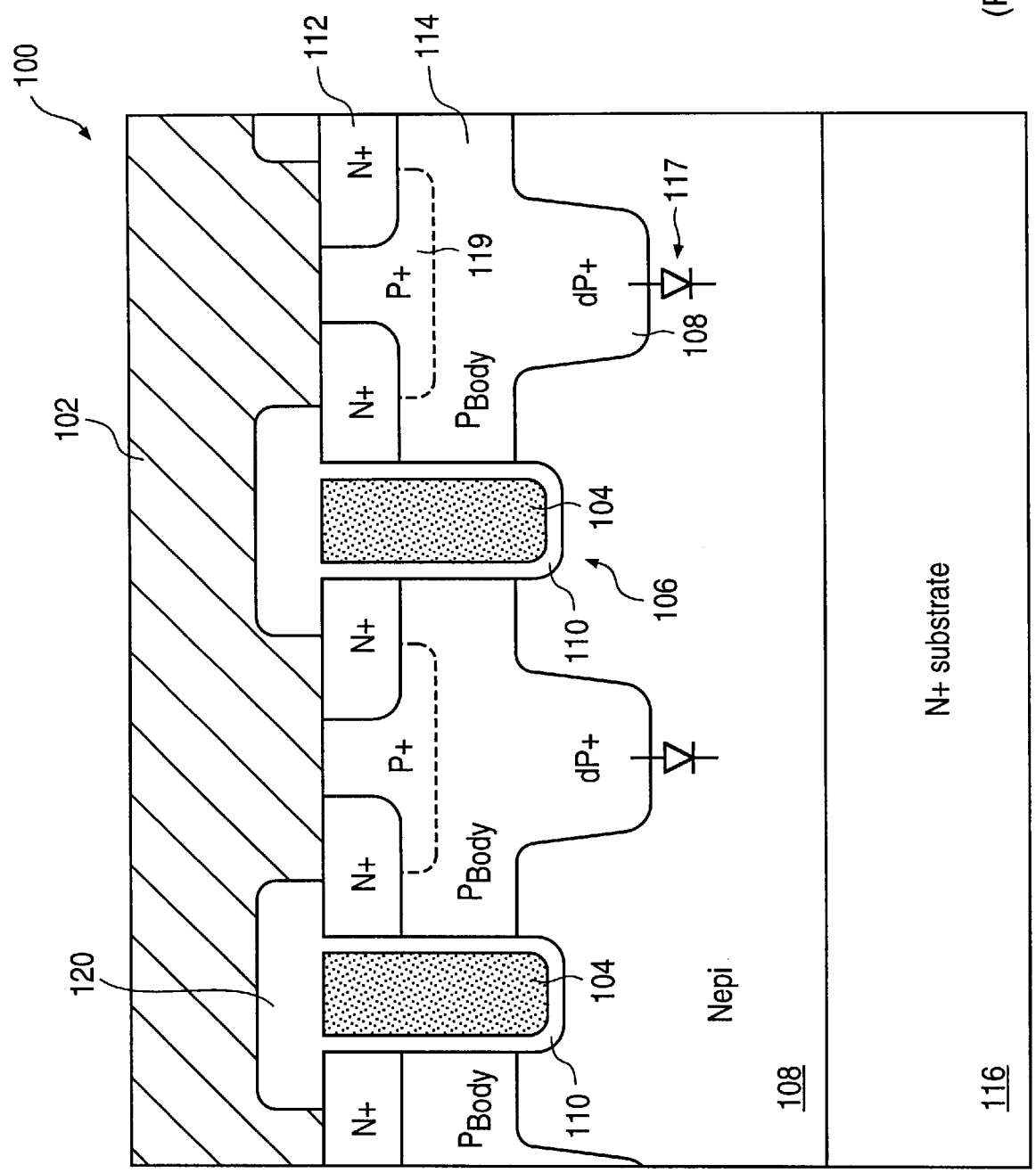
FIG. 1 is a cross-sectional view of a prior art trench power MOSFET having a deep P+diode which functions as a voltage clamp.
Figure 2:
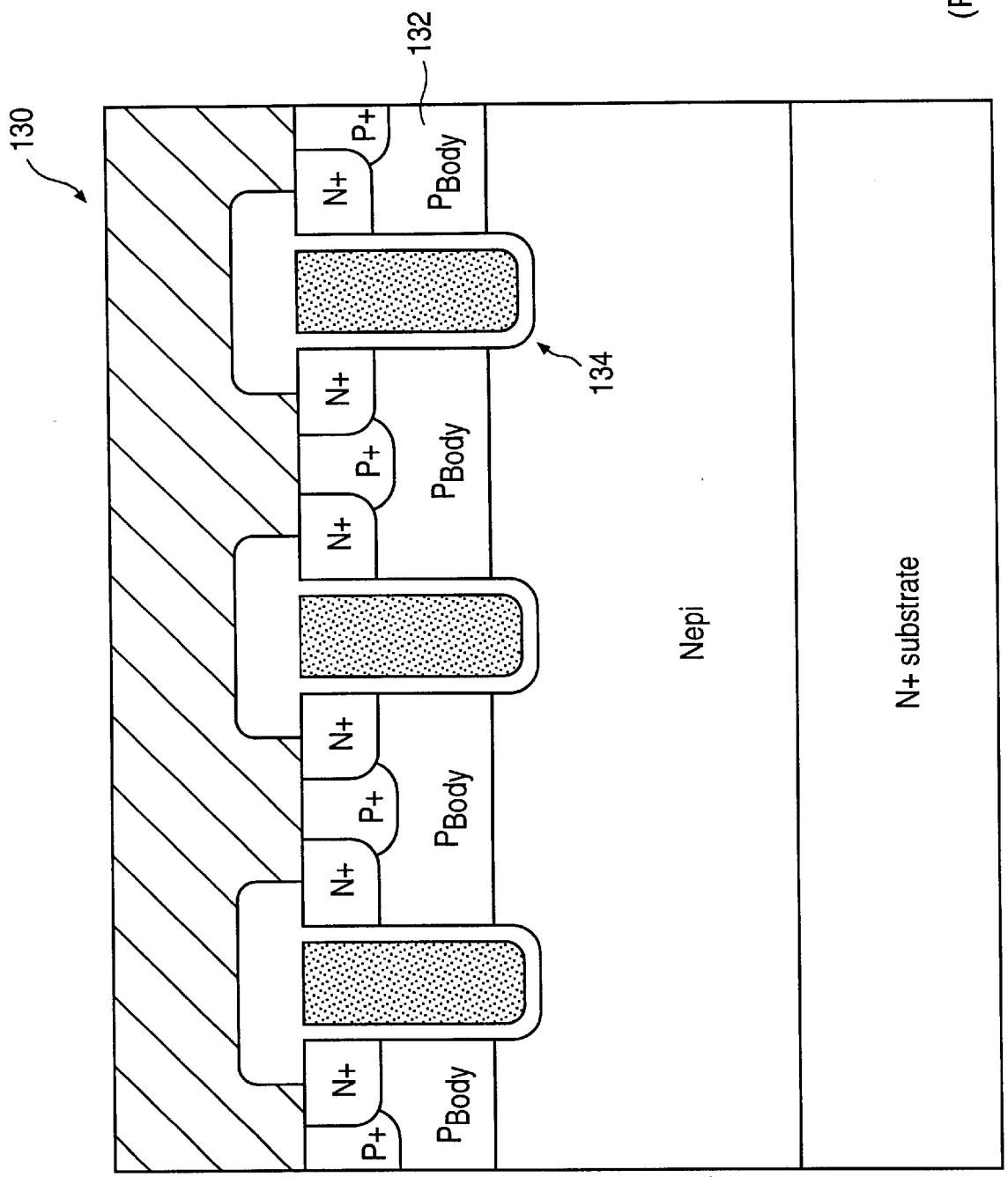
FIG. 2 is a cross-sectional view of a prior art trench power MOSFET having a flat body-drain junction.
Figure 3:
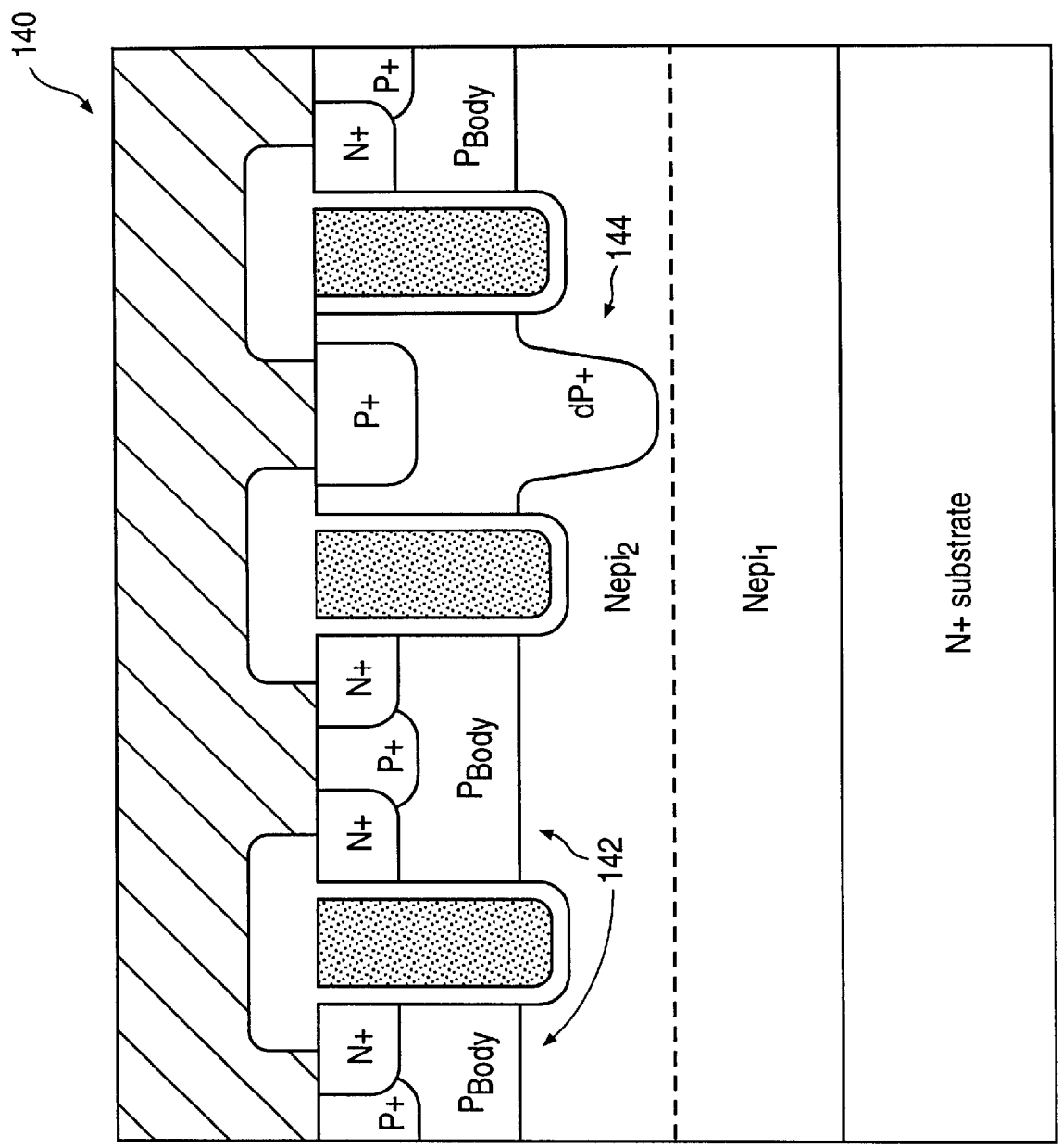
FIG. 3 is a cross-sectional view of a prior art trench power MOSFET having a voltage clamp which is distributed among MOSFET cells which contain a flat body-drain junction.
Figure 4B:
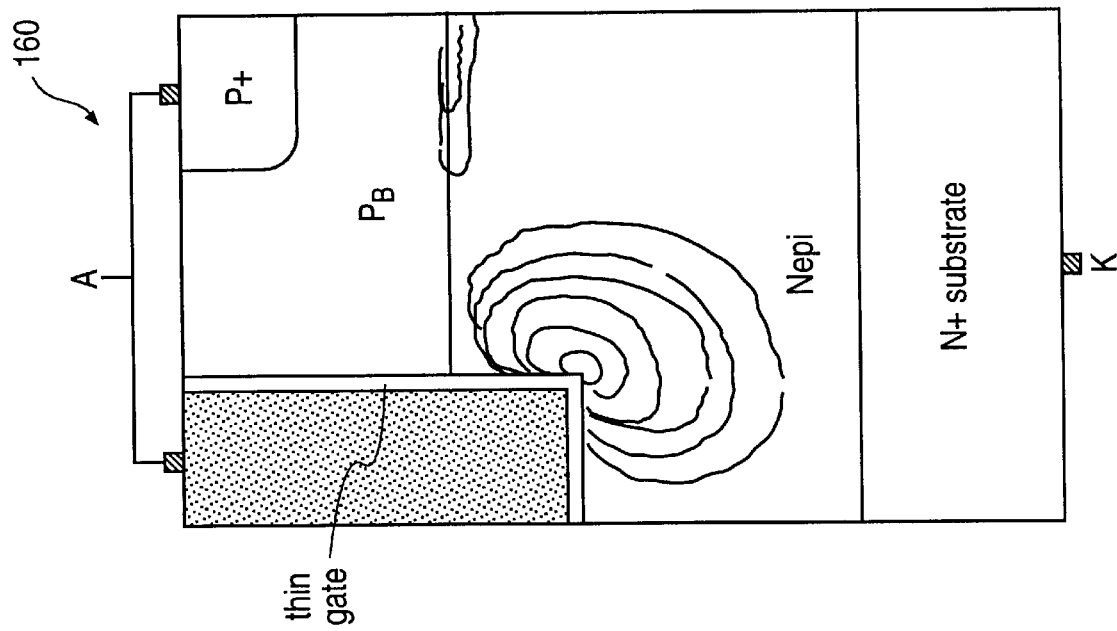
FIG. 4B is a cross-sectional view showing the electric field contours in a MOSFET having a thin gate oxide layer.
Figure 4A:
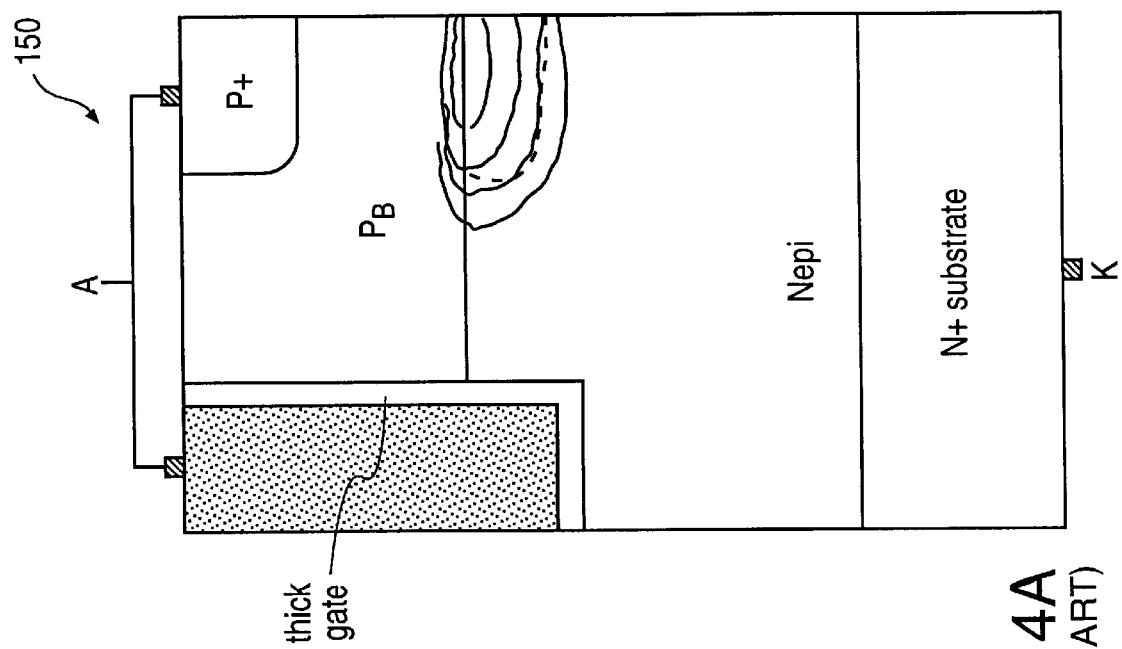
FIG. 4A is a cross-sectional view showing the electric field contours in a MOSFET having a thick gate oxide layer.
Figure 4D:
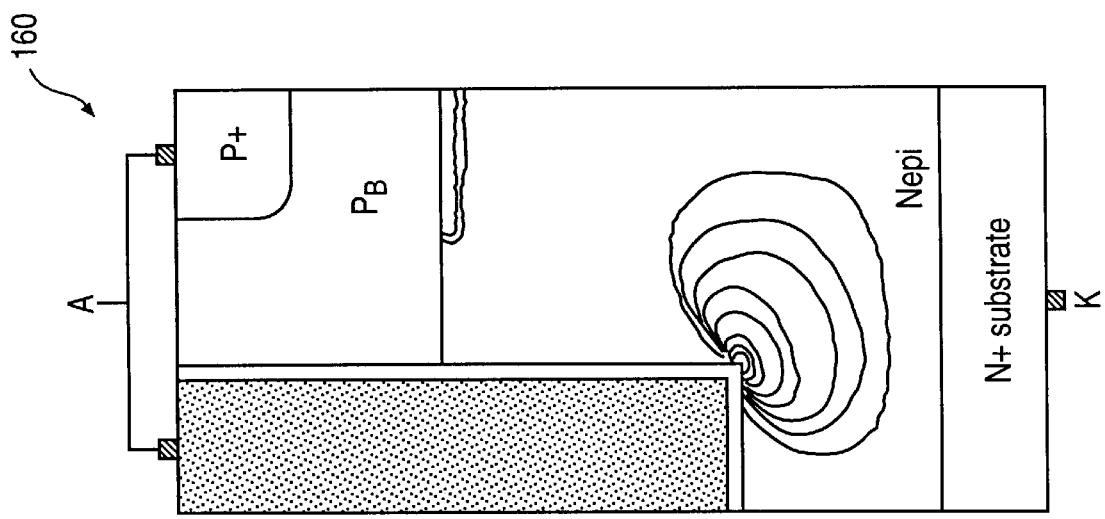
FIG. 4D is cross-sectional view showing the ionization contours in a MOSFET having a thin gate oxide layer at the onset of avalanche breakdown.
Figure 4C:
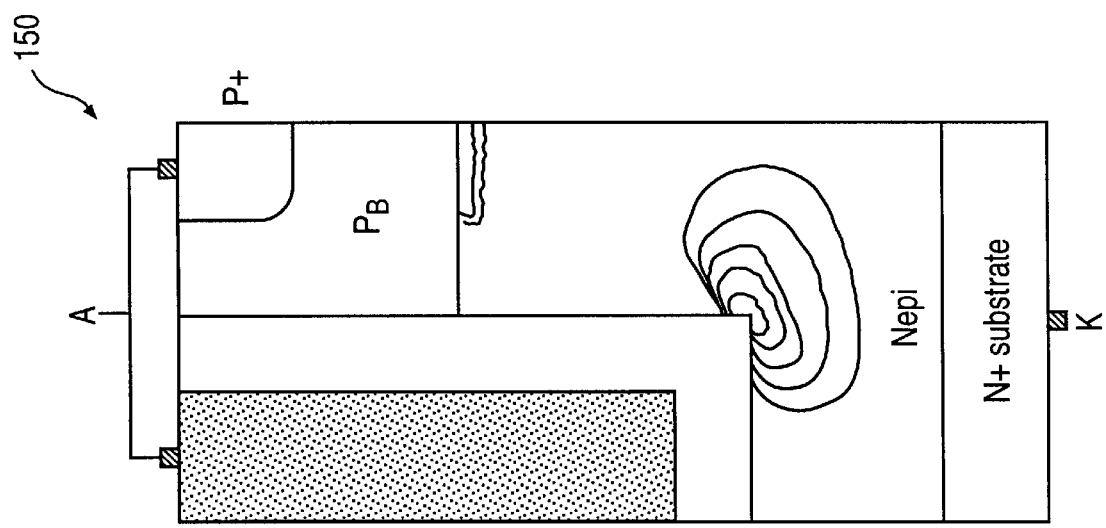
FIG. 4C is a cross-sectional view showing the ionization contours in a MOSFET having a thick gate oxide layer at the onset of avalanche breakdown.
Figure 4E:
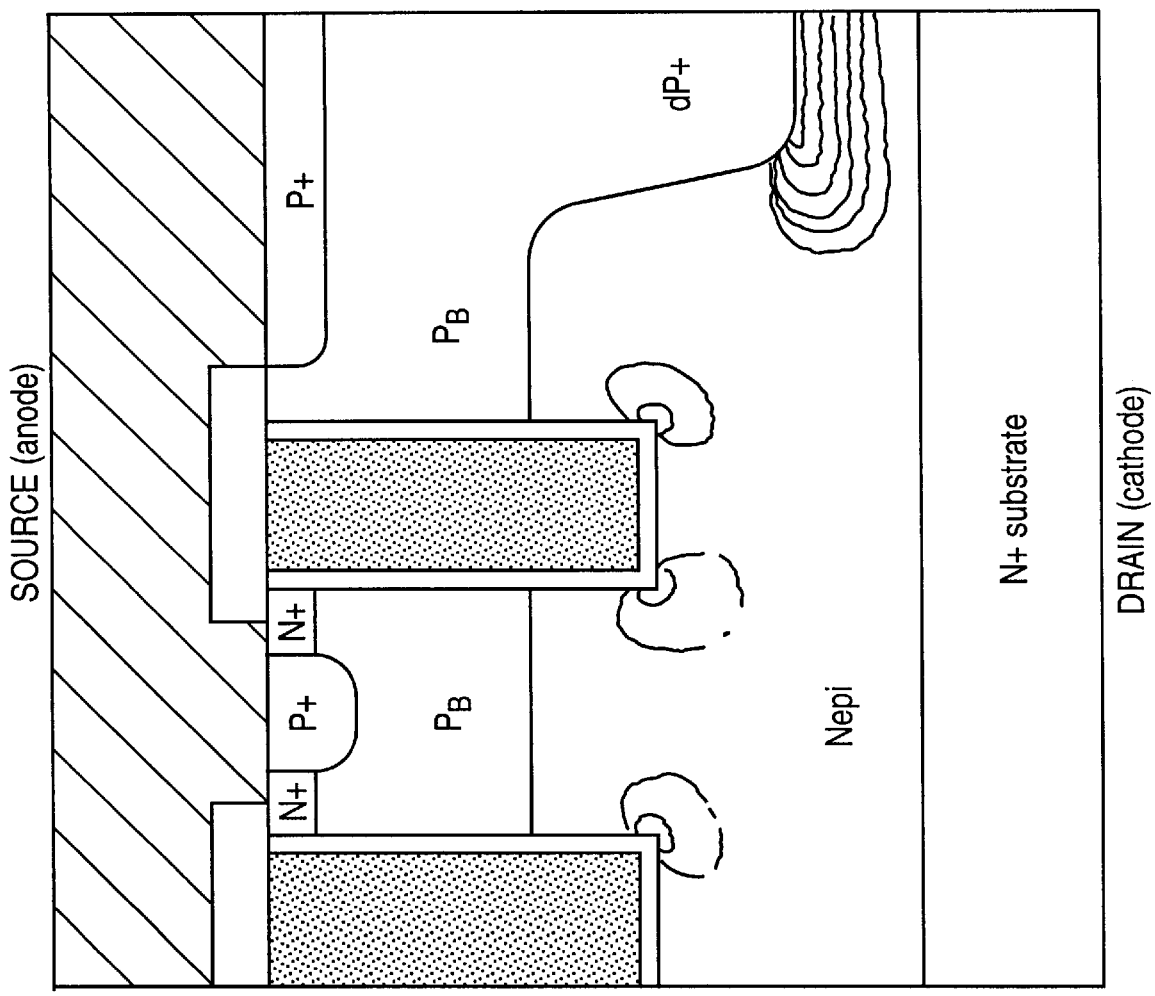
FIG. 4E is a cross-sectional view showing the ionization contours in a device which contains a deep P+region used as a voltage clamp.
Figure 4F:
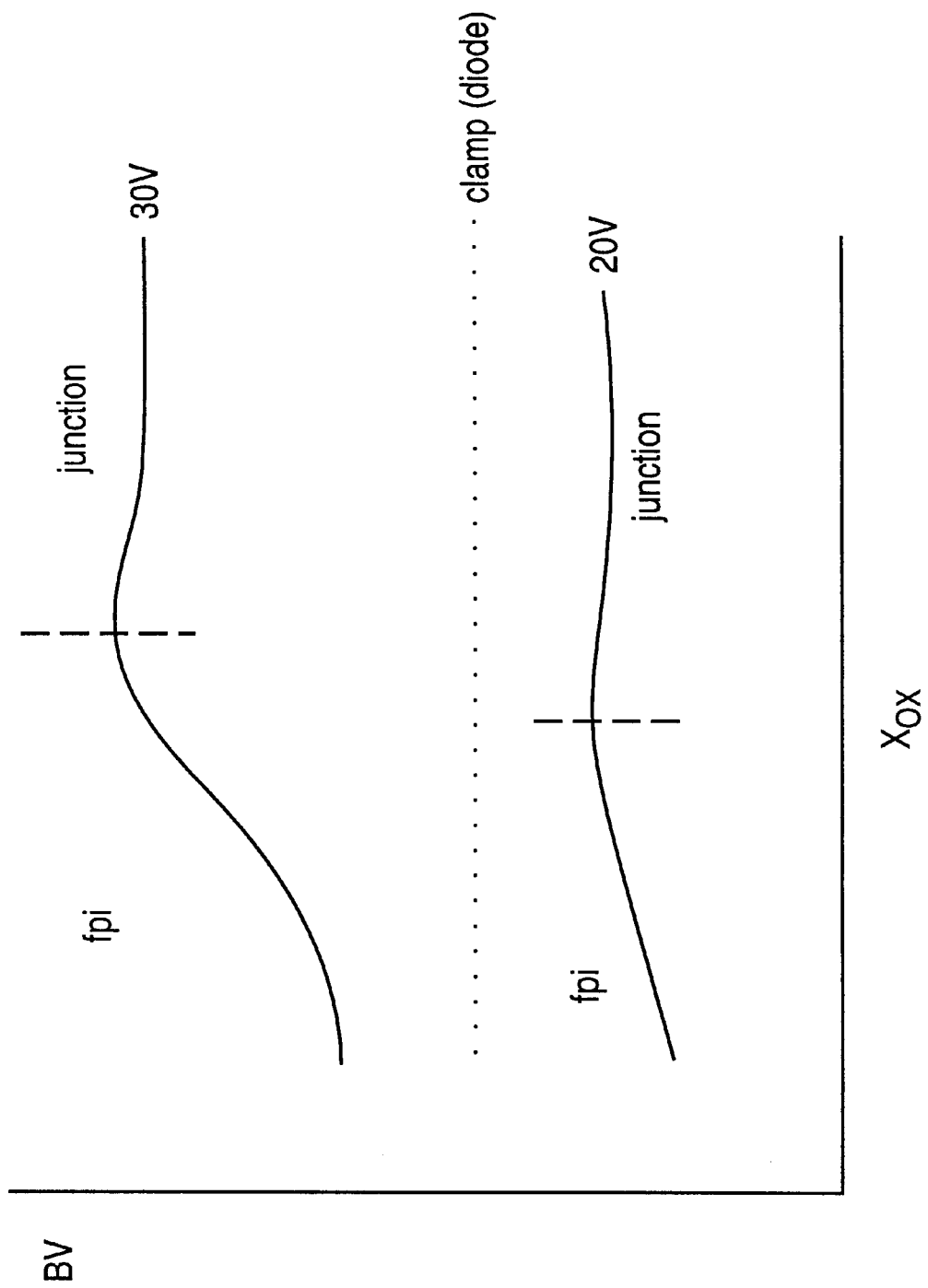
FIG. 4F is a graph showing the breakdown voltage as a function of gate oxide thickness in MOSFETs fabricated in epitaxial layers having different doping concentrations.
Figure 4G:
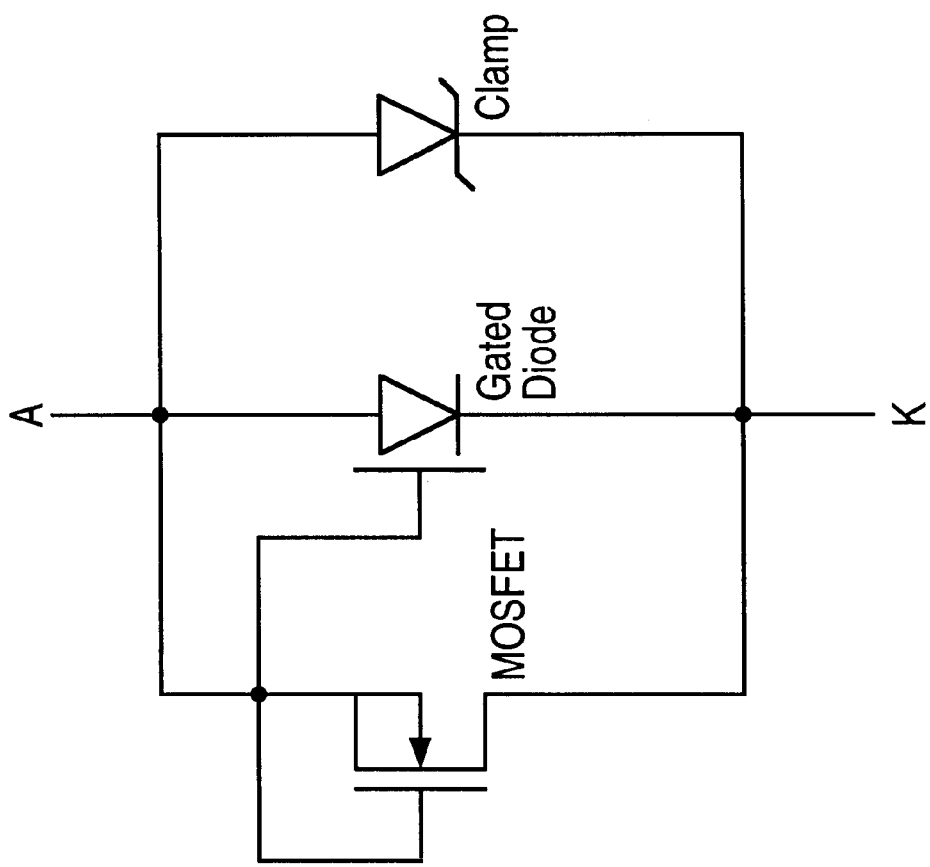
FIG. 4G is a schematic diagram of a trench power MOSFET with an anti-parallel diode clamp.
Figure 5B:
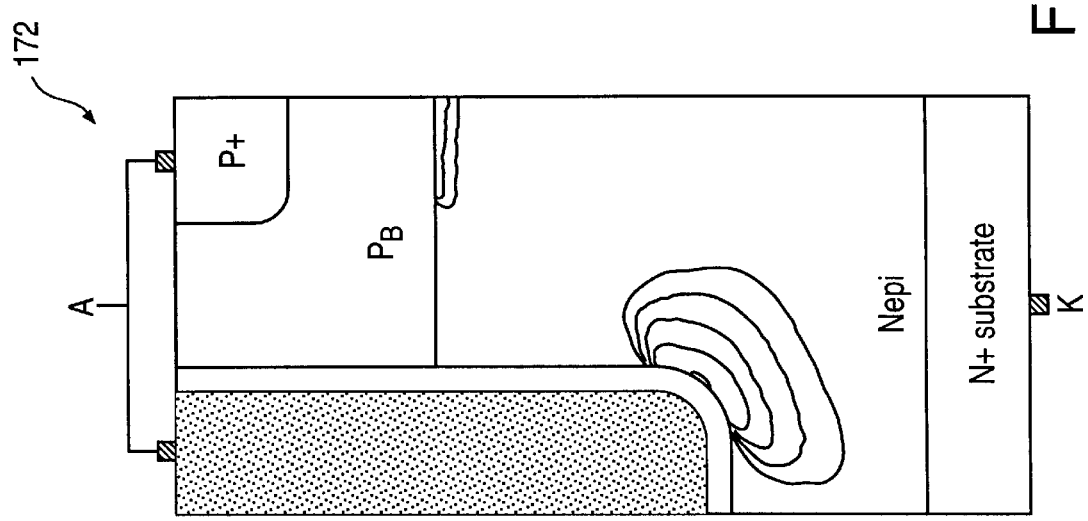
FIG. 5B is a cross-sectional view showing ionization contours in a trench power MOSFET having a rounded trench corner.
Figure 5A:
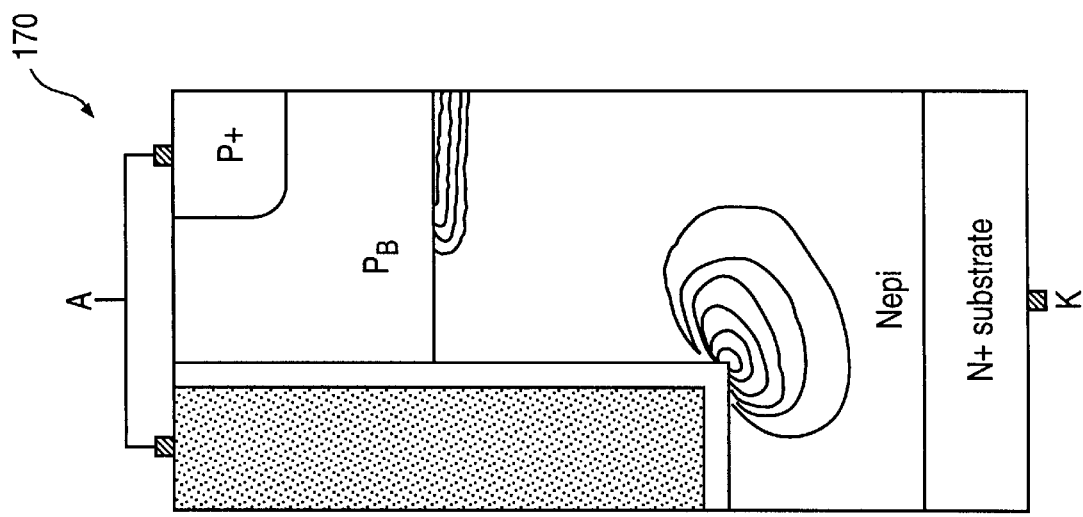
FIG. 5A is a cross-sectional view showing ionization contours in a trench power MOSFET having a square trench corner.
Figure 6B:
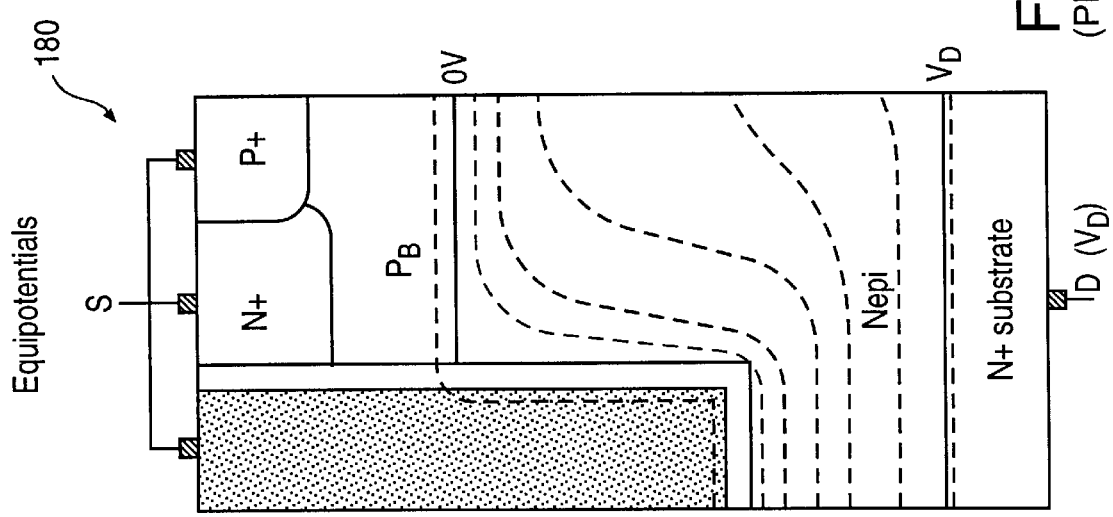
FIG. 6B is a cross-sectional view showing the equipotential lines in a trench power MOSFET having a flat body-drain junction.
Figure 6A:
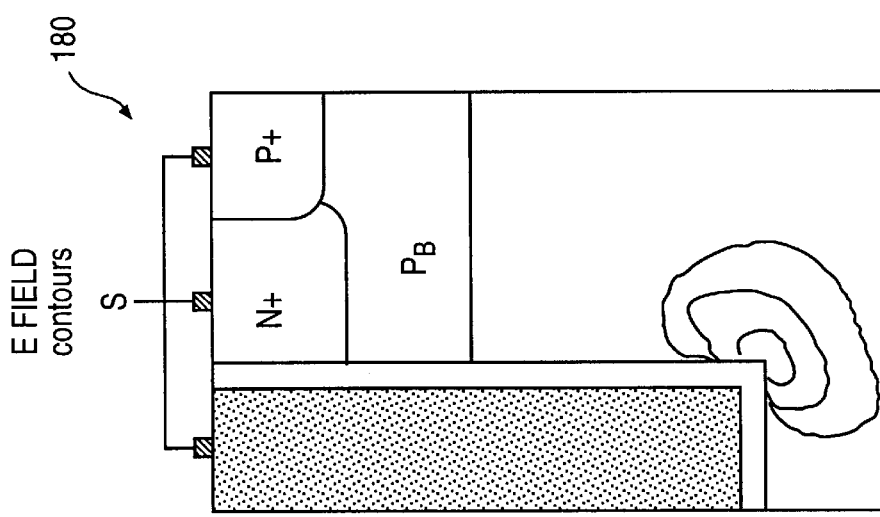
FIG. 6A is a cross-sectional view showing the electric field contours in a trench power MOSFET having a flat body-drain junction.
Figure 6D:
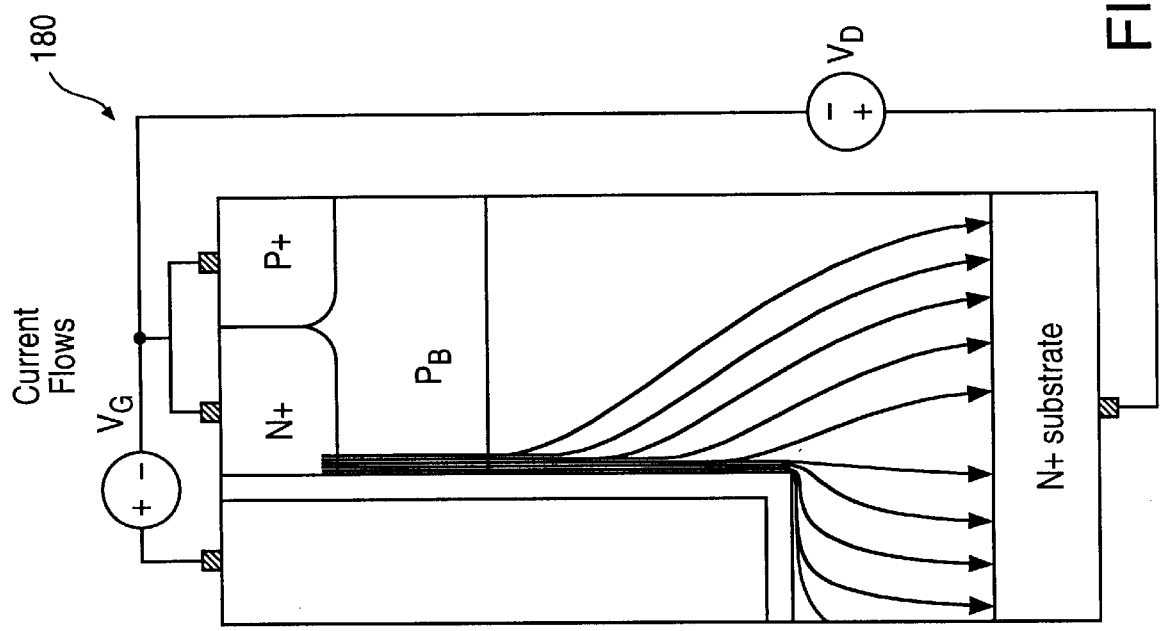
FIG. 6D is a cross-sectional view showing the current flow lines in a trench power MOSFET having a flat body-drain junction.
Figure 6C:
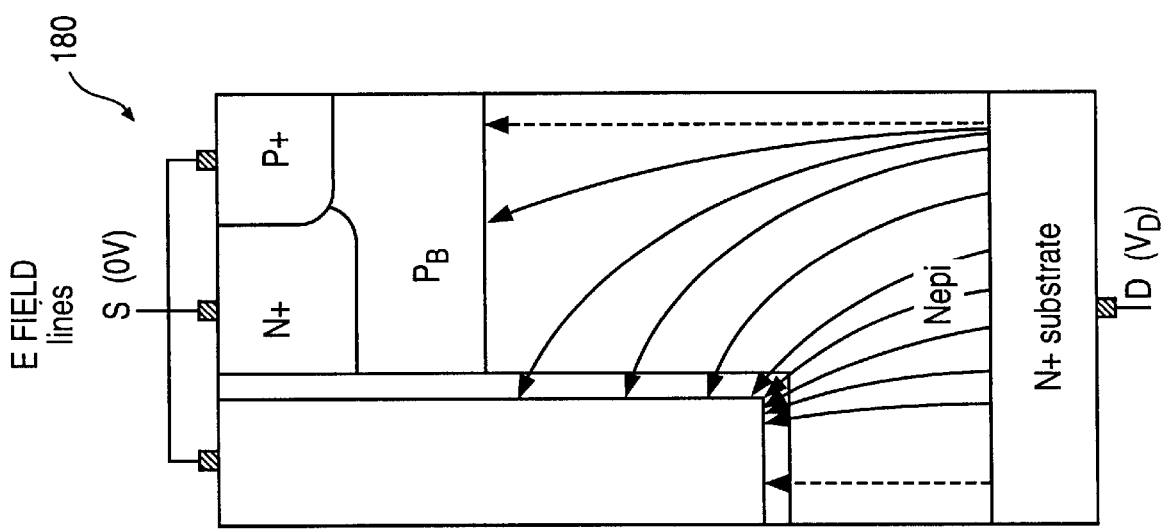
FIG. 6C is a cross-sectional view showing the electric field lines in a trench power MOSFET having a flat body-drain junction.
Figure 6F:
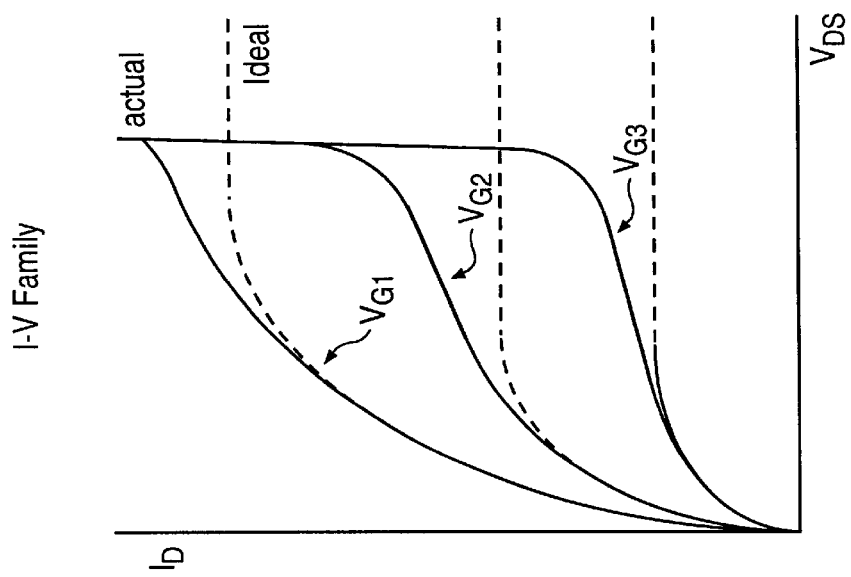
FIG. 6F is a graph showing a family of I–V curves for a power MOSFET at different gate voltages, showing how the sustaining voltage is reduced by impact ionization.
Figure 6E:
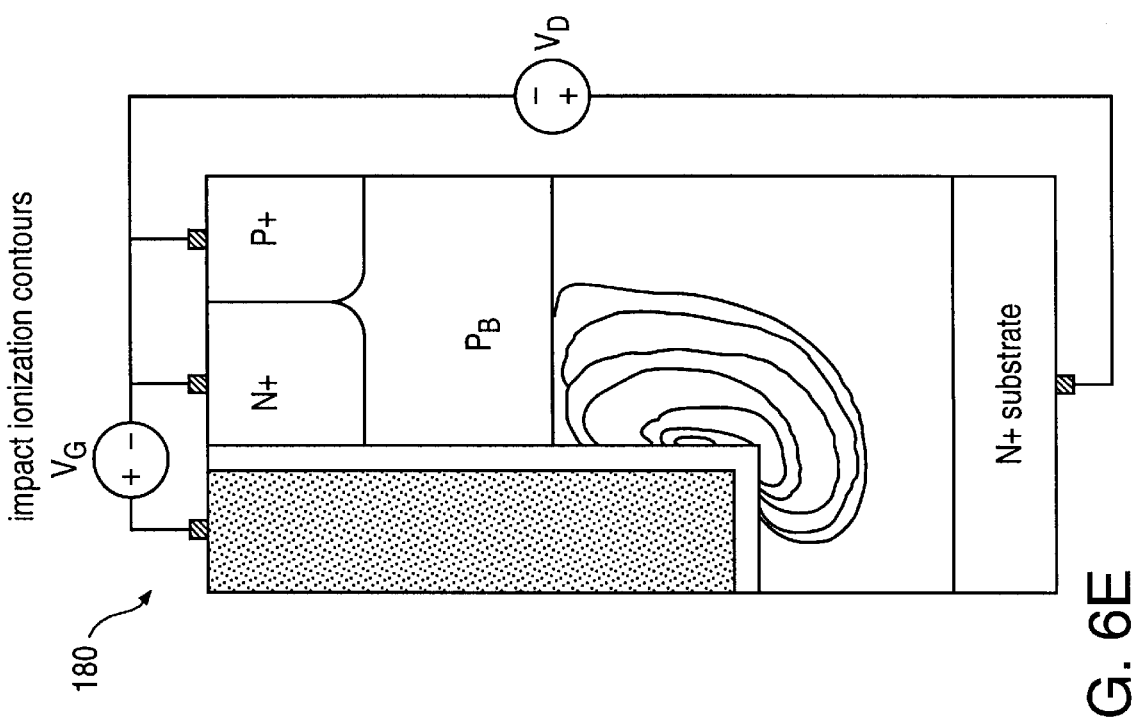
Figure 7F:
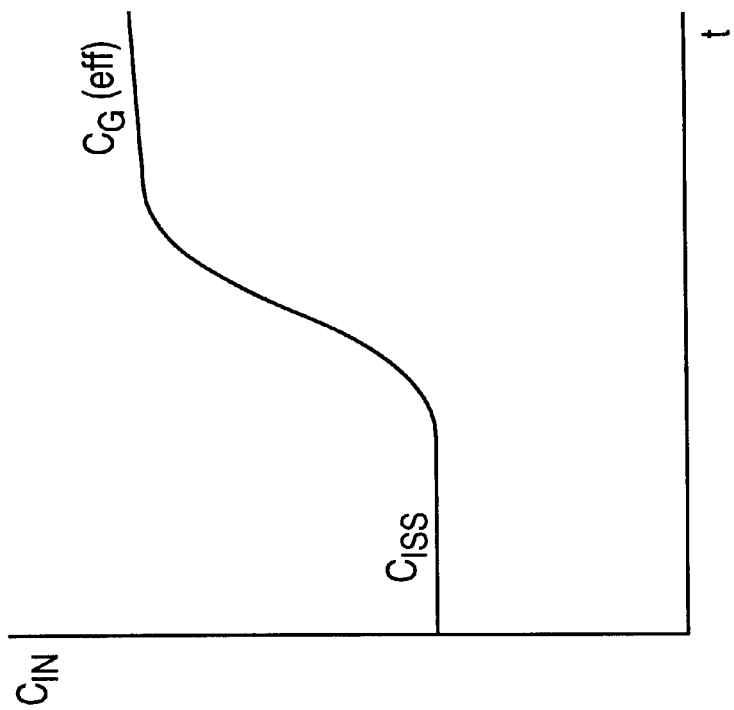
Figure 7E:
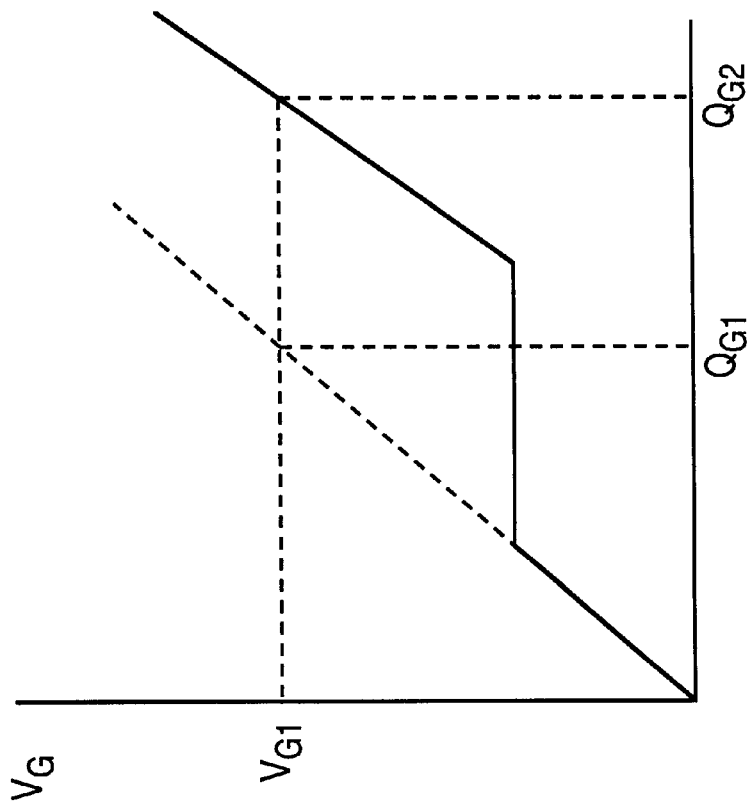
FIG. 7E is a graph showing how the gate voltage varies as a function of charge.
Figure 7H:
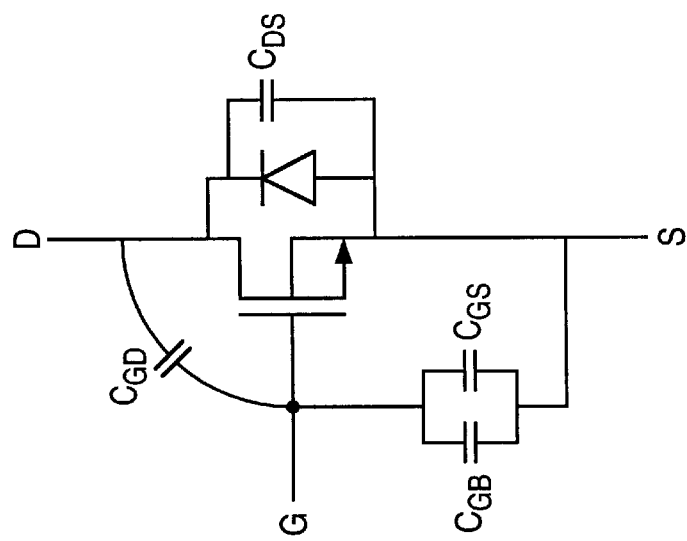
FIG. 7H is an equivalent circuit diagram of a trench MOSFET showing the inter-electrode capacitance.
Figure 7G:
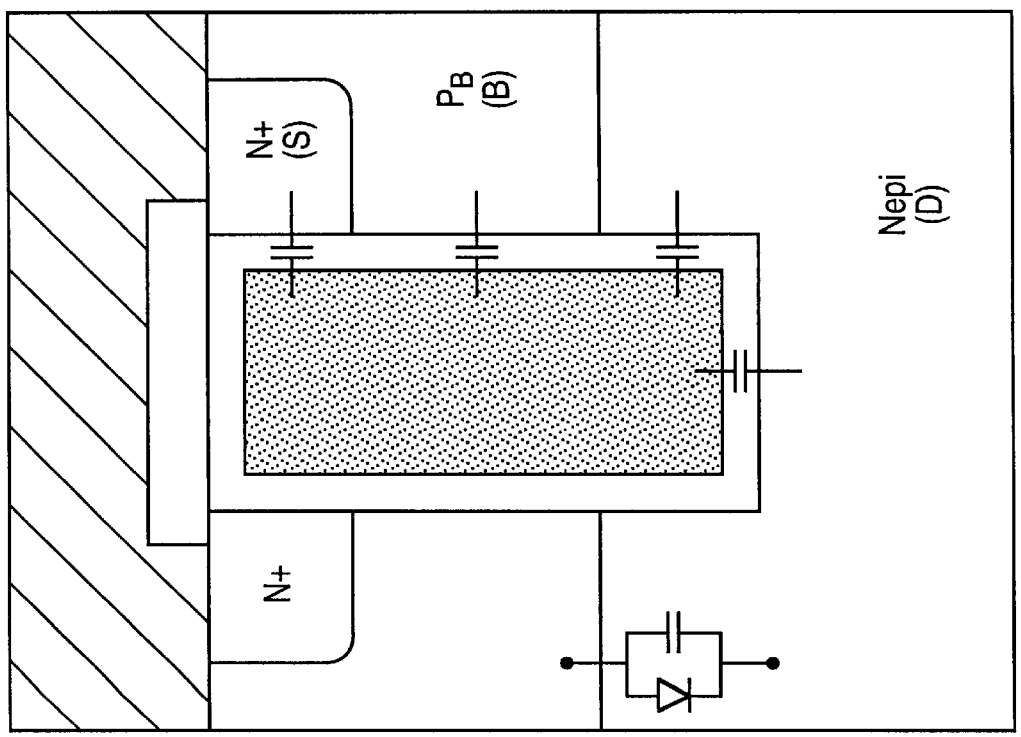
FIG. 7G is a cross-sectional view showing the components of the gate capacitance in a trench power MOSFET.
Figure 9D:
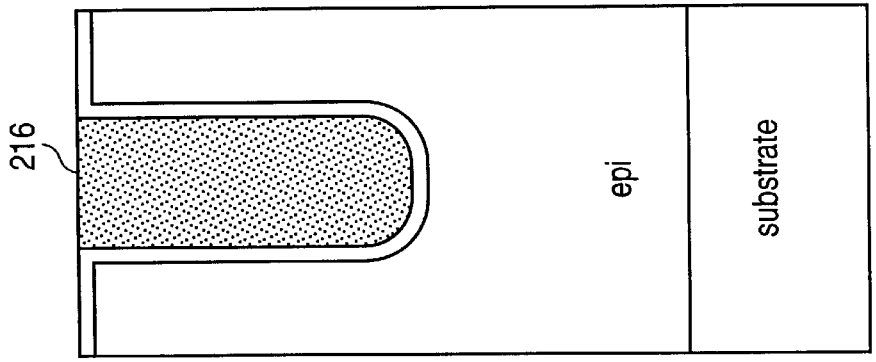
FIGS. 9A–9D are cross-sectional views showing a process of etching a gate trench and filling the trench with polysilicon.
Figure 9C:
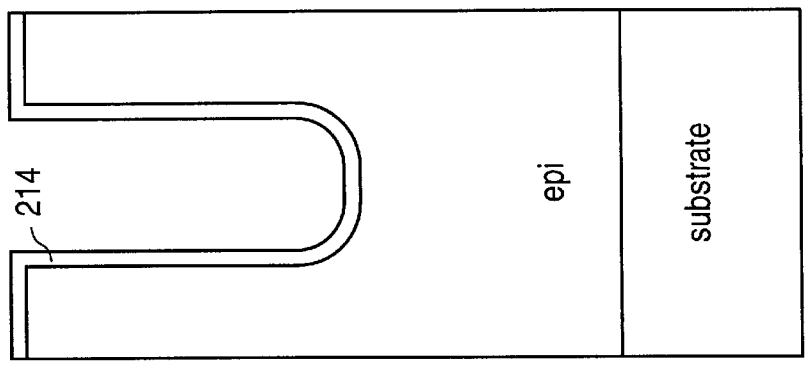
Figure 9B:
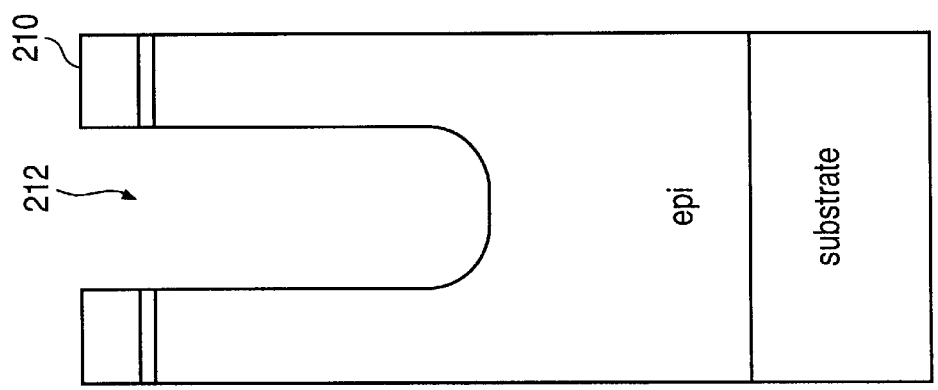
Figure 9A:
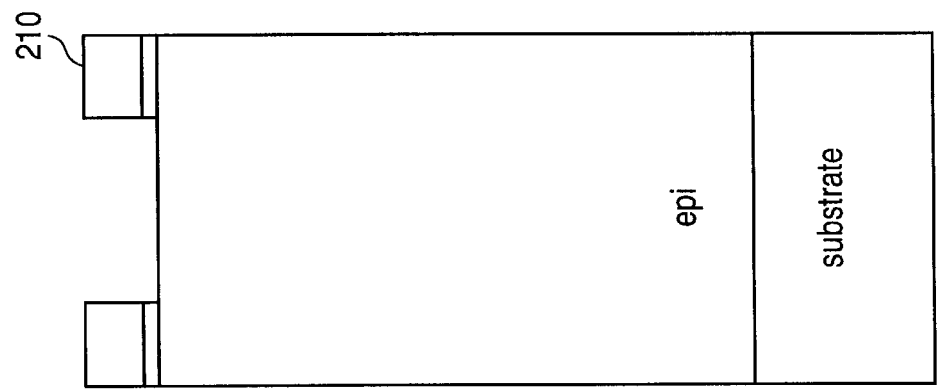
Figure 10C:
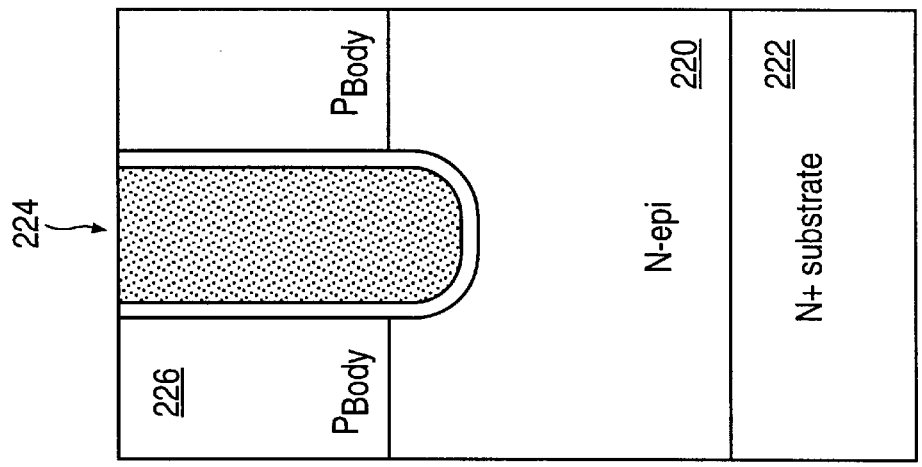
FIGS. 10A–10F are cross-sectional views of a process of fabricating a conventional trench power MOSFET.
Figure 10B:
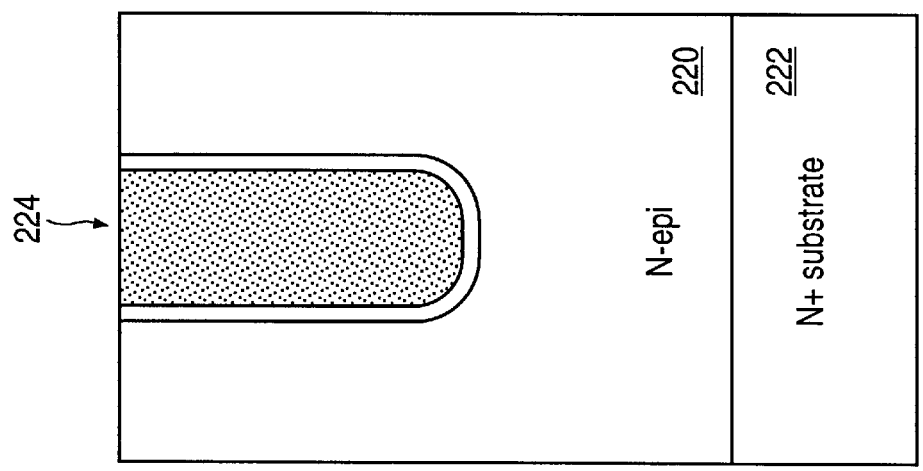
Figure 10A:
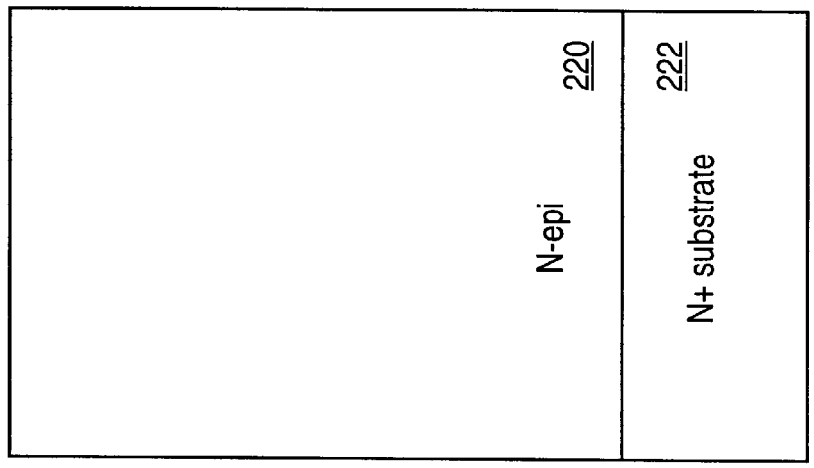
Figure 10F:
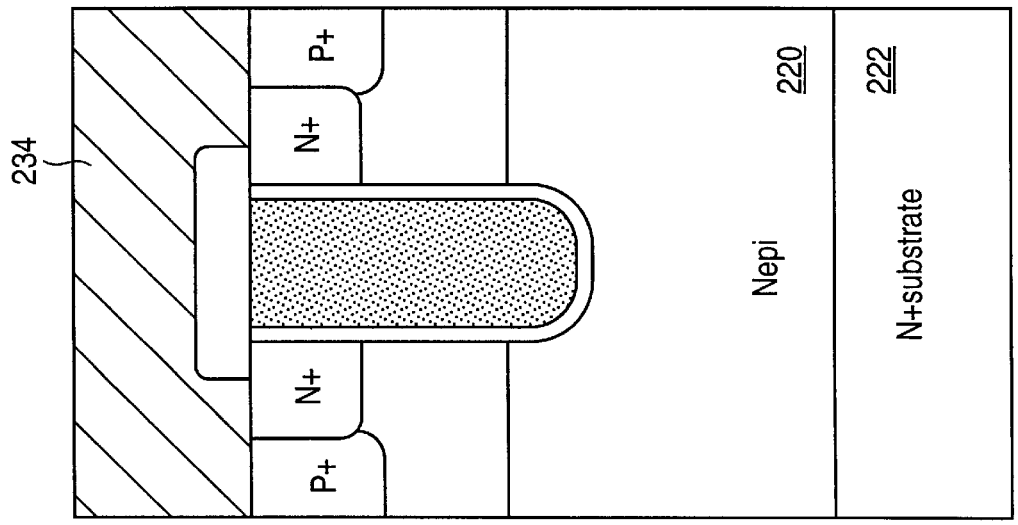
Figure 10E:
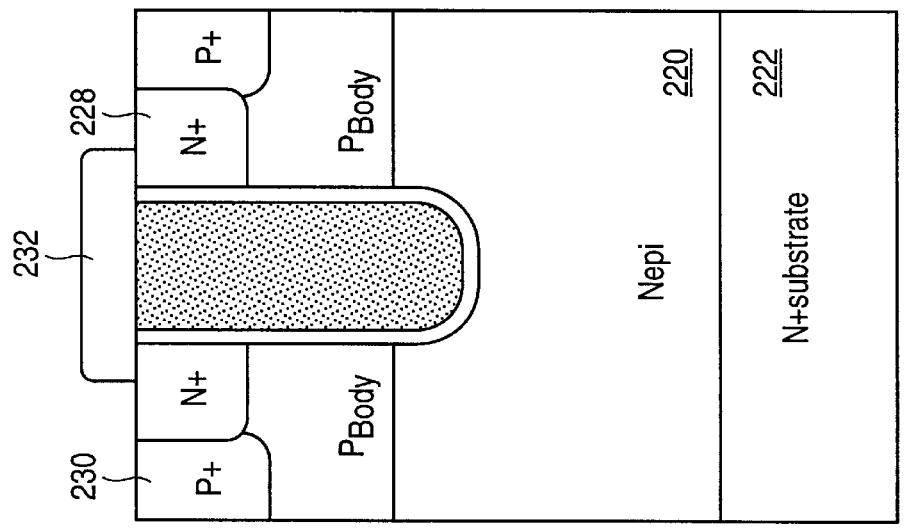
Figure 10D:
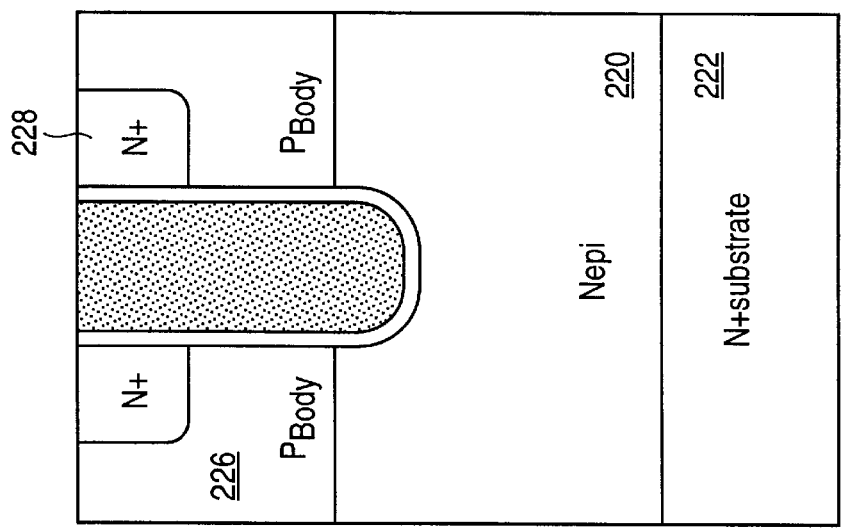
Figure 11A:
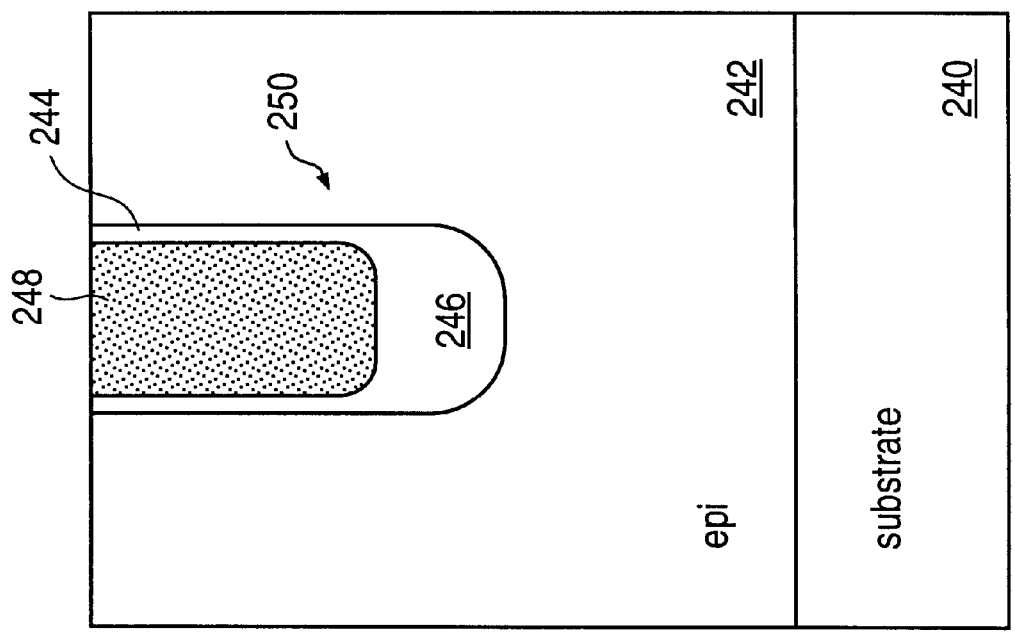
FIG. 11A is a cross-sectional view of a trench power MOSFET having a thick oxide layer at the bottom of the trench.

FIG. 11A shows an epitaxial ("epi") layer 242 grown on a substrate 240. A trench 250 is formed in epi layer 242. A oate oxide layer 244 lines the walls of trench 250, and a thick portion 246 of gate oxide layer 244 is located at the bottom of trench 250. Trench 250 is filled with polysilicon 248. Note that there is no oxide layer on top of polysilicon 248. The arrangement of FIG. 11A could be an intermediate structure; an oxide layer could be formed on top of polysilicon 248 at a later stage of the process. Polysilicon 248 is typically doped to a heavy doping concentration. It may be formed with a top surface substantially planar, i.e., flat, with the silicon epi surface by a number of means. One method to make the surface flat is to deposit the polysilicon layer to a greater thickness and then etch it back. Another means to produce a flat surface is to deposit the polysilicon to a thickness greater than the amount needed to fill the trench and then chemical mechanically polish the surface flat. A flat surface is desirable to reduce the height of steps which may form later in the fabrication process.

Figure 11C:
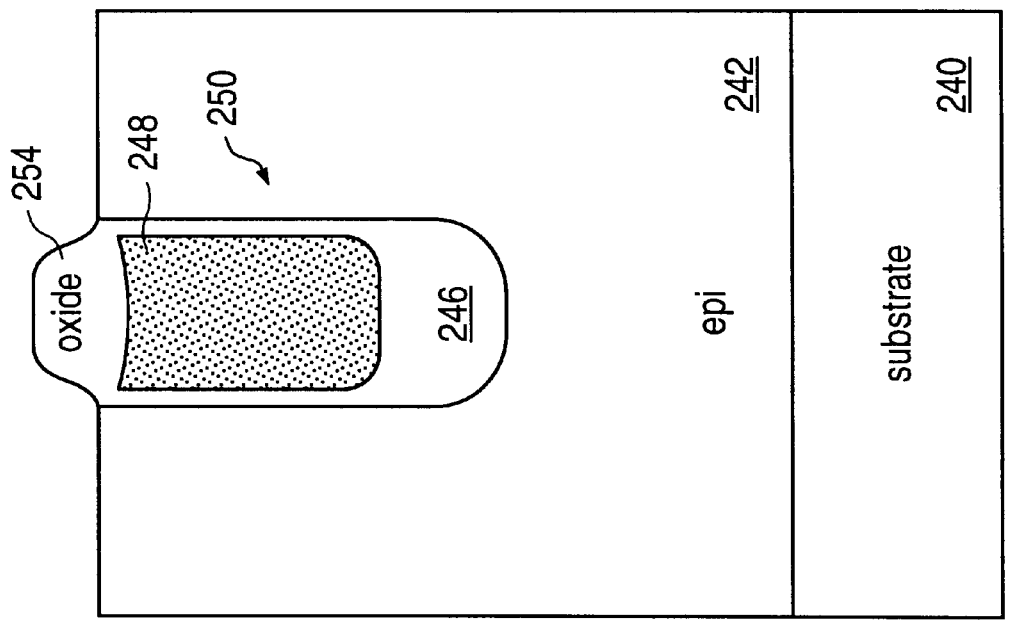
FIG. 11C is a cross-sectional view of the power MOSFET of FIG. 11A with a thick overlying oxide layer that is aligned to the walls of the trench.
Figure 11B:
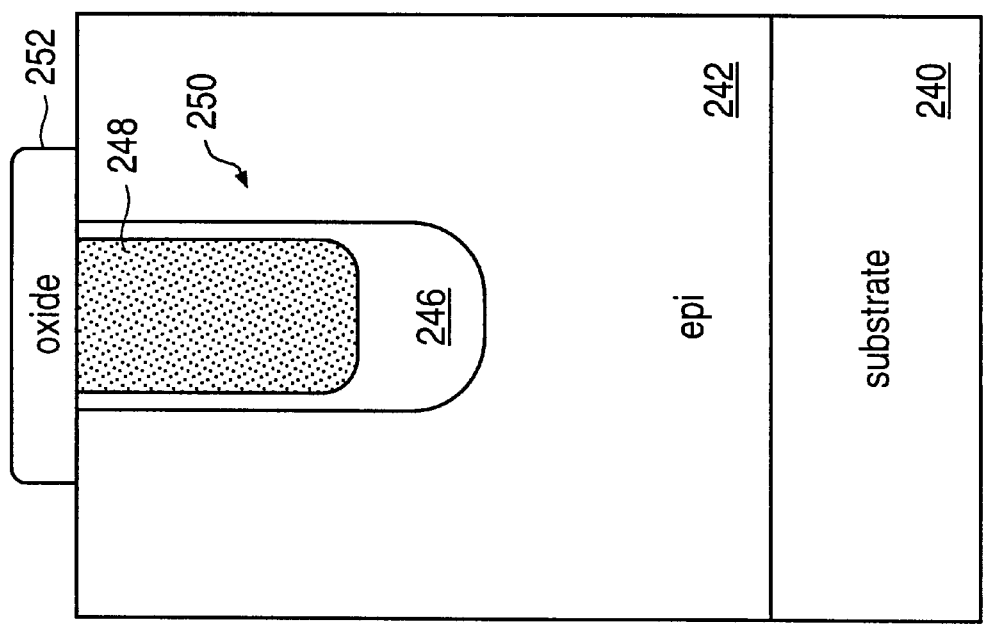
FIG. 11B is a cross-sectional view showing the MOSFET of FIG. 11A having a thick oxide layer patterned on the top surface of the semiconductor.

FIG. 11B shows a structure with an oxide layer 252 on top of polysilicon layer 248. Since the lateral edges of oxide layer 252 do not correspond to the walls of trench 250, oxide layer 252 is most likely formed with a mask and etching step. Oxide layer 252 could be either deposited (e.g., by chemical vapor deposition) or it could be thermally grown or some combination of these steps. FIG. 11C shows a top oxide layer 254 that is grown in accordance with the teachings of application Ser. No. 09/296,959, which is incorporated herein by reference in its entirety. The sides of oxide layer 254 are generally aligned with the walls of trench 250 and oxide layer 254 extends down into trench 250. Polysilicon layer 248 is thus embedded in trench 250. The embodiments of FIGS. 11B and 11C both have a thick gate oxide region 246 at the bottom of the trench.

Figure 12:
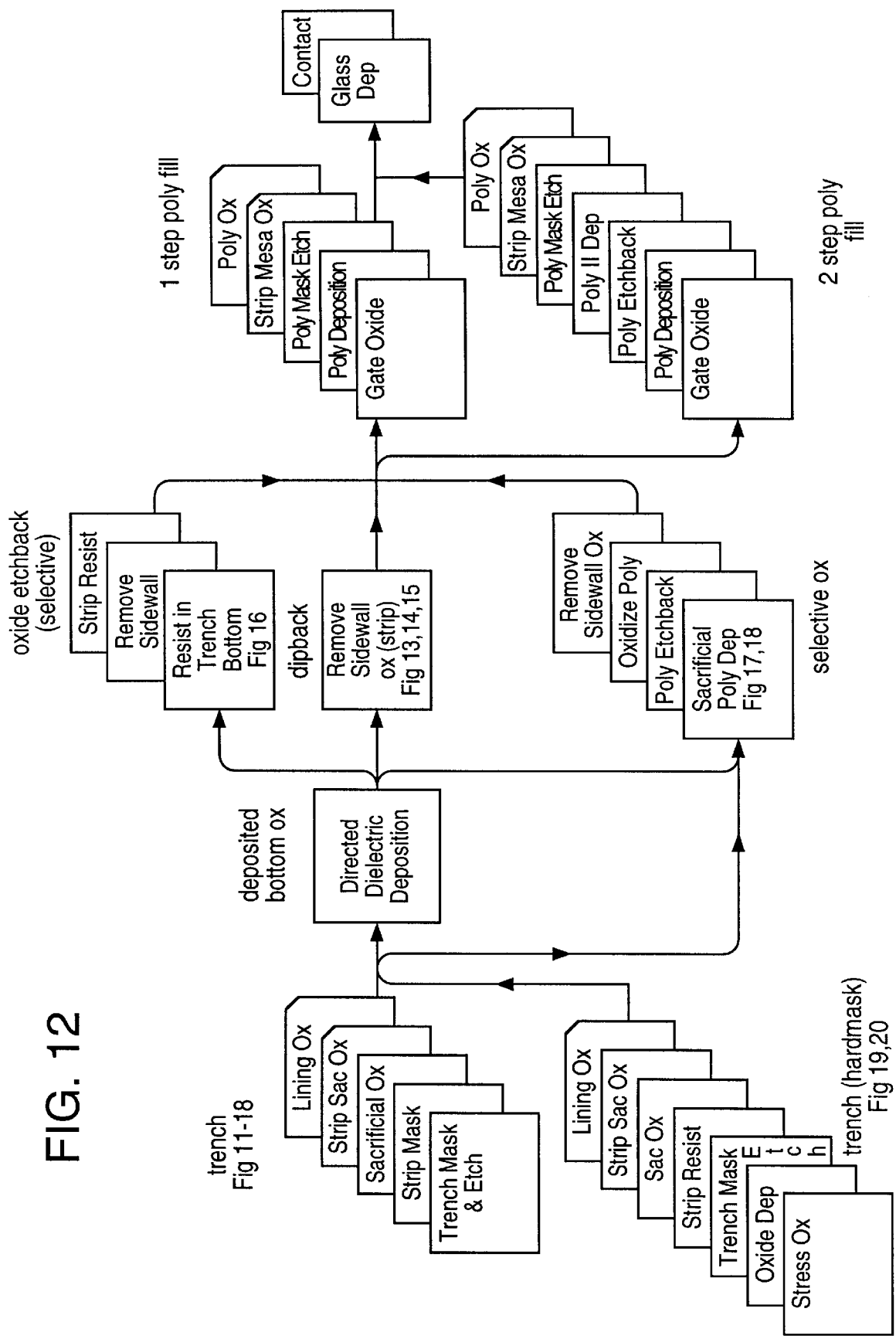
FIG. 12 is a schematic flow diagram showing a number of process sequences in accordance with this invention.

FIG. 12 is a schematic diagram of several process flows that can be used to fabricate gate trenches in accordance with this invention. The details of these process flows are shown in FIGS. 13–20. FIG. 12 illustrates in block diagram form that the trench may be formed using a photoresist mask or a hard mask sequence, followed by a directed oxide deposition planarized by either a selective etch, a dipback, or a selective oxidization. A selective oxidization can be used without a directed deposition. Finally, the trench is filled with polysilicon using a one-step or two-step process.

More specifically, starting at the left side of FIG. 12, there are two options for forming the trench. In one option, shown in FIGS. 13–18, the trench is formed using a mask that is later removed, so that the mask is not available as a reference for other processing steps. The other option is to use a "hard" mask to form the trench, as described in the above-referenced application Ser. No. 09/296,959, which is then employed as a reference later in the process. This option is generally described in FIGS. 19 and 20. After the trench is formed, normally a sacrificial oxide layer is grown on the walls of the trench and then removed. An oxide lining may then be formed on the walls of the trench. This stage yields a trench having a uniform oxide layer on its walls, with or without a hard mask on the top surface of the silicon.

One may then proceed to what is called the directed dielectric deposition, which involves depositing more oxide on the bottom of the trench than on the sidewalls of the trench. There are then three choices. As shown in FIG. 16, a selective etchback can be performed, allowing thick oxide to remain at the bottom of the trench and removing the oxide from the sidewalls of the trench. As shown in FIGS. 13–15 one can perform a "dipback" to remove the oxide layer from the sidewalls of the trench. Finally, one can perform a selective oxidation, as shown in FIGS. 17A and 18, wherein a polysilicon layer is formed at the bottom of the trench and then oxidized to form additional oxide at the bottom of the trench. The selective oxidation of a polysilicon layer can be performed instead of or in addition to the directed dielectric deposition.

At this stage of the process a trench has been fabricated with a thick oxide layer on the bottom. There may or may not be a "hard" mask on the top surface of the semiconductor. Next, a thin oxide layer is grown on the walls of the trench and the trench is filled with polysilicon. The polysilicon may be deposited as a single layer or it can be deposited as two layers with an etchback between the depositions. Depositing the polysilicon in a two-stage process may be beneficial to the introduction of dopants into the "mesa" between the trenches, and to make a more lightly doped polysilicon layer available on the surface of the wafer to produce diodes, resistors, and other polysilicon devices.

Finally a glass layer is deposited and contact openings are formed in the glass layer.

Figure 13F:
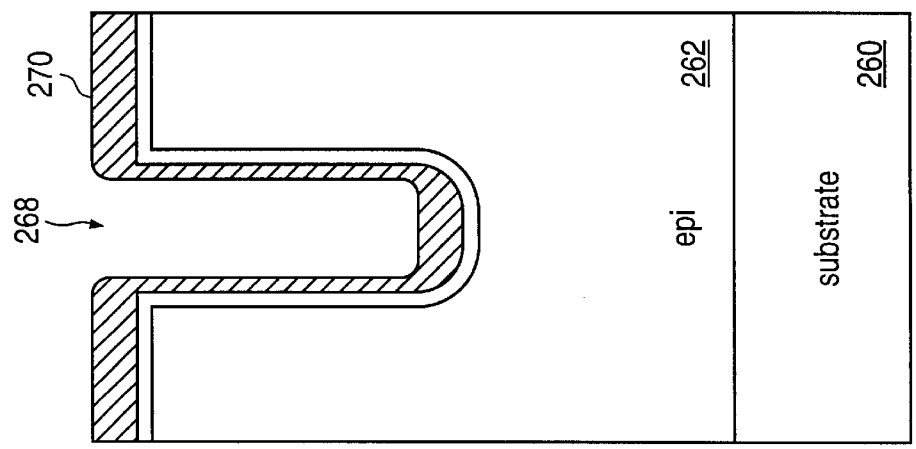
FIGS. 13A–13N illustrate a process sequence for fabricating a trench power MOSFET having a thick oxide layer at the bottom of the trench, using a directional deposition of an oxide layer and etching the polysilicon to a level even with the top of the semiconductor material.
Figure 13E:
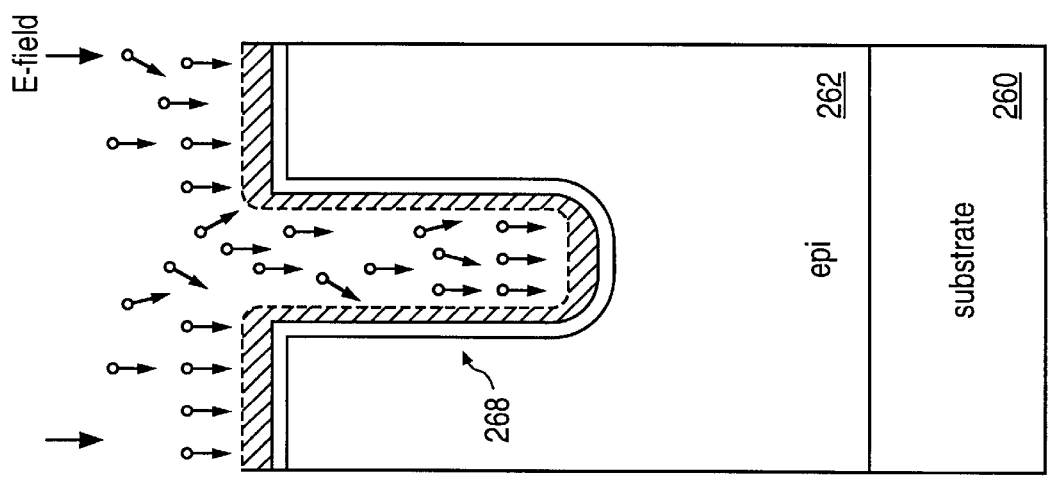
Figure 13D:
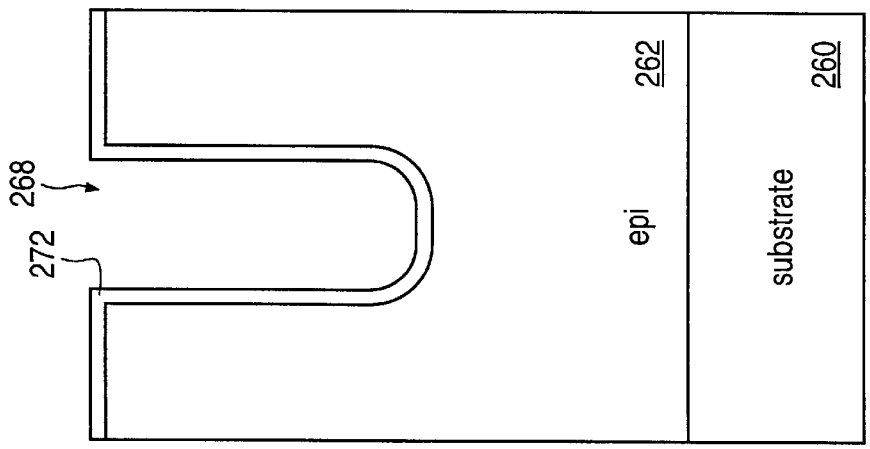
Figure 13I:
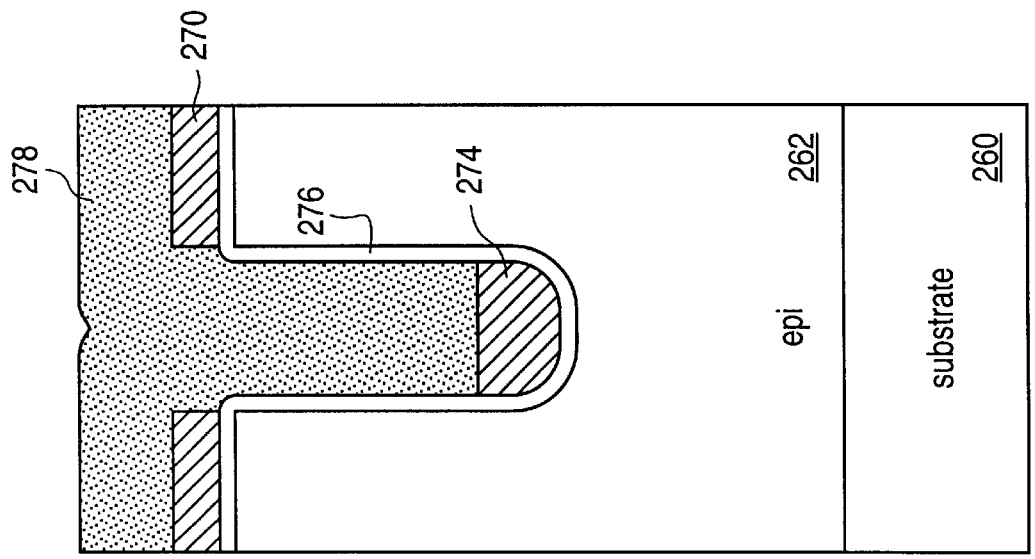
Figure 13H:
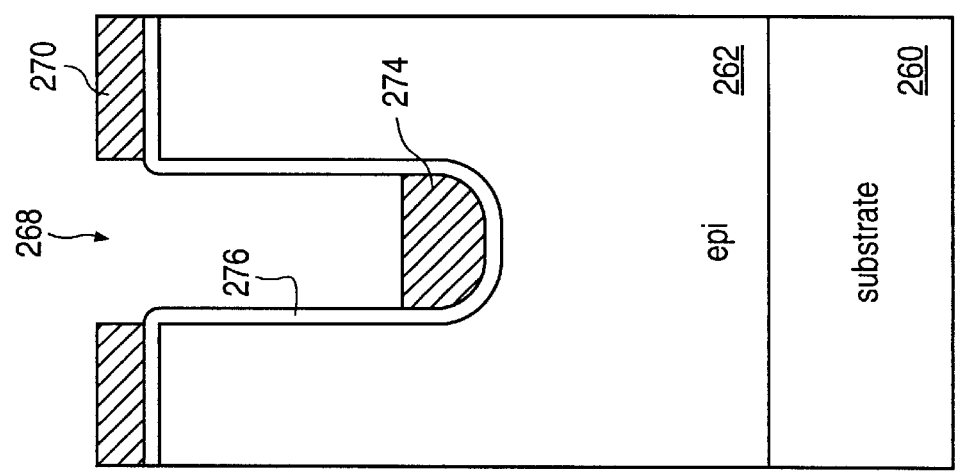
Figure 13G:
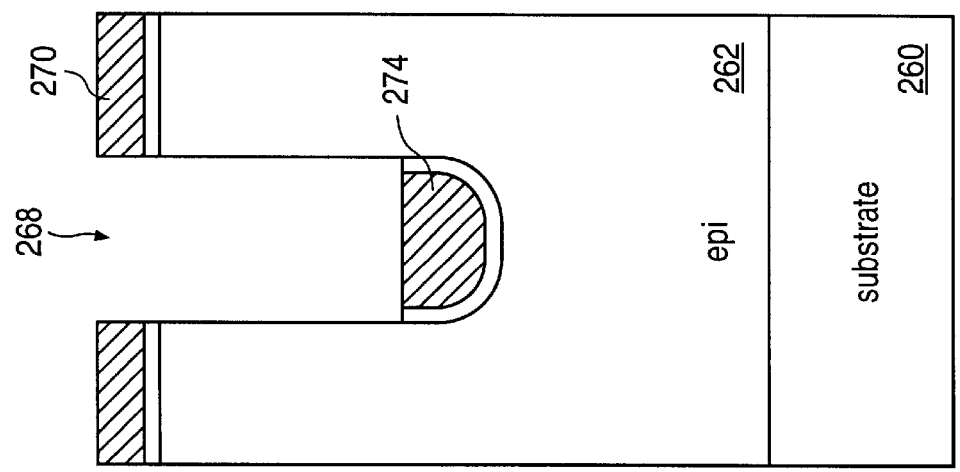
Figure 13L:
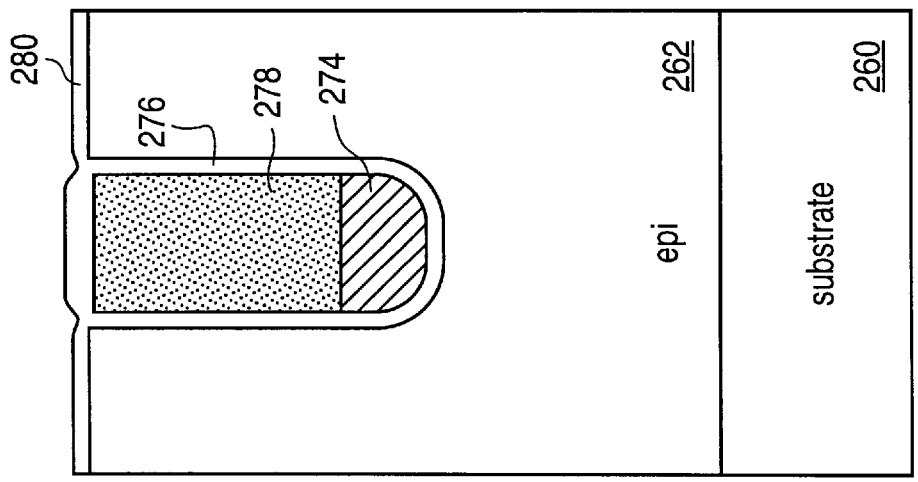
Figure 13K:
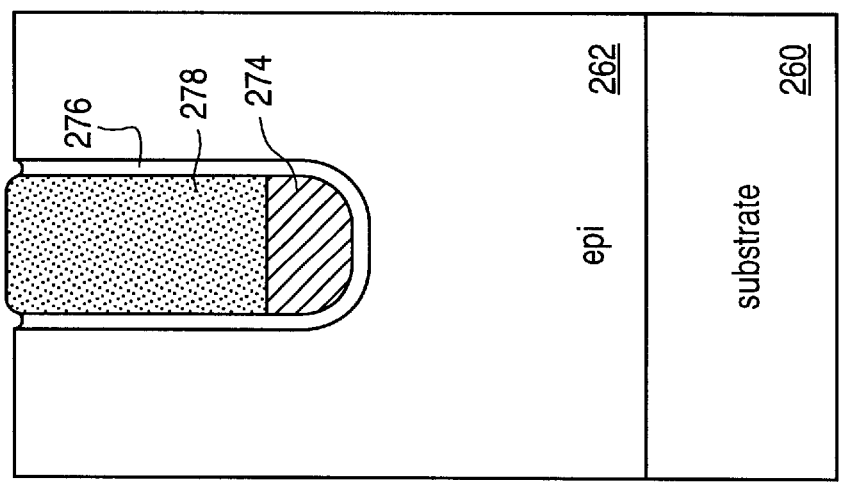
Figure 13J:
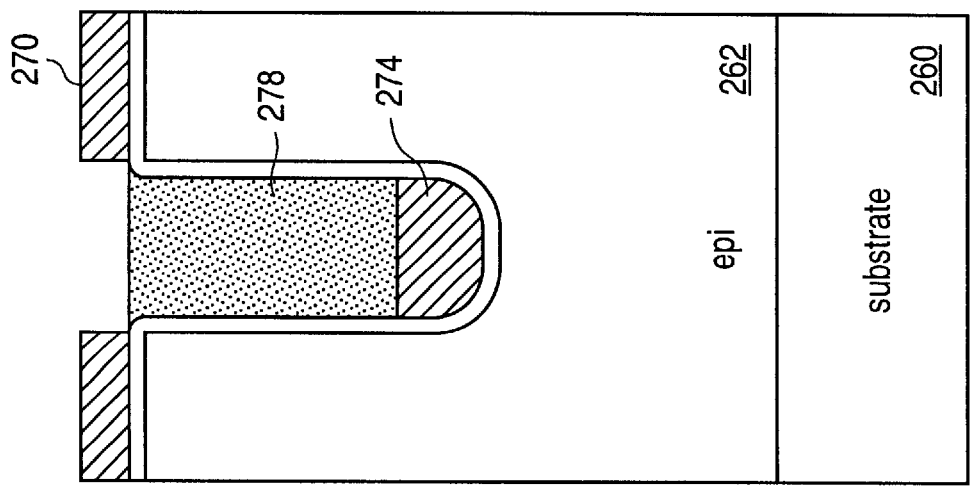
Figure 13N:
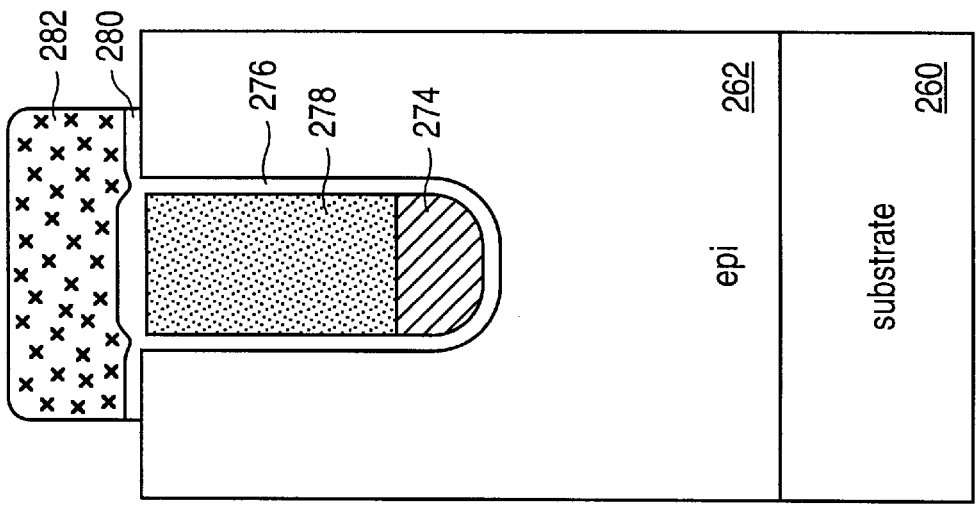

FIGS. 13A–13N illustrate a process using the oxide "dipback" method. The process starts with an epi layer 262 formed on a substrate 260. A mask layer 264 is formed on the top surface of epi layer 262, with an opening where the trench is to be formed. Mask layer 264 may be photoresist or some other material and may be formed on top of an oxide layer 266. A trench 268 is then formed using conventional processes, as shown in FIG. 13A.

In FIG. 13B a sacrificial oxide layer 270 has been formed on the surface of the trench. Sacrificial oxide layer 270 is then removed, as shown in FIG. 13C. Sacrificial oxide layer 270 could be from 100 Å to 1000 Å thick; typically, it would be in the range of 300 Å thick. It can be formed by heating the structure at 800° C. to 1100° C. for 10 minutes to five hours in an oxidizing ambient. The ambient could be either oxygen or it could be oxygen and hydrogen. If the ambient is a combination of oxygen and hydrogen, it is considered a "wet" oxidation because the reaction would produce water vapor and this would affect the consistency and growth rate of the oxide.

Optionally, an oxide lining 272 is then formed on the walls of trench 268. Lining 272 could have a thickness in the range of 100 Å TO 600 Å. Lining 272 prevents the deposited oxides from contacting the silicon directly, which would have the potential for charged states, especially at the interface between the silicon and the deposited oxide. Adding a clean oxide layer on the walls of the trench provides a reduced charge state.

As shown in FIG. 13E, an electric field is applied above the surface of epi layer 262, and dielectric ions are formed and directed downward into trench 268 by means of the electric field. Preferably, a plasma-enhanced chemical vapor deposition chamber is used for this process. The electric field accelerates the dielectric ions downward so that they preferentially deposit on horizontal surfaces, including the bottom of trench 268. The chemical vapor deposition of oxide involves a gaseous chemical reaction of oxygen and silane, dichlorosilane, or silicon tetrachloride. The source of oxygen is typically nitreous oxide, and silane is typically the silicon source. Plasma-enhanced chemical vapor deposition machines are available from such companies as Novellus Systems and Applied Materials.

Another method to achieve a directional deposition is to sputter a oxide film from an oxide-coated target onto the wafer. Since sputtering is a momentum transfer process, the deposition occurs in a straight line.

The result of this process is shown in FIG. 13F, where an oxide layer 270 has been formed inside and outside the trench 268. Note that oxide layer 270 is thicker at the bottom of trench 268 than on the sidewalls of trench 268. It is also thicker on the flat surfaces of epi layer 262. Processes other than chemical vapor deposition, such as sputtering, could also be used to produce oxide layer 270.

Layer 270 could be formed of materials other than oxide, such as phosphorus-doped glass or boron phosphorus silicon glass. It could also consist of other materials having a low dielectric constant K, such as polymers or polyimide. Air bubbles could be incorporated in layer 270 to reduce its dielectric constant.

In FIG. 13G, oxide layer 270 has been etched back or clipped back to remove the portions on the sidewalls of trench 268. A bottom portion 274 of oxide layer 270 remains at the bottom of trench 268. As shown in FIG. 13H, the structure is then heated to form a thin oxide layer 276 on the sidewalls of trench 268. A polysilicon layer 278 is then deposited to fill trench 268 and overflow the top surface of the structure. This is shown in FIG. 13I.

As shown in FIG. 13J, polysilicon layer 278 is then etched back until it is roughly coplanar with the top surface of epi layer 262. Next, the portions of oxide layer 270 on the surface of epi layer 262 are removed, taking care not to etch too much of the oxide layer 276 on the sidewalls of the trench. The result of this step is shown in FIG. 13K. Avoiding the removal of oxide layer 226 is best performed by having polysilicon layer 278 protrude slightly above the oxide layer 276. In FIG. 13L, the entire top surface of the structure, including the top surface of polysilicon layer 278, has been oxidized to form an oxide layer 280.

Figure 13M:
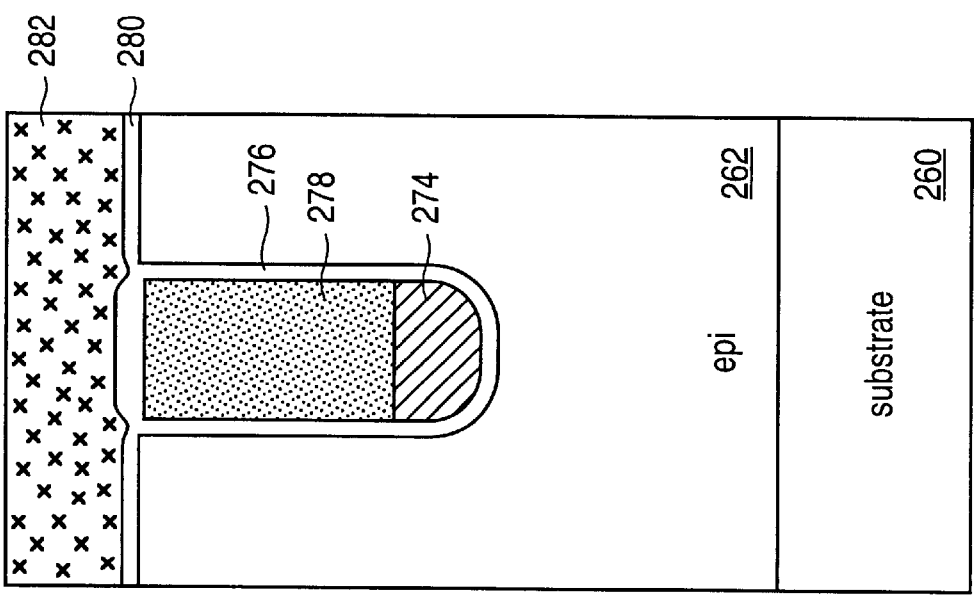

As shown in FIG. 13M, a glass layer 282 is laid down over the surface of oxide layer 280, and glass layer 282 and oxide layer 280 are then patterned and etched to form contact openings to the epi layer 262, yielding the structure shown in FIG. 13N.

FIGS. 14A–14F show an alternate process flow beginning with the structure shown in FIG. 13I. FIG. 14A corresponds to FIG. 13I. Polysilicon layer 278 is etched back, as shown in FIG. 14B, and then the top surface of the remaining portion of polysilicon layer 278 is oxidized to form an oxide layer 290, as shown in FIG. 14C. A glass layer 292 is then deposited over the entire surface of the structure, as shown in FIG. 14D. A mask layer 294 is formed on the top surface of glass layer 292, and layers 270 and 292 are etched to form contact openings, as shown in FIG. 14F. Mask layer 294 is then removed.

Figure 15A:
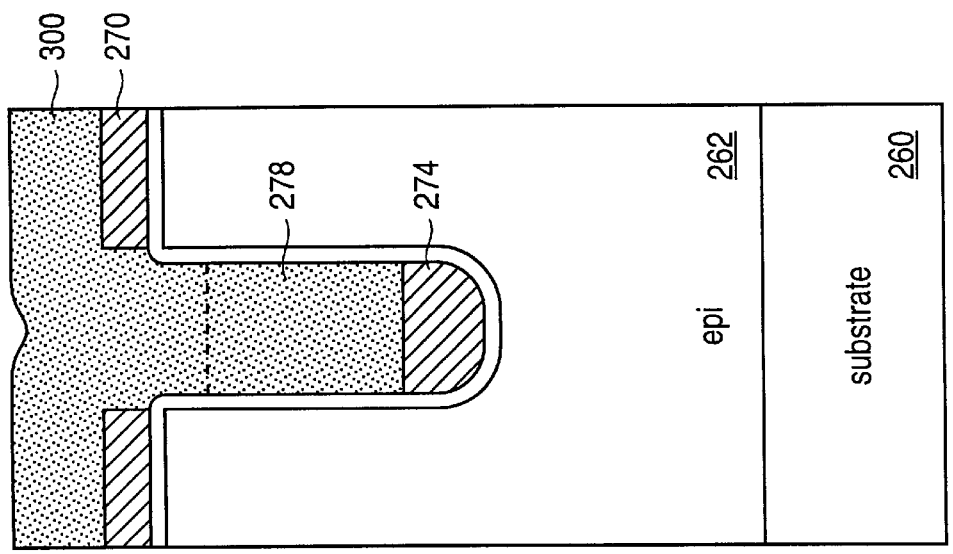
FIGS. 15A–15F illustrate an alternative process sequence in which the polysilicon is deposited in two stages.
Figure 15B:
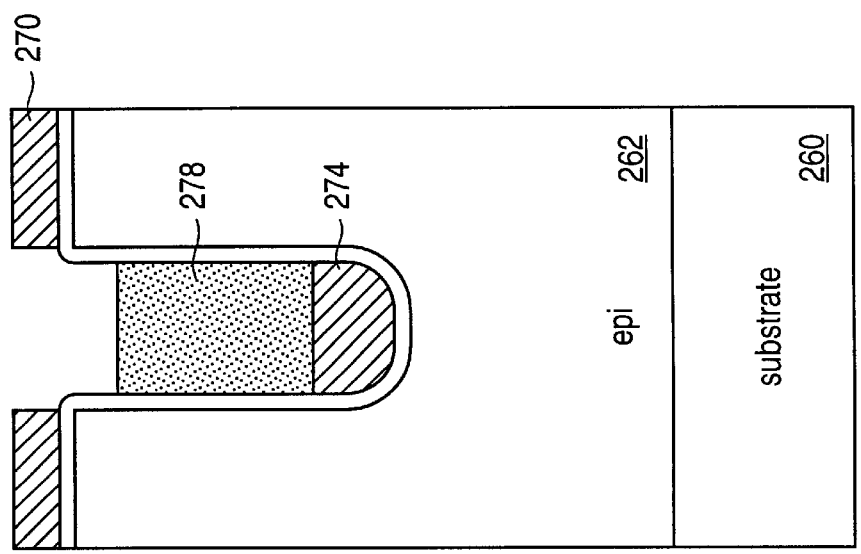
Figure 15C:
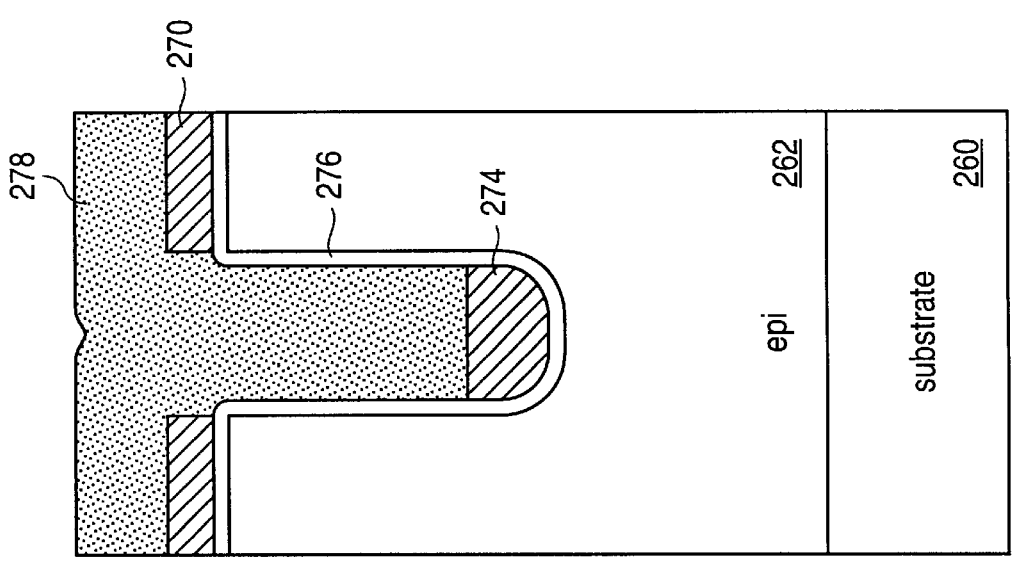
Figure 15F:
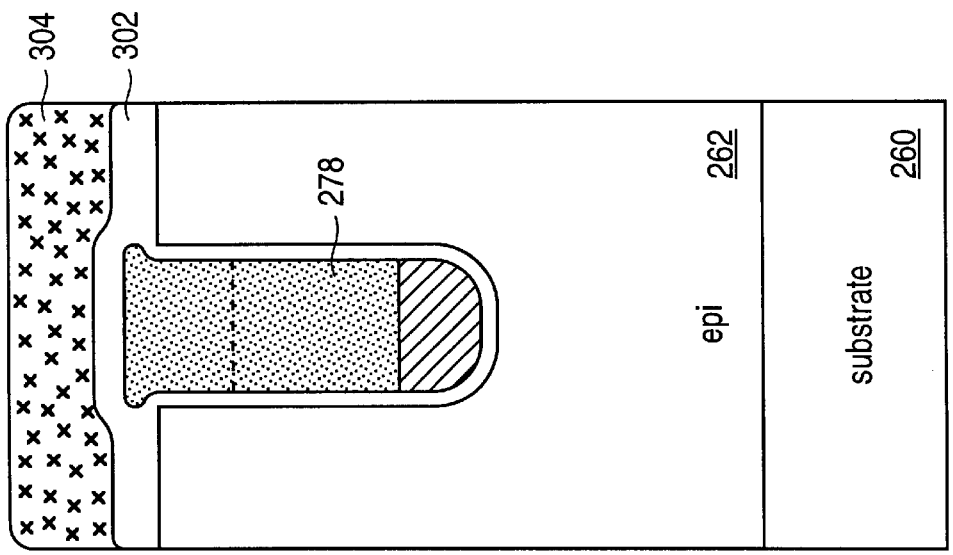
Figure 15E:
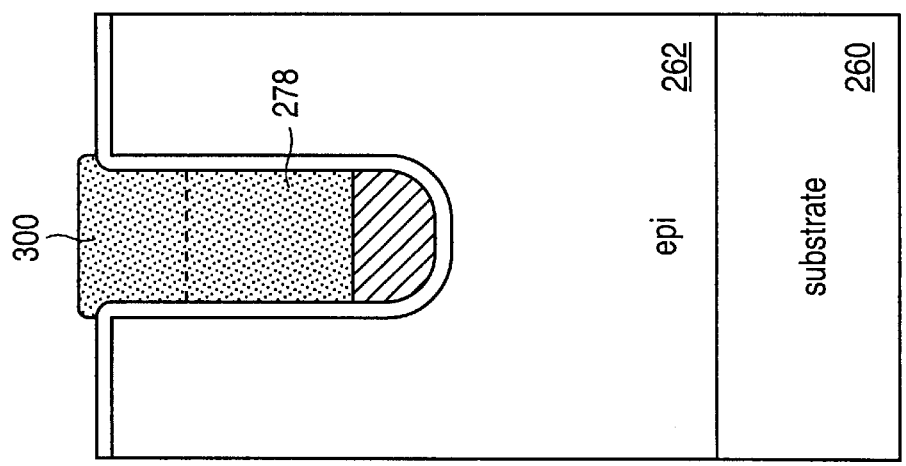
Figure 15D:
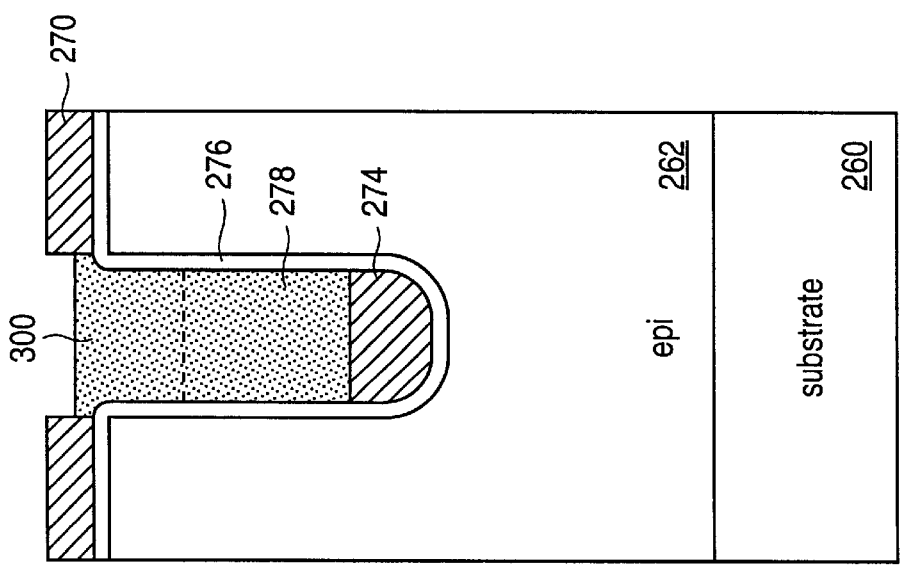

FIGS. 15A–15F illustrate yet another alternative process, beginning again with the structure shown in FIG. 13I. FIG. 15A corresponds to FIG. 13I. Polysilicon layer 278 is etched back to a level inside the trench, as shown in FIG. 15B. Next, a second polysilicon layer 300 is deposited over the entire structure, as shown in FIG. 15C. Polysilicon layer 300 is then etched back, but care is exercised to ensure that the portion of oxide layer 276 at the upper corner of the trench is not exposed. The resulting structure is shown in FIG. 15D. Next, oxide layer 270 is removed, as shown in FIG. 15E, and an oxide layer 302 is formed over the entire surface of the structure. A glass layer 304 is then deposited over oxide layer 302, yielding the structure illustrated in FIG. 15F.

Figure 16C:
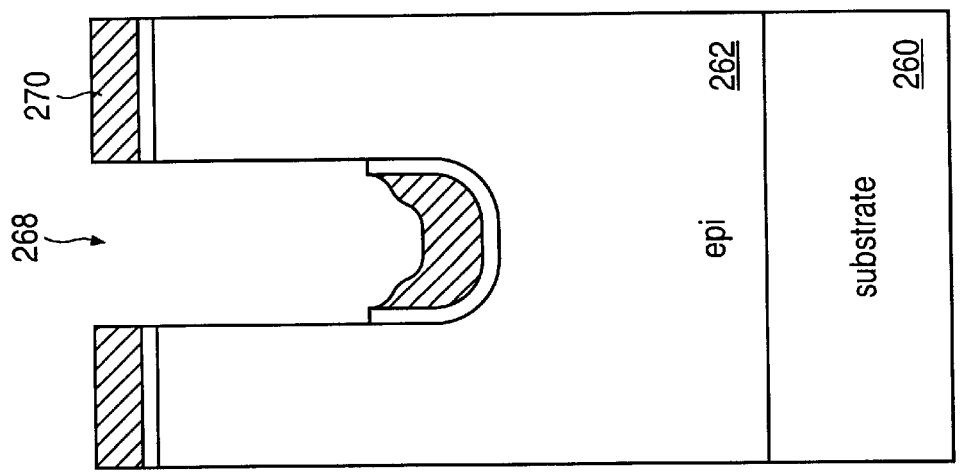
FIGS. 16A–16E illustrate an alternative process in which a small amount of photoresist is used to mask the thick oxide at the bottom of the trench.
Figure 16B:
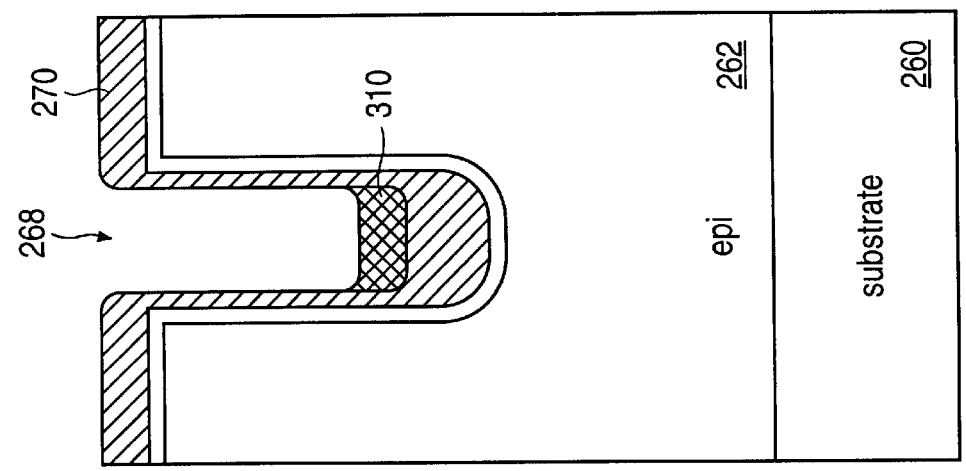
Figure 16A:
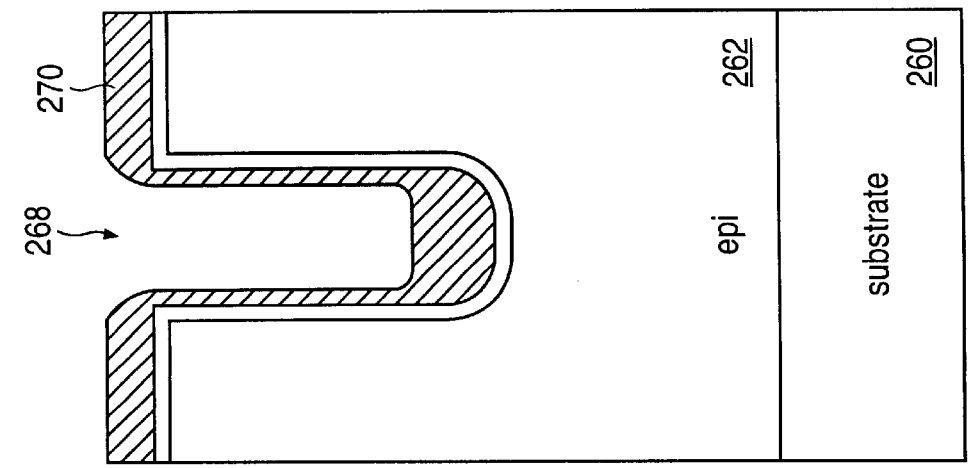
Figure 16E:
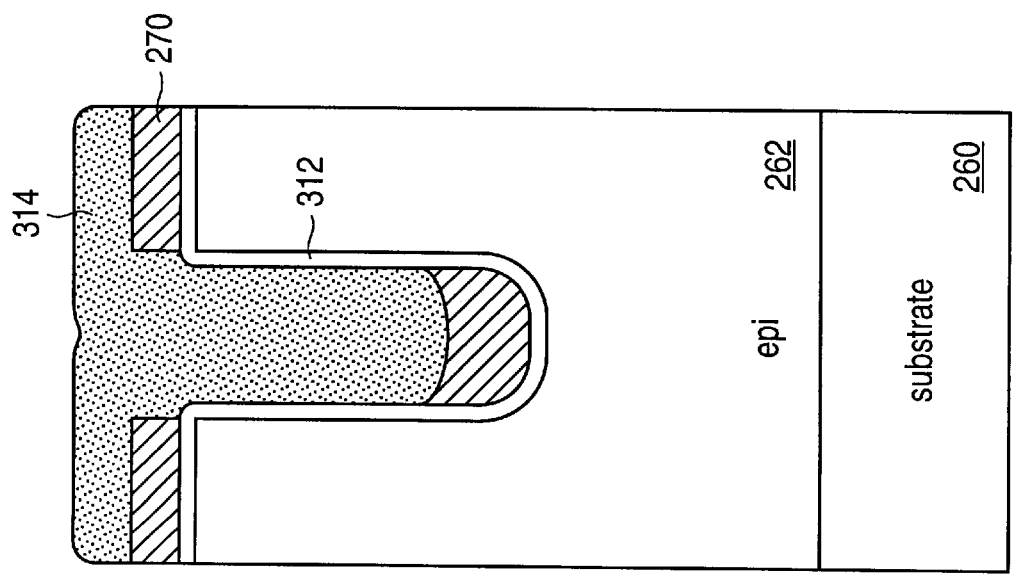
Figure 16D:
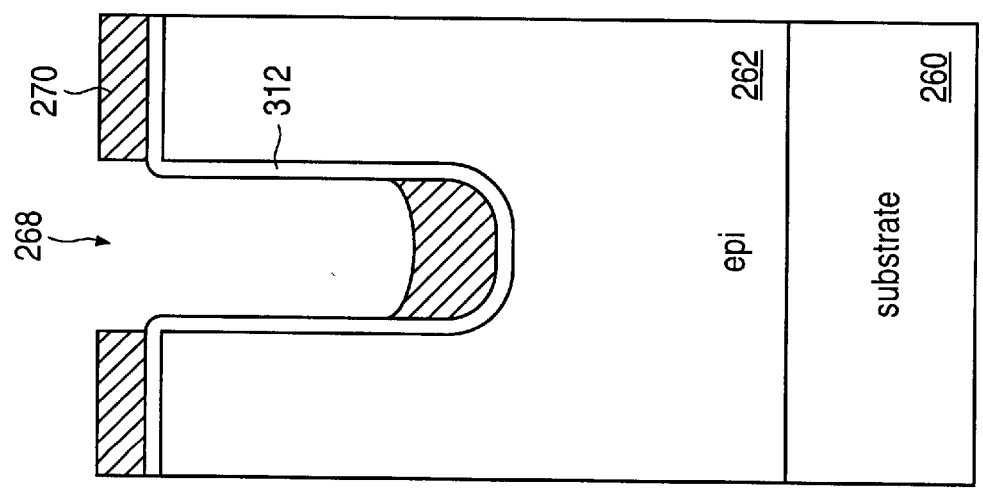

FIGS. 16A–16E illustrate an alternative process, beginning with the structure in FIG. 13F. FIG. 16A corresponds to FIG. 13F. A photoresist layer is then formed over the structure and is developed and rinsed in a way that is sufficient to clean the photoresist layer off the top of the structure but leave it at the bottom of trench 268. This takes advantage of the fact that it is difficult to get the photoresist out of the bottom of the trench 268. The resulting structure with a remaining portion of photoresist layer 310 in the bottom of trench 268 is shown in FIG. 16B. An oxide etch is then performed removing the portion of oxide layer 270 from the sidewalls of trench 268. A thorough rinse is then performned to remove photoresist 310, producing the structure illustrated in FIG. 16C. The structure is then oxidized to form a thin oxide layer 312 on the sidewalls of the trench and the trench is filled with a polysilicon layer 314, as shown in FIGS. 16D and 16E. A two-step polysilicon deposition could be performed as shown in FIGS. 15A–15C.

Figure 17C:
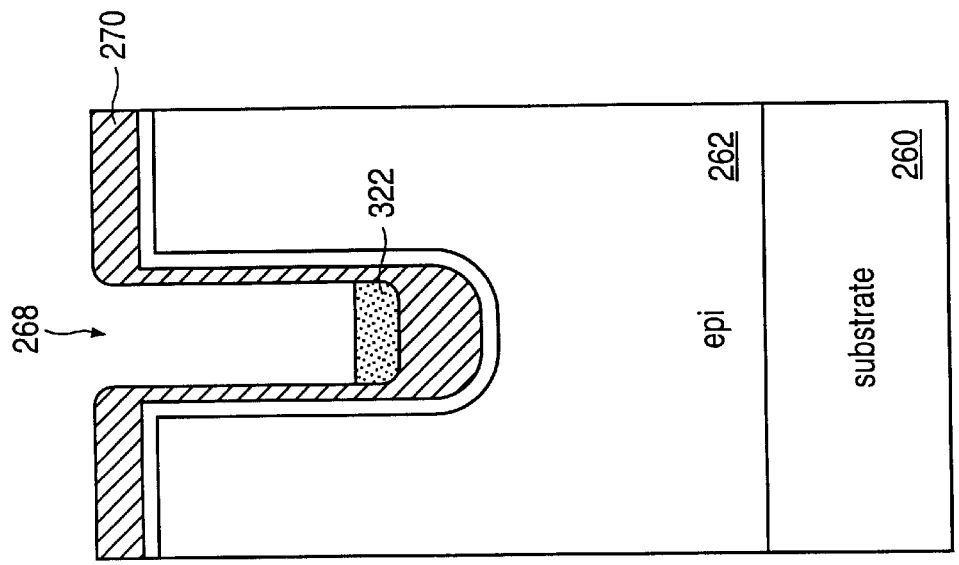
Figure 17B:
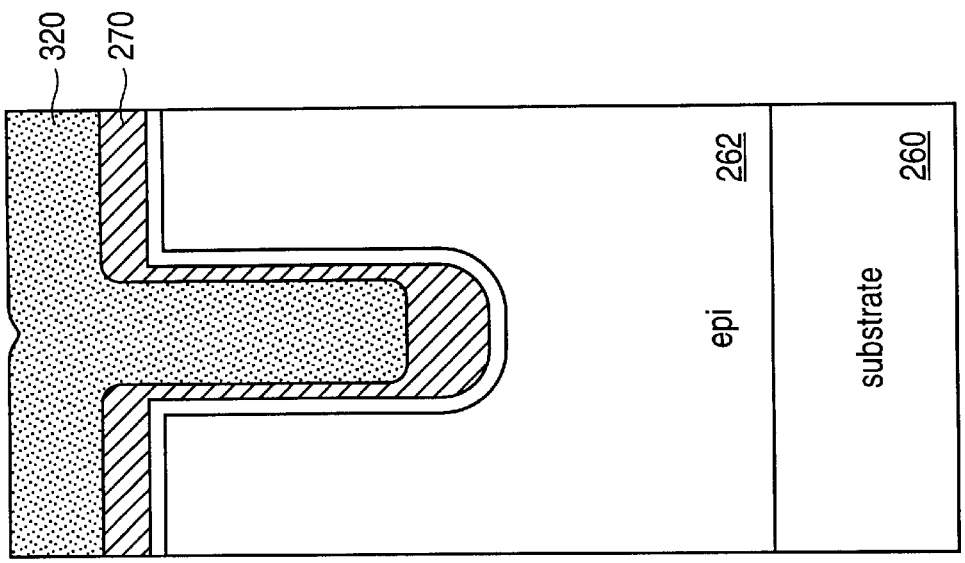
Figure 17A:
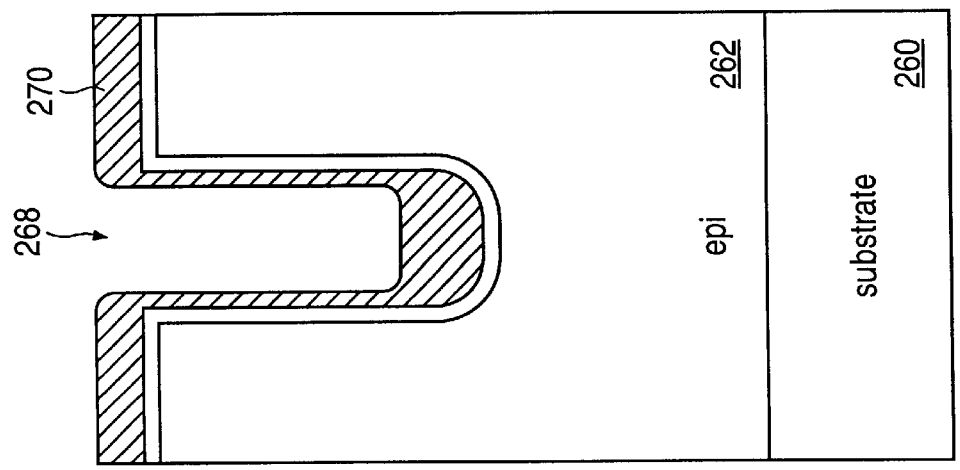
Figure 18C:
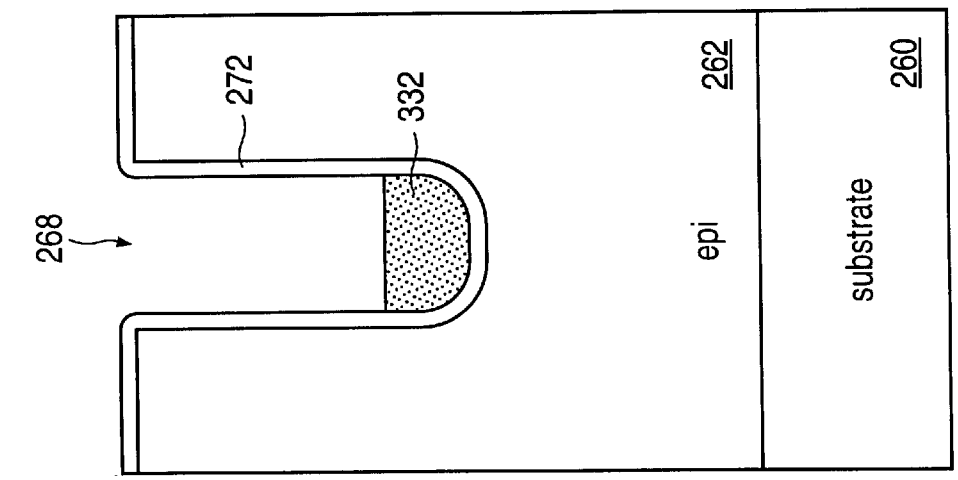
FIGS. 18A–18F illustrate an alternative process in which the polysilicon is oxidized.
Figure 18B:
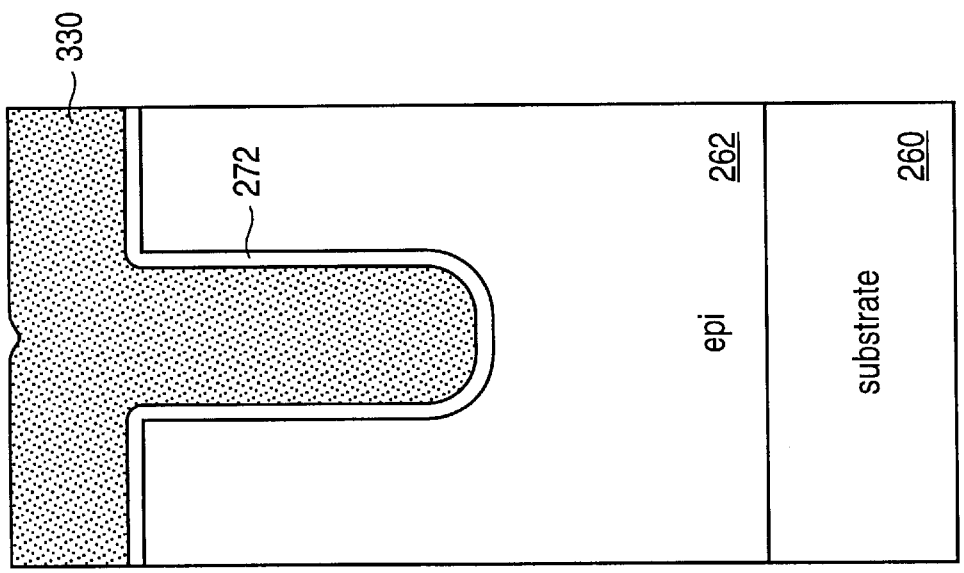
Figure 18A:
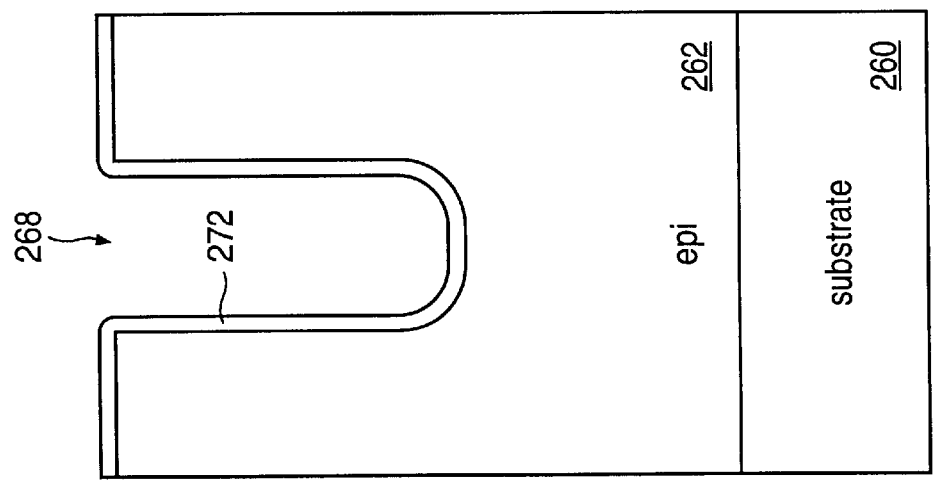
Figure 18F:
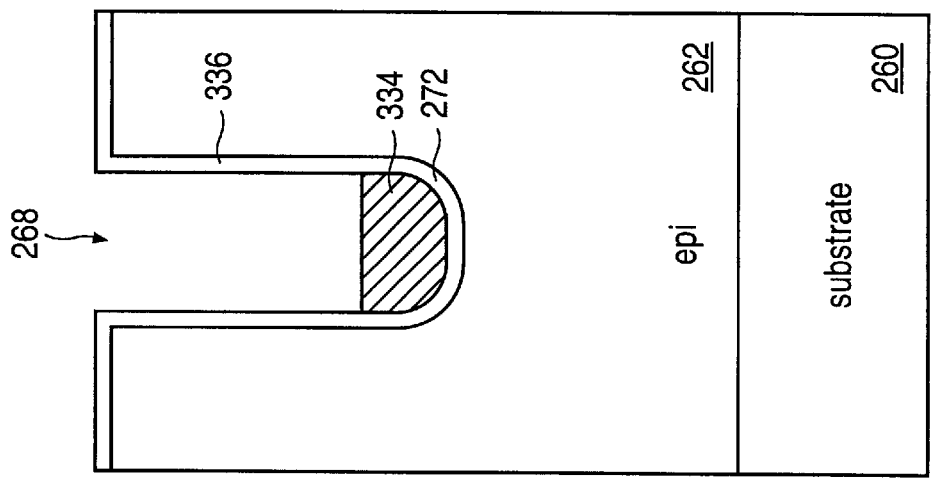
Figure 18E:
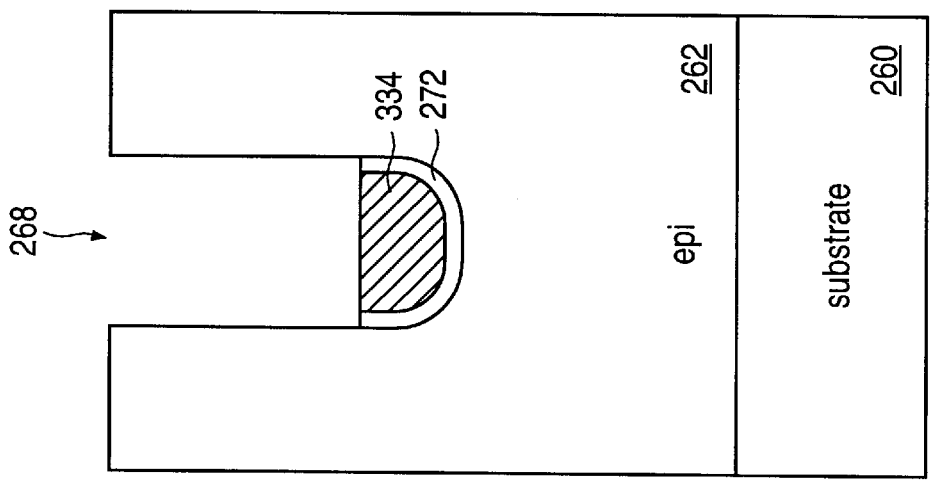
Figure 18D:
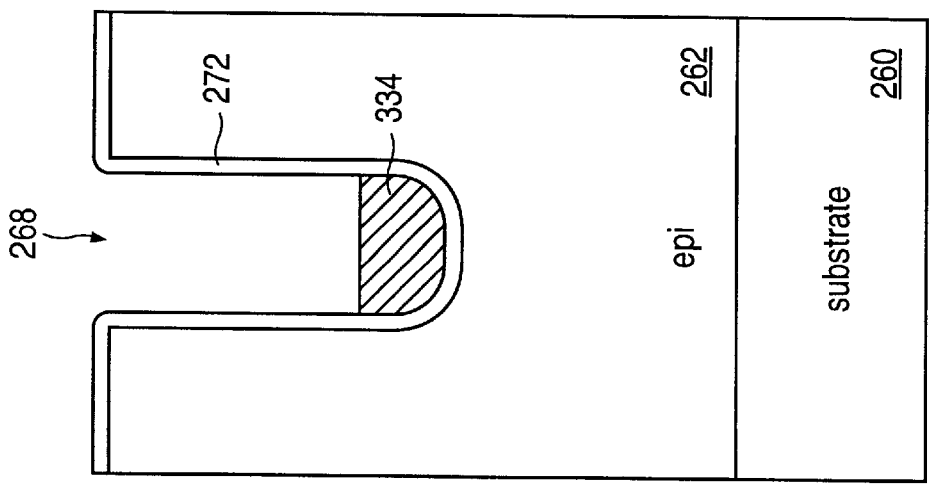

FIGS. 17A–17F show yet another alternative process sequence, beginning with the structure shown in FIG. 13F. FIG. 17A corresponds to FIG. 13F. As shown in FIG. 17B, a sacrificial polysilicon layer 320 is deposited. Polysilicon layer 320 is etched back until only a small portion 322 remains at the bottom of trench 268. The portion 322 of polysilicon layer 320 is then oxidized. A low temperature oxidation process is used (e.g., 700 to 950° C.), since at a low temperature polysilicon oxidizes more rapidly than single crystal silicon. Thus oxide forms in portion 322 at a faster rate than on the sidewalls of trench 268. The resulting structure is shown in FIG. 17B, with an oxide layer 324 at the bottom of trench 268. The portion of oxide layer 270 is removed from the sidewalls of trench 268, as shown in FIG. 17E, and a thin gate oxide layer 326 is formed on the sidewalls of trench 268, as shown in FIG. 17F. FIGS. 18A–18F show yet another alternative process sequence, beginning with the structure shown in FIG. 13B. FIG. 18A corresponds to FIG. 13D, where oxide lining 272 has just been formed. Instead of using a directional dielectric deposition, as shown in FIG. 13E, a sacrificial polysilicon layer 330 is deposited, as shown in FIG. 18B. Polysilicon layer 330 is etched back until only a small portion 332 remains at the bottom of trench 268, as shown in FIG. 18C. The structure is then subjected to a low-temperature oxidation, as described above, converting polysilicon portion 332 into an oxide layer 334, as shown in FIG. 18D. Oxide lining 272 is then stripped from the sidewalls and top surfaces of the structure, as shown in FIG. 18E, and a gate oxide layer 336 is grown on the sidewalls of trench 268. The resulting structure is then shown in FIG. 18F.

Figure 19C:
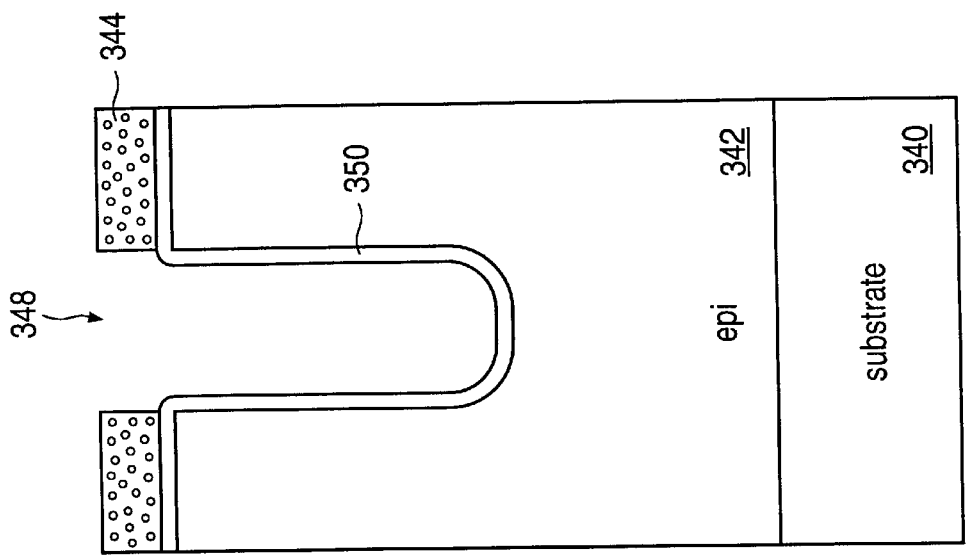
Figure 19B:
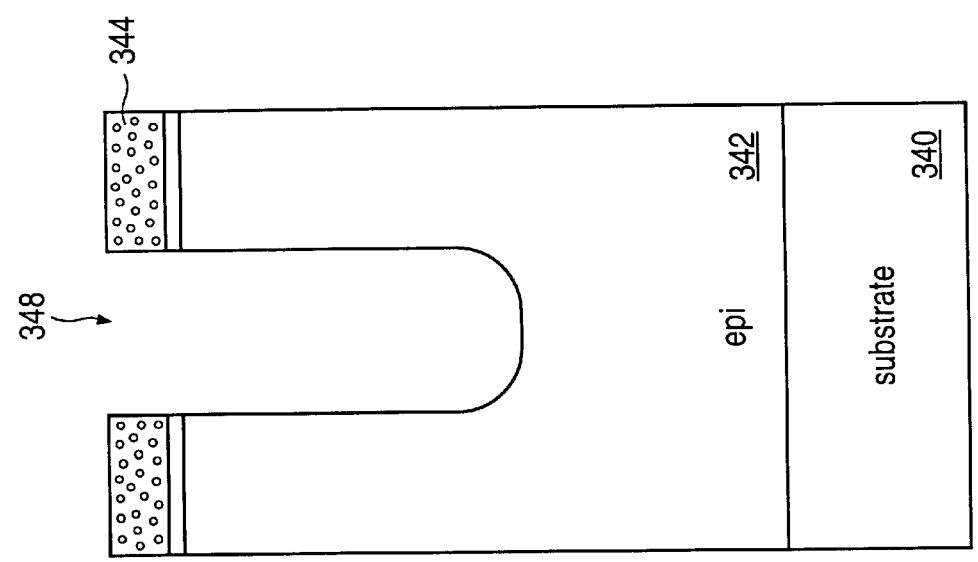
Figure 19A:
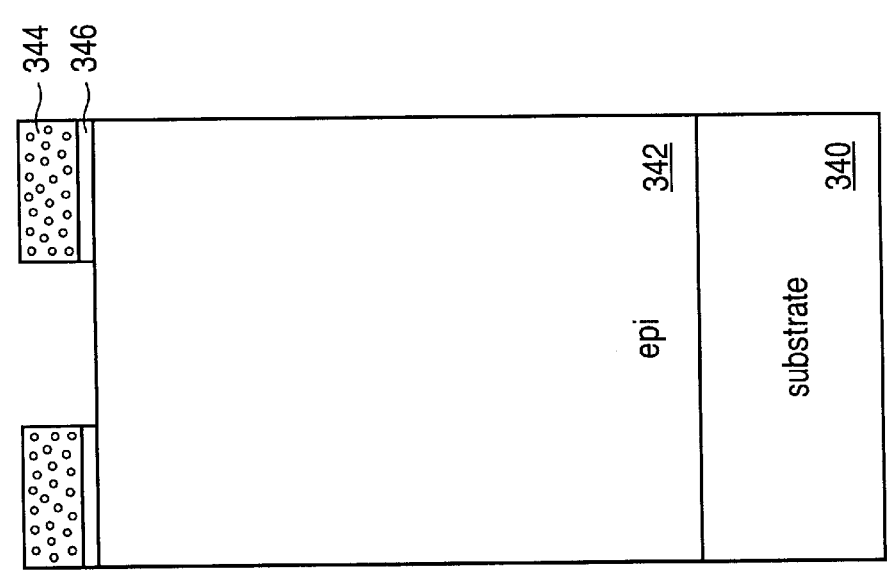

FIGS. 19A–19I illustrate a process which contains elements of the super self-aligned process described in the above-referenced application Ser. No. 09/296,959. The structure is formed in an epi layer 342 which is grown on a substrate 340. A thin oxide layer 346 is formed on the surface of epi layer 342, and this is covered by a layer 344 of a hard masking material such as silicon nitride. An opening is etched in nitride layer 344 and oxide layer 346, as shown in FIG. 19A.

As shown in FIG. 19B, a trench 348 is etched in epi layer 342 using a conventional process. A sacrificial oxide layer (not shown) is formed on the walls of trench 348 and then removed. As shown in FIG. 19C, an oxide lining 350 is then formed on the walls of trench 348. As shown in FIG. 19D, a directional deposition of the kind described above in connection with FIG. 13E is performed, forming an oxide layer 352. Oxide layer 352 includes a thick portion 354 at the bottom of trench 348. As shown in FIGS. 19E and 19F, the portions of oxide layer 352 and oxide lining 350 are removed from the sidewalls oftrench 348. This is done by dipping the structure in, for example, 170 HF acid. A gate oxide layer 356 is then formed and the trench is filled with a polysilicon layer 358. These steps are shown in FIGS. 19G and 19H.

As shown in FIG. 19I, polysilconl layer 358 is then etched back to a level above the surface of the thin oxide layer 346. In FIG. 19J, the thick oxide layer 352 has been removed from above the nitride layer 344, with the polysilicon layer 358 protecting the thin oxide layer 356 at the edges of trench 348. The structure is then annealed such that a portion of polysilicon layer 358 is oxidized to form a thick oxide layer 360 in the upper region of the trench, as shown in FIG. 19K. Finally, as shown in FIG. 19L nitride layer 344 is removed.

Figure 20D:
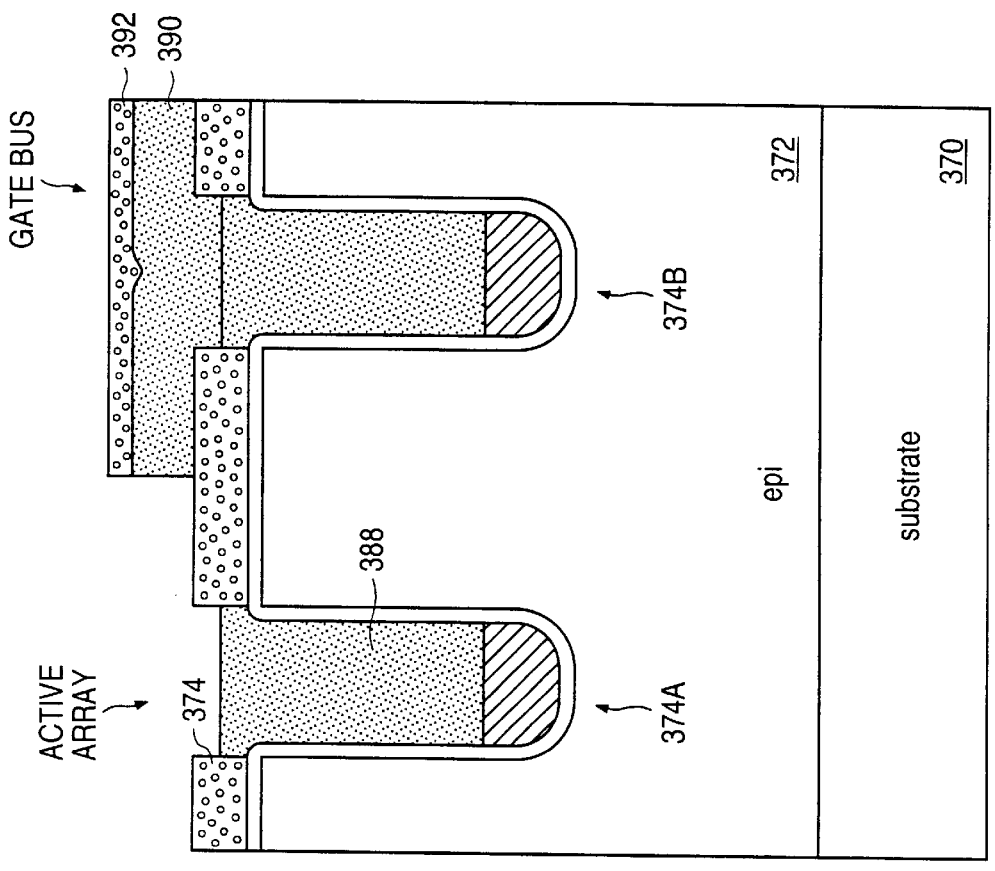
Figure 20C:
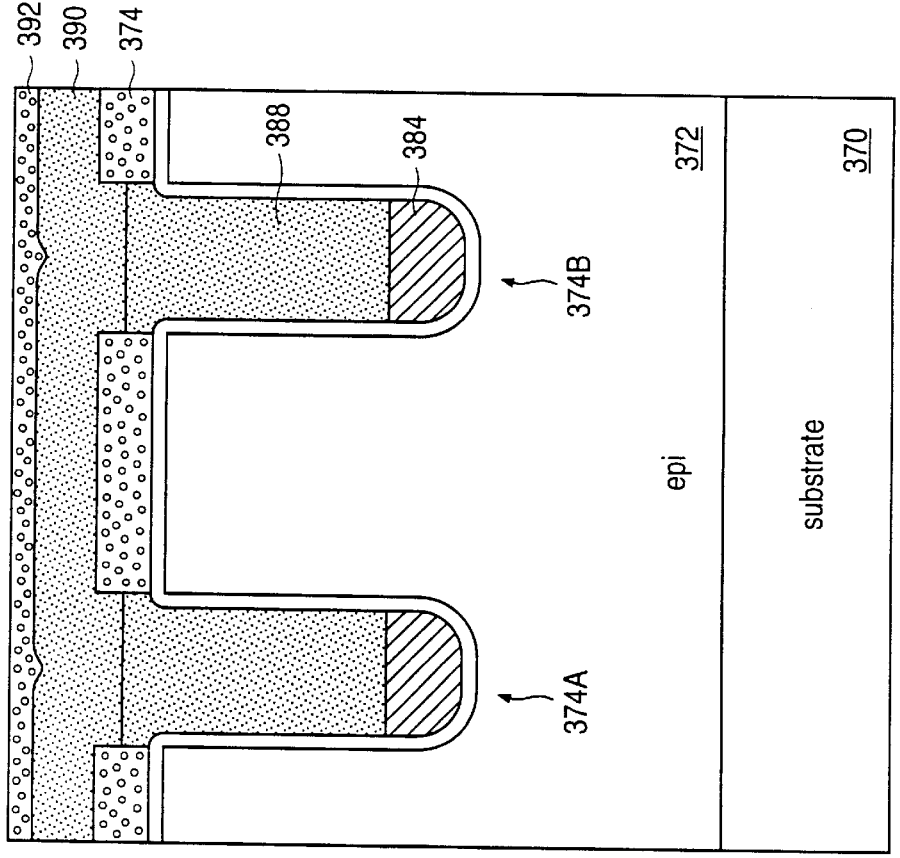
Figure 20F:
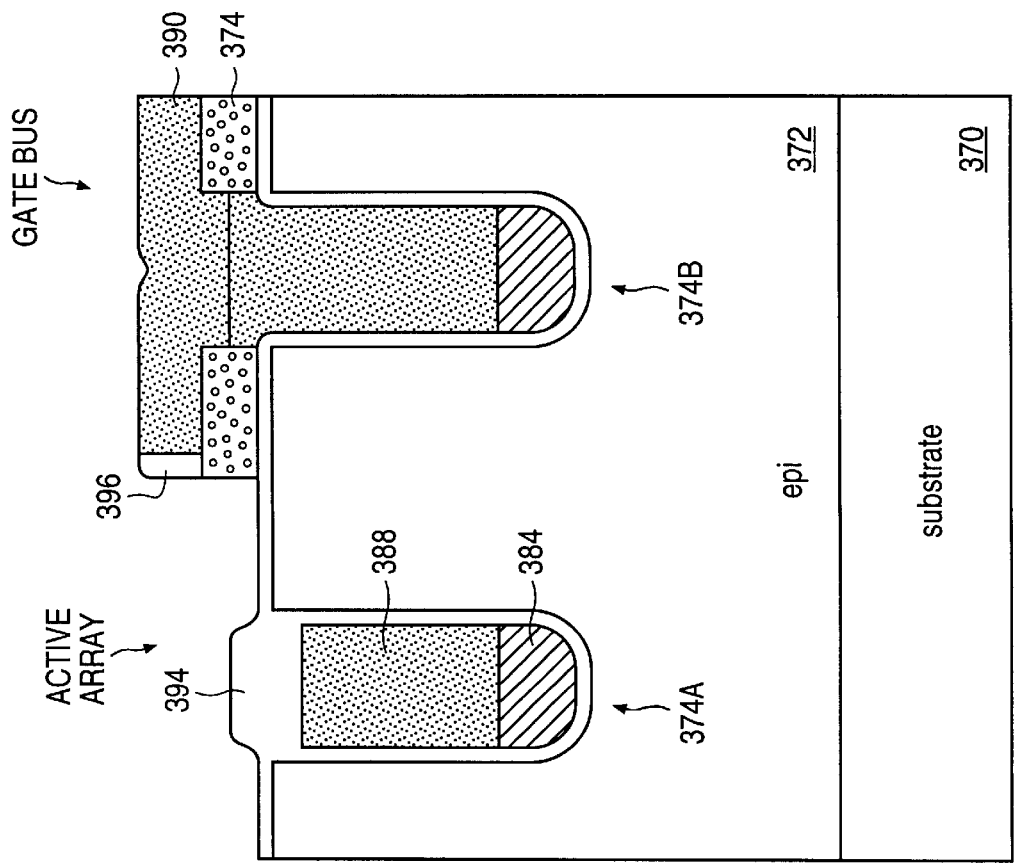
Figure 21C:
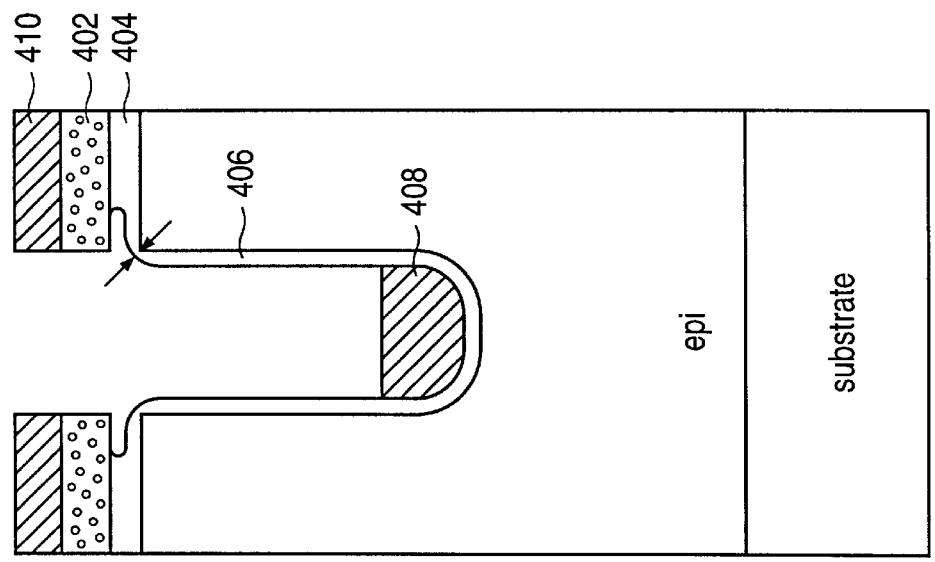
FIGS. 21A–21E illustrate a problem that can occur from tndercutting the thin oxide layer below the nitride.
Figure 21B:
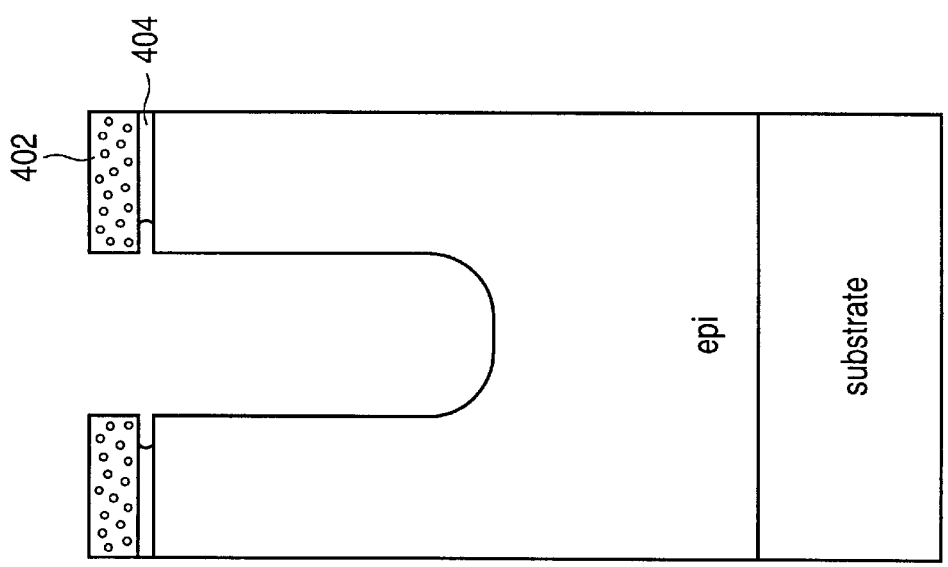
Figure 21A:
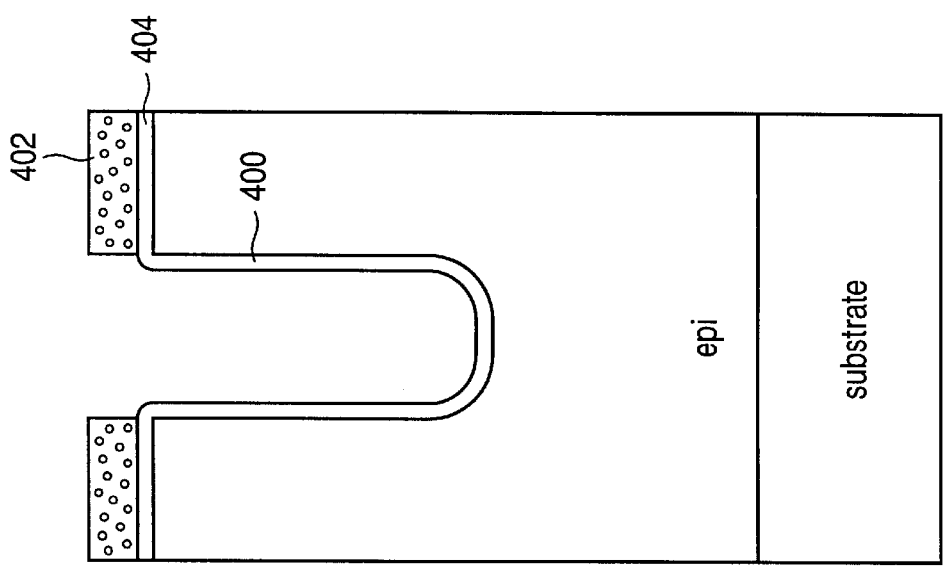

FIGS. 21A–20F show a two-stace polysilicon process with two trenchcs, one of which is in the active array and the other of which is part of a gate bus. The process starts at the point illustrated in FIG. 19H, with a polysilicon layer 388 filling trenches FIG. 374A and 374B. A thick oxide layer 384 has been formed at the bottom of trenches 374A and 374B. A silicon nitride layer 374 overlies the surface of epi layer 372. Nitride layer 374 is covered by an oxide layer 382.

Polysilicon layer 388 is etched back as shown in FIG. 20B, and oxide layer 382 is removed. A second polysilicon layer 390 is deposited over polysilicon layer 388, and a "hard" layer 392, formed of nitride or polyimide, for example, is deposited on top of the second polysilicon layer 390. The resulting structure is illustrated in FIG. 20C.

Figure 20E:
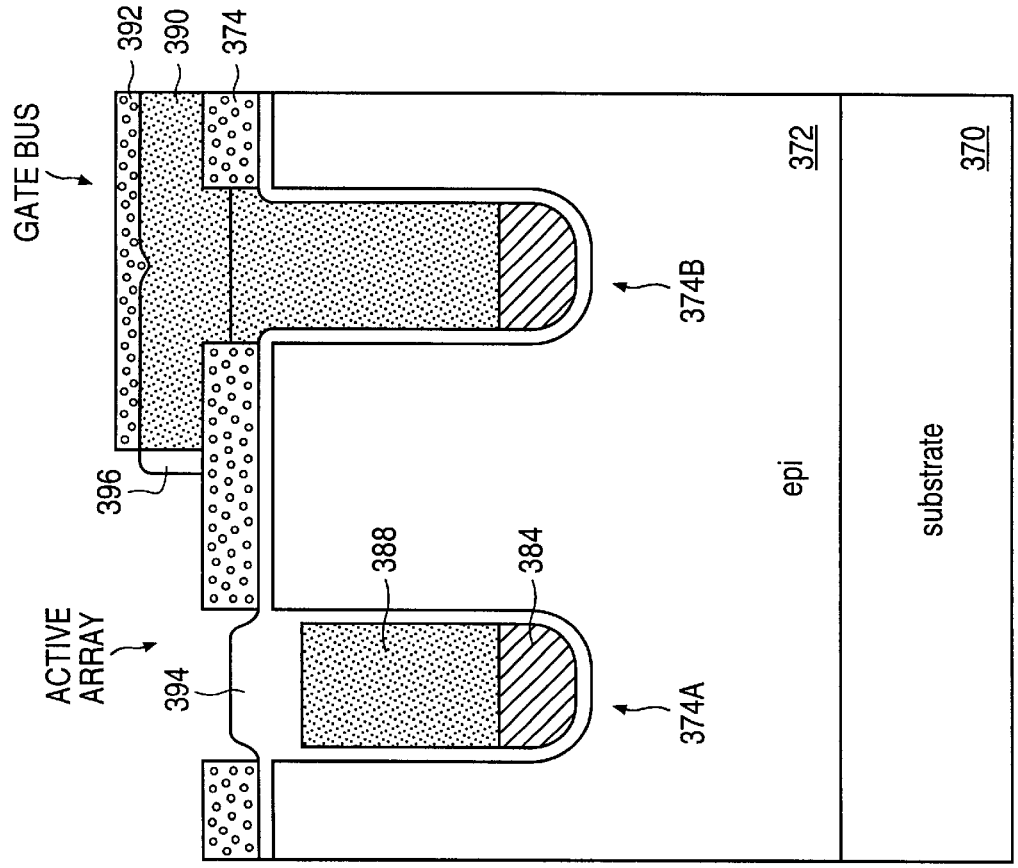

As shown in FIG. 20D, polysilicon layer 390 and the hard layer 392 are etched from the region of the active array (trench 374A), leaving these layers in the region of the gate bus (trench 374B). The structure is then heated to oxidize polysilicon layer 388 in trench 374A producing a thick oxide layer 394 in the upper region of that trench. At the same time, an oxide layer 396 forms on the exposed edge of second polysilicon layer 390. This structure is shown in FIG. 20E.

Finally the exposed portions of the hard layers 374 and 392 are removed, yielding the arrangement shown in FIG. 20F.

FIGS. 21A–21E and 22A–22C iustrate two problems that need to be avoided. FIG. 21A shows a sacrificial oxide layer 400 along the walls of the trench and a thin oxide layer 404 and a nitride layer 402 on the top surface of the epi layer. As shown in FIG. 21B, in the process of removing the sacrificial oxide layer 400, a portion of the thin oxide layer 404 has been removed underneath nitride layer 402. The solution to this problem is to minimize the oxide overetch time or to use an oxide layer 404 that is as thin as possible, even as thin as 15 to 90 Å.

Figure 21E:
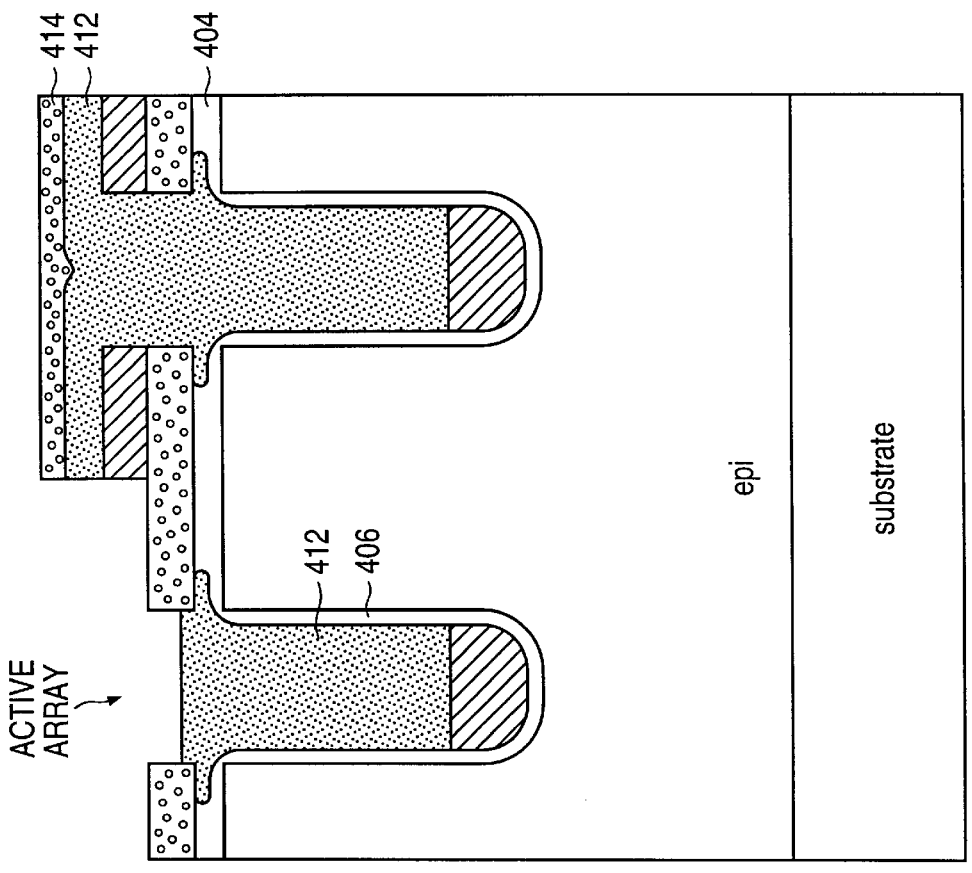
Figure 21D:
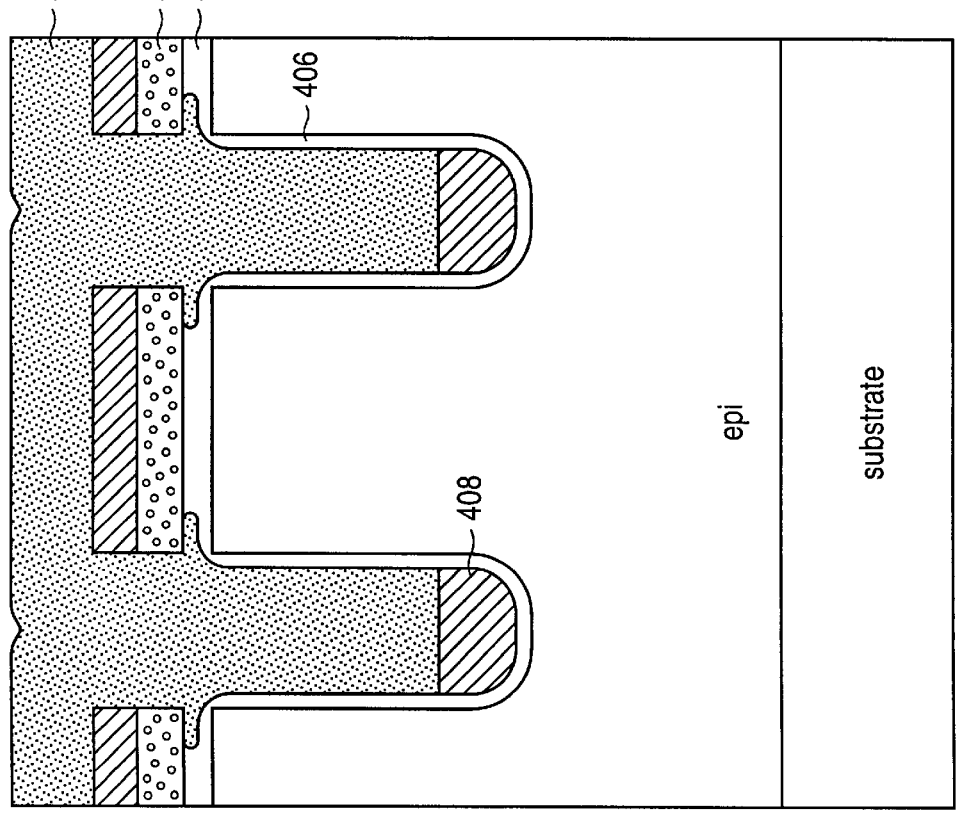

When the gate oxide layer 406 is formed, following the formation of a thick oxide layer 408 at the bottom of the trench, the gate oxide layer 406 may not adequately cover the upper corner of the trench, as shown in FIG. 21C. FIGS. 21D and 21E show the arrangement after a polysilicon layer 412 has been deposited and, using a "hard" layer 414, formed of nitride or polyimide, for example, as a mask, etched back from an active array area of the device, showing the thin oxide layer that separates polysilicon layer 412 from the epi layer at the upper corner of the trenches.

Figures 22A, 22B, 22C:
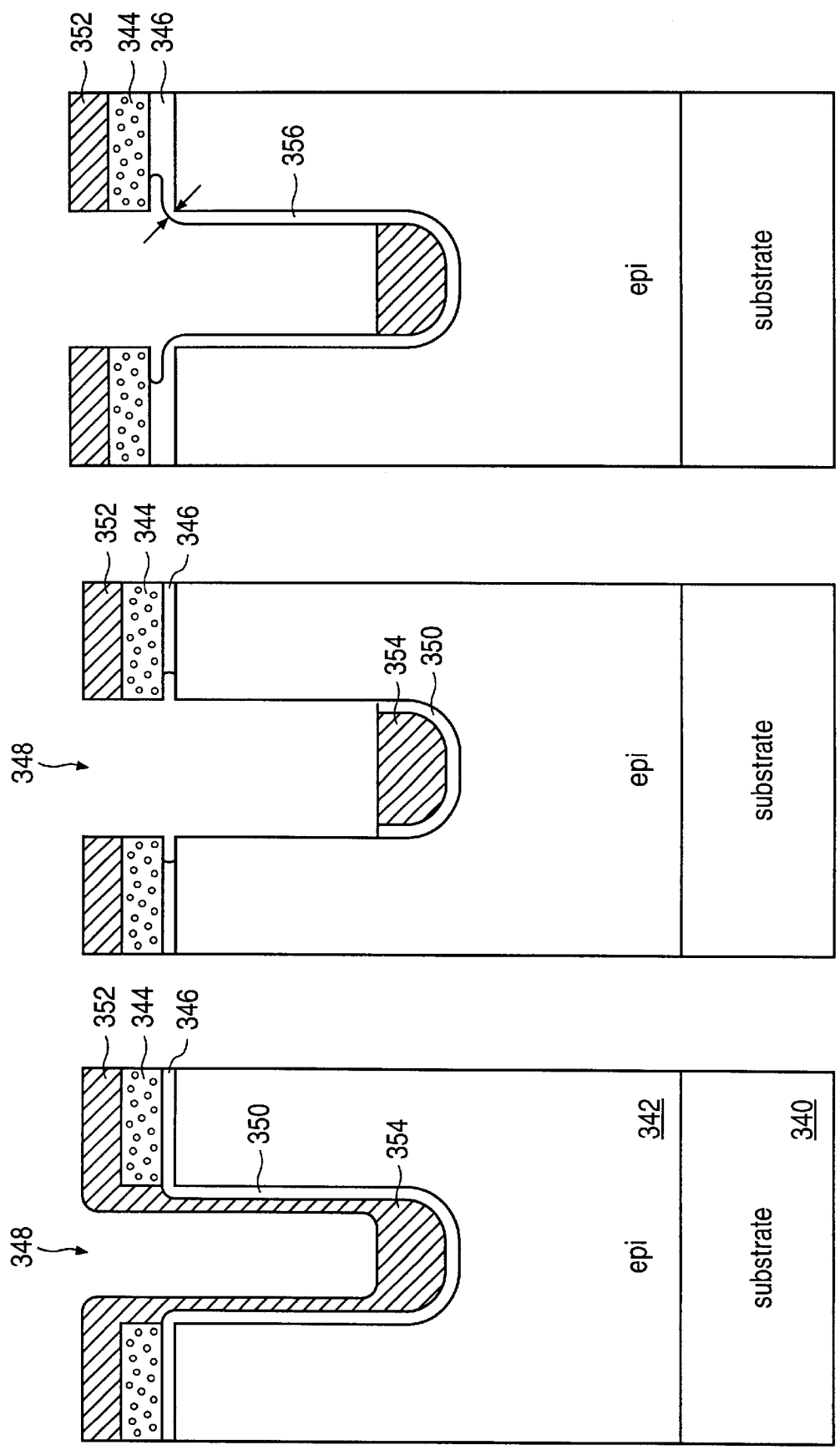
FIGS. 22A–22C illustrate further examples of this problem.

FIGS. 22A–22C illustrate another potential problem area. FIG. 22A shows a device at the same stage that is illustrated in FIG. 19D, with thick oxide layer 352 having been directionally deposited, forming a thick portion 354 at the bottom of the trench. In the process of removing the oxide from the sidewalls of the trench, as shown in FIG. 22B, a portion of the thin oxide layer 346 is removed from underneath nitride layer 344. Then, when the gate oxide layer 356 is grown, the portion of the oxide layer at the upper corner of the trench is unduly thin, and this can lead to defects in the oxide and shorting between the gate and the epi layer. This problem is illustrated in FIG. 22C. Again, the solution is to minimize any oxide overetch or alternatively to use a plasma etch whose chemistry etches isotropically.

Figure 23A:
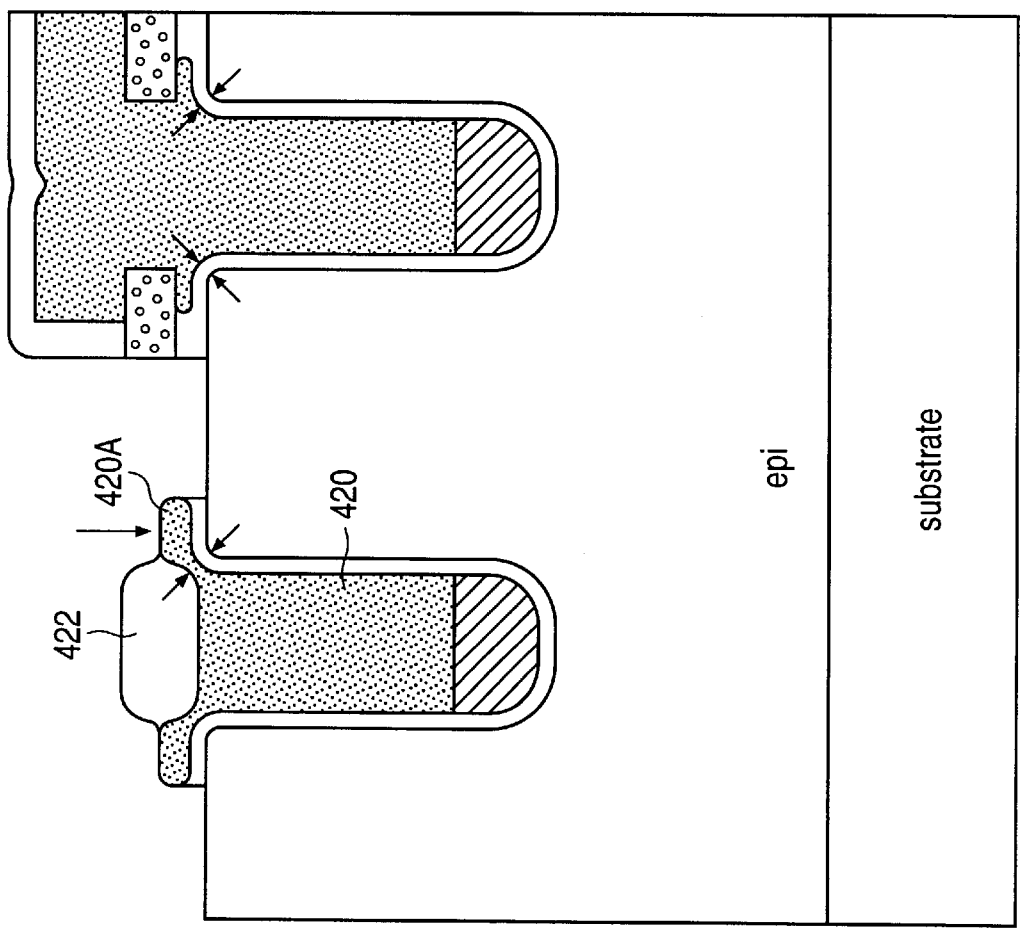
FIGS. 23A–23G illustrate other problems that can arise in the fabrication of power MOSFETs in accordance with this invention.
Figure 23C:
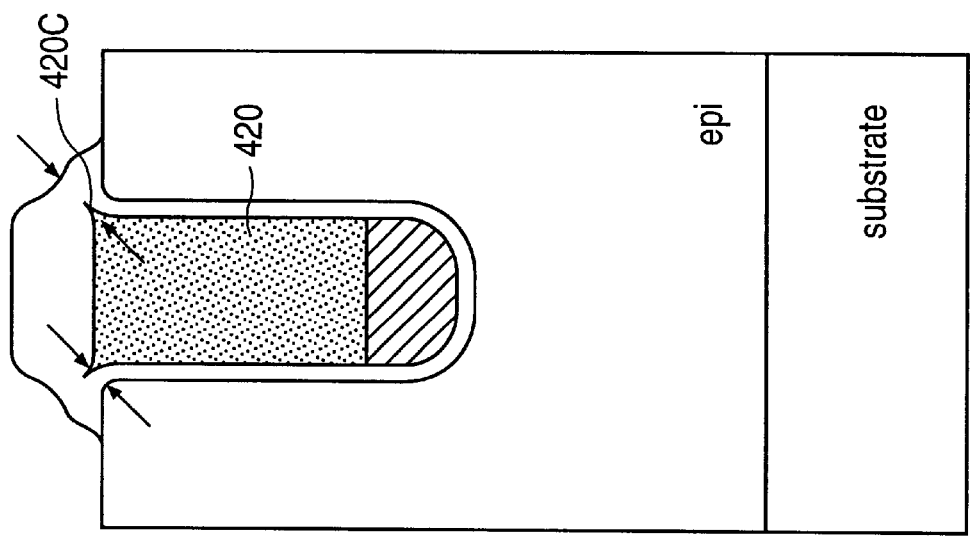
Figure 23B:
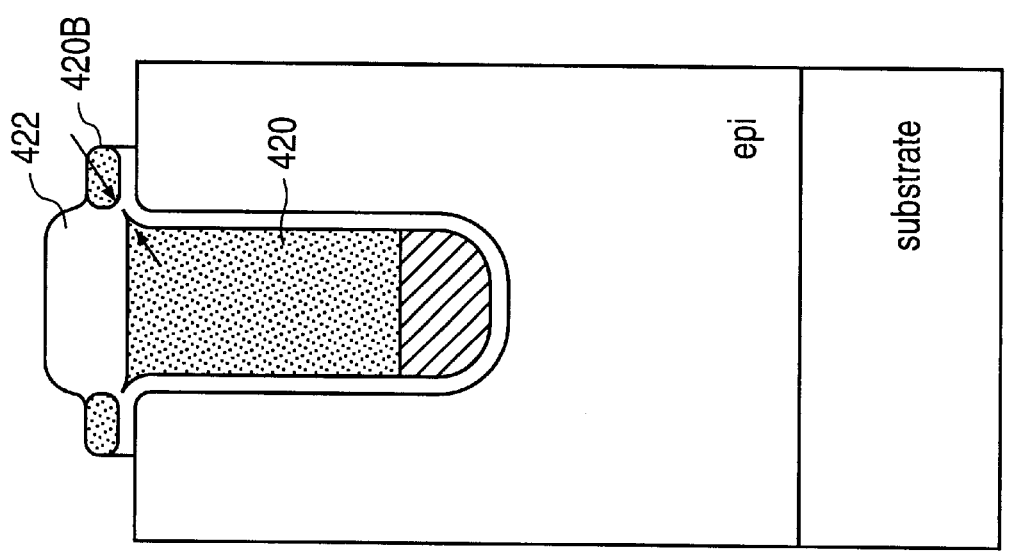

FIG. 23A shows a problem that can result when the polysilicon fills a cavity that is formed under the nitride layer, as shown in FIG. 21E. A portion 420A of polysilicon layer 420 extends outside the trench and will form a short to a metal layer deposited later to contact the epi layer. During oxidation, the oxide 422 does not consume the silicon filling under the nitride overhang. Removal of the nitride exposes the gate to a source metal short. FIG. 23B shows a variation in which the portion 420B is separated by oxide from the main polysilicon layer 420. FIG. 23C illustrates a case in which polysilicon layer 420 has formed upward projecting spikes 420C, creating the likelihood of a short between the gate polysilicon layer 420 and a later deposited metal layer. Again, the polysilicon filling under the nitride remains after oxidation leaving a possible gate-to-source short.

Figure 23E:
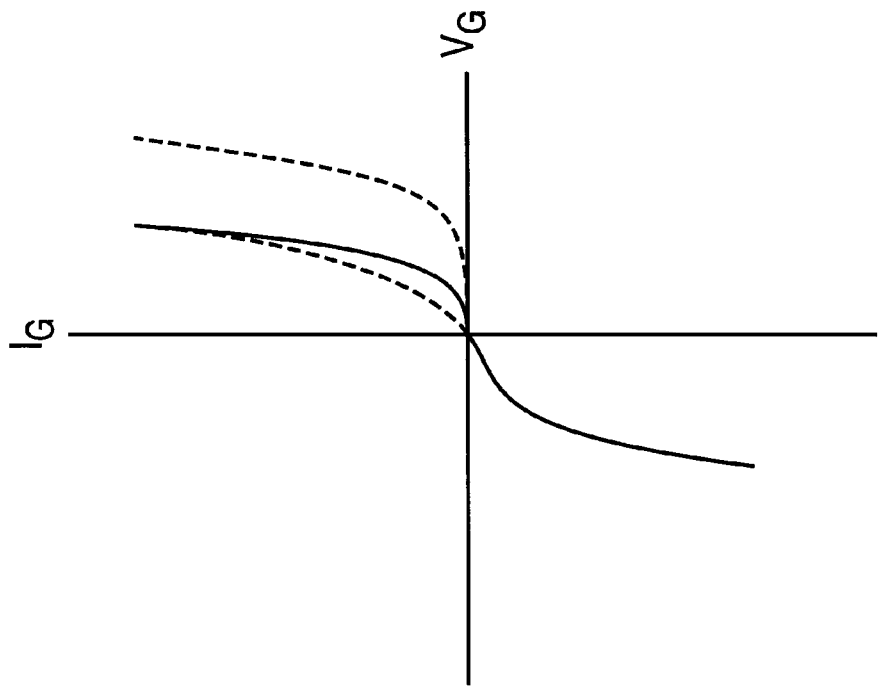
Figure 23D:
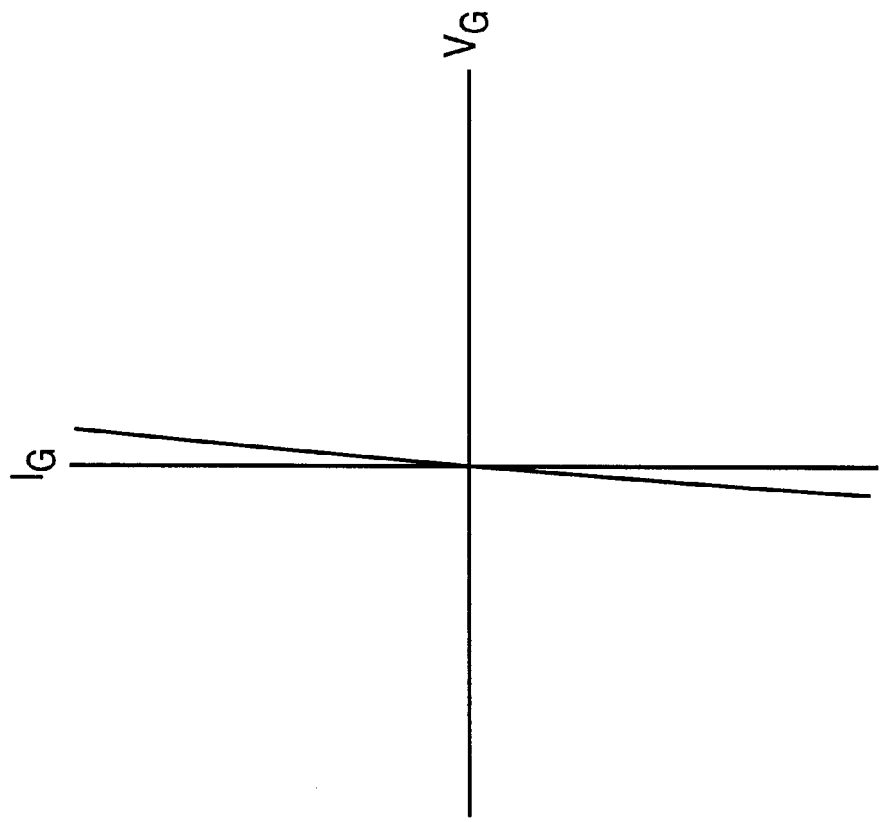
Figure 23F:
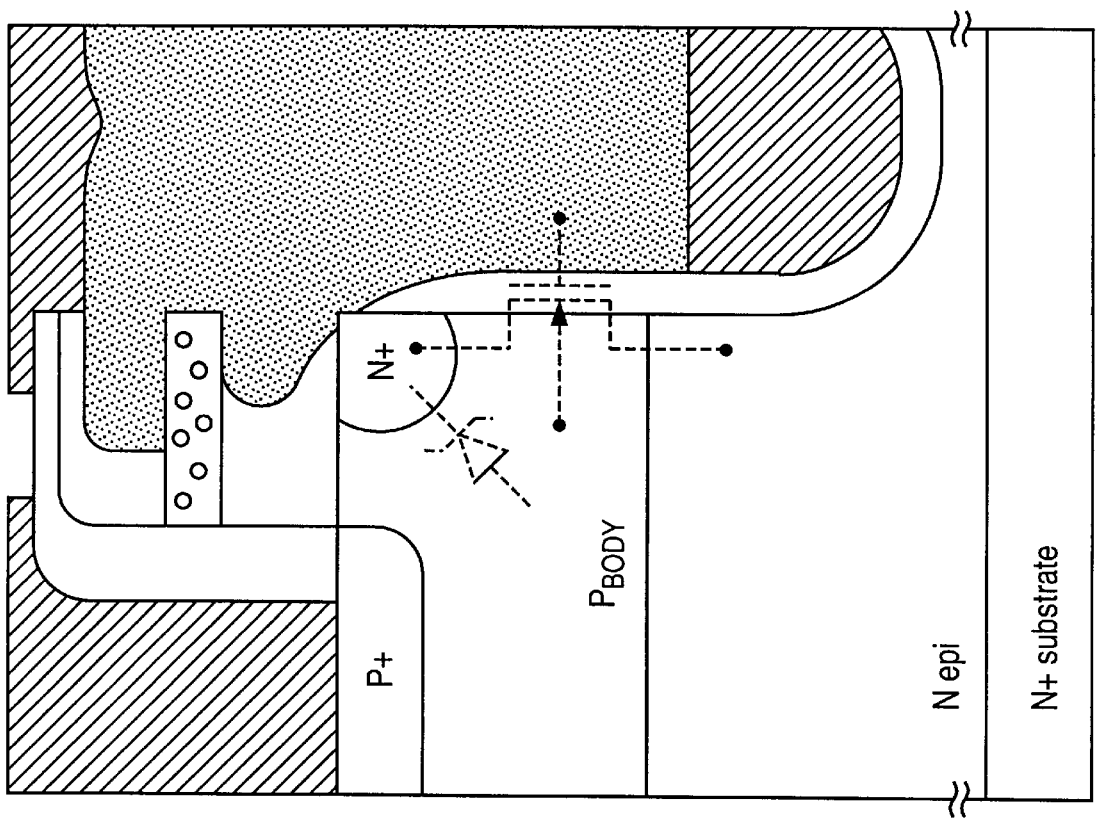
Figure 23G:
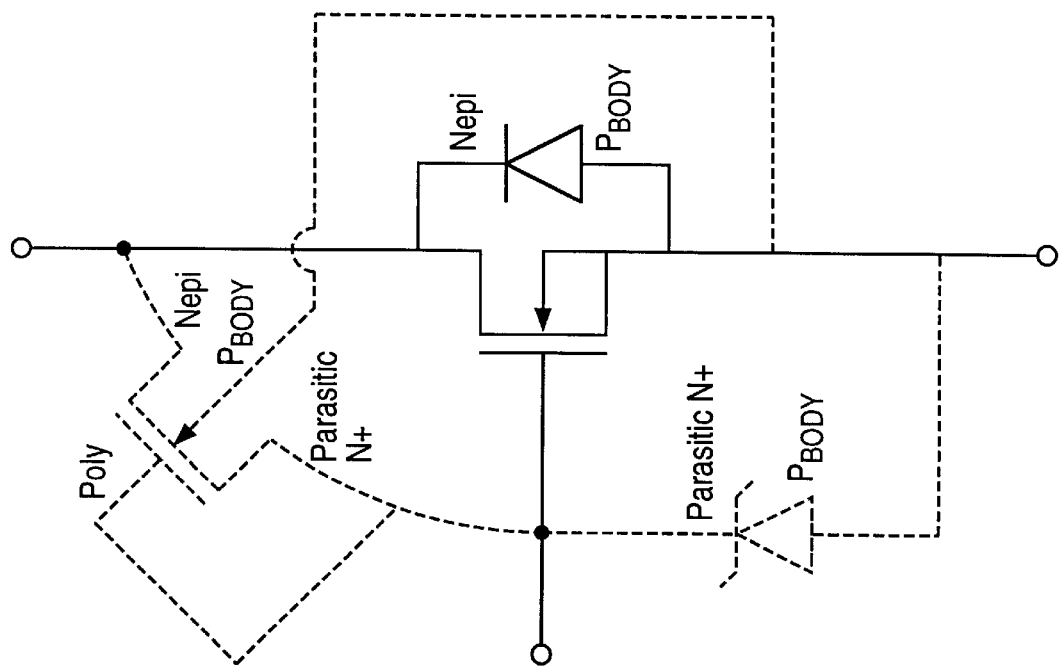

FIG. 23D shows the gate I–V characteristic of a shorted device. The low resistance is referred to as a "hard" short. FIG. 23E shows the characteristics of a "soft" or diode-like short. Unlike the hard short that occurs by a direct contact of metal to the top of the polysilicon gate, the diode-like short can occur within a gate bus region as shown in FIG. 23F. In this type of failure an N+region or plume is doped into the P body wherever the polysilicon touches the silicon mesa, producing a parasitic diode and MOSFET shown schematically in FIG. 23G.

Figure 24B:
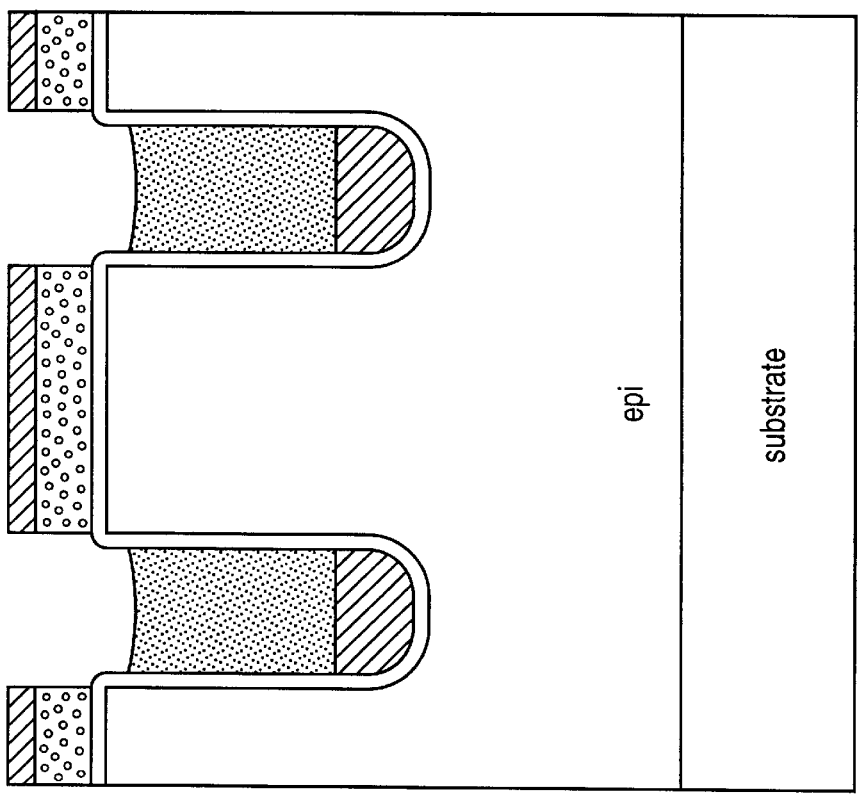
FIGS. 24A–24F illustrate problems that can occur from undercutting a hard mask during the removal of the top oxide in a self-aligned device.
Figure 24A:
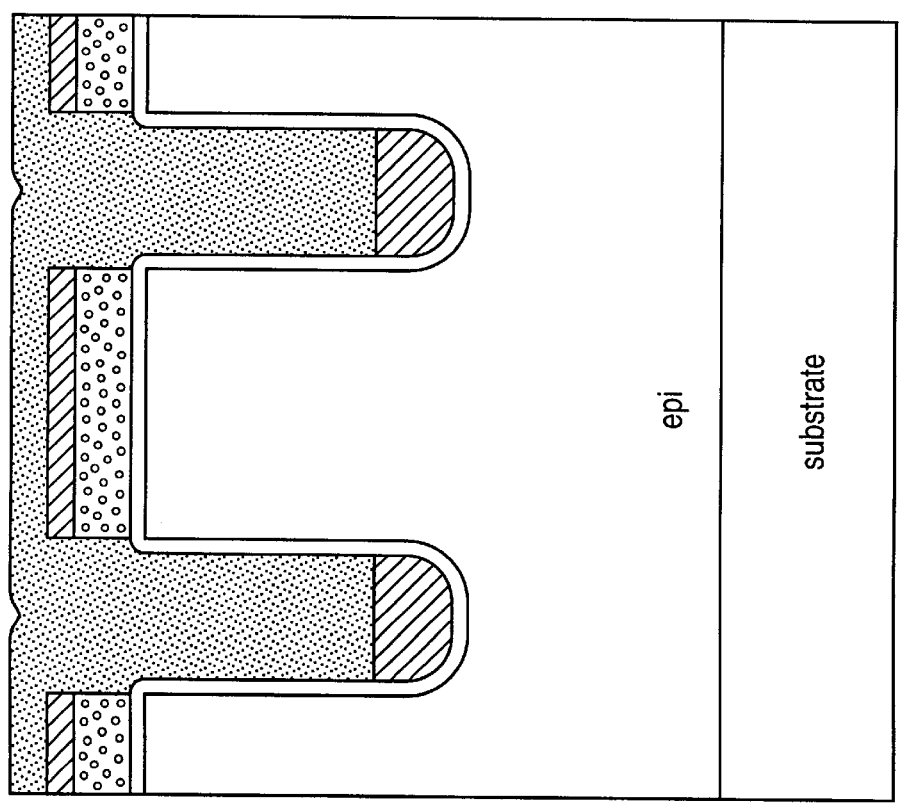
Figure 24D:
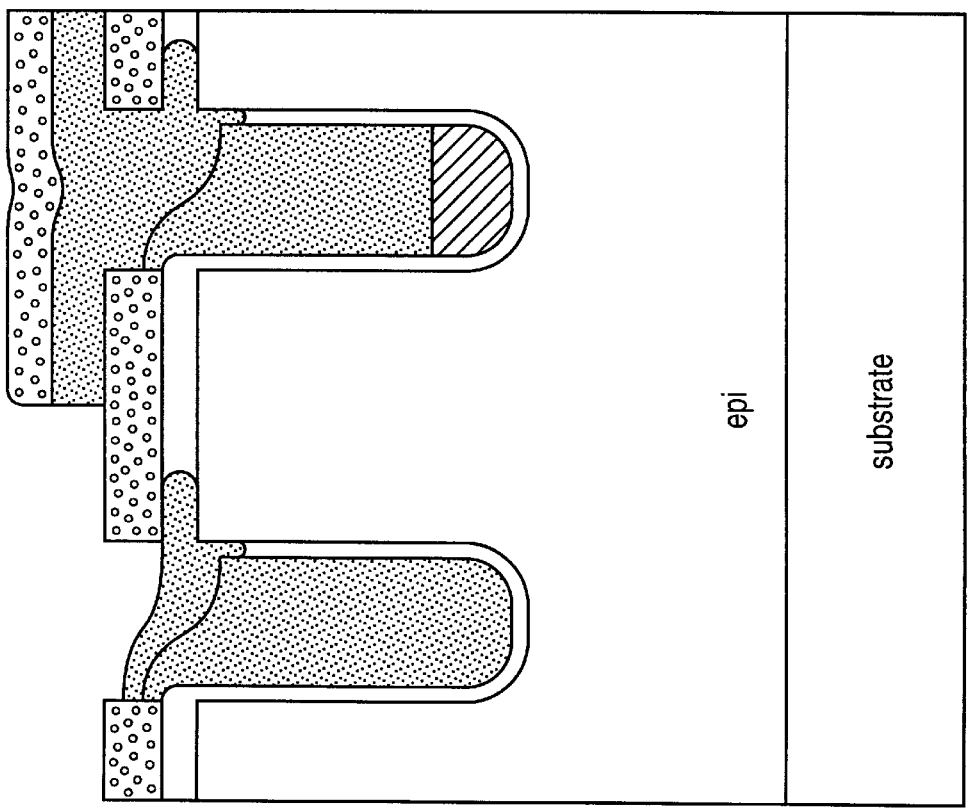
Figure 24C:
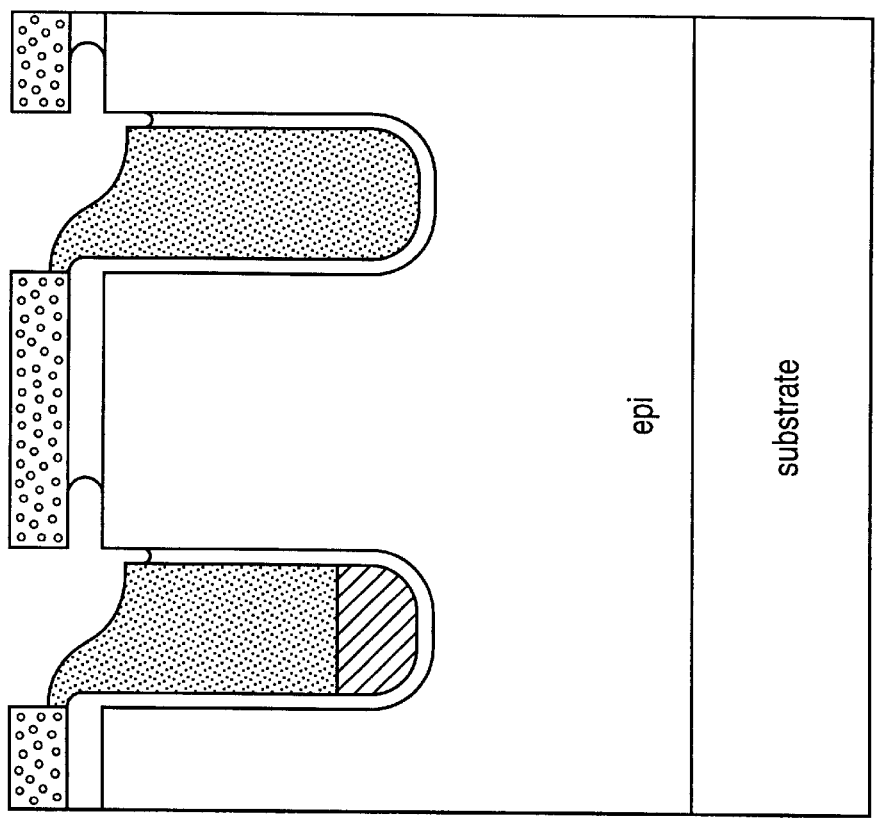
Figure 24F:
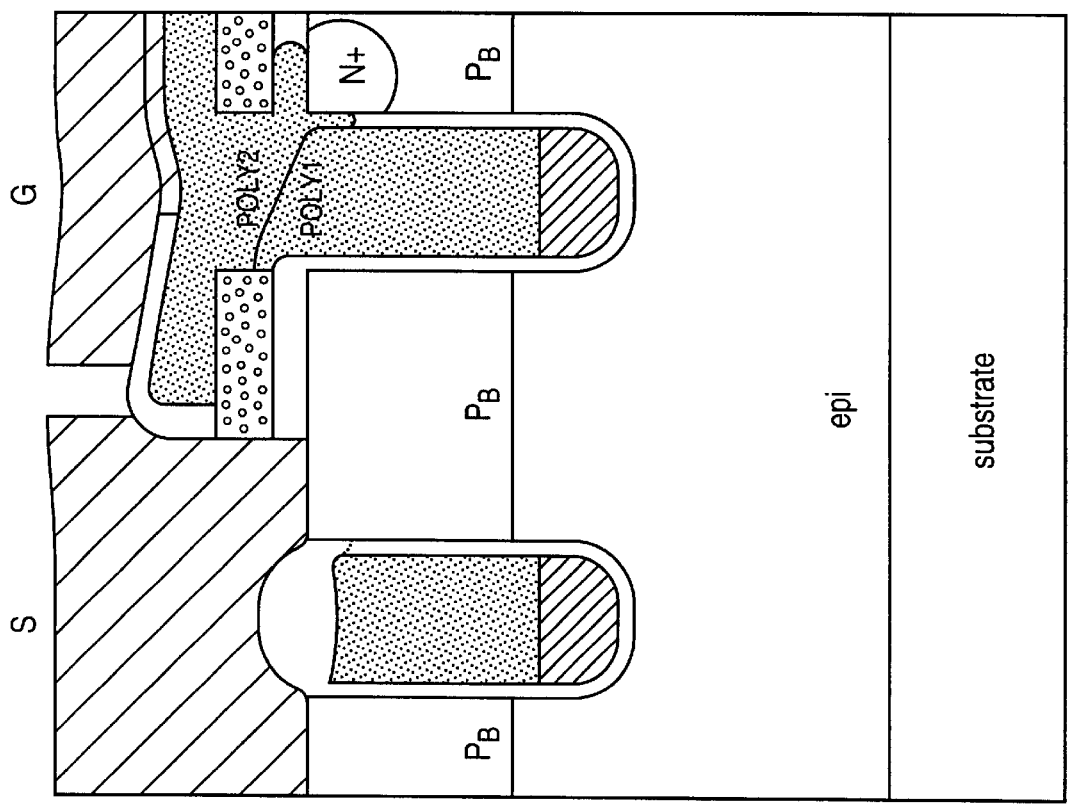
Figure 24E:
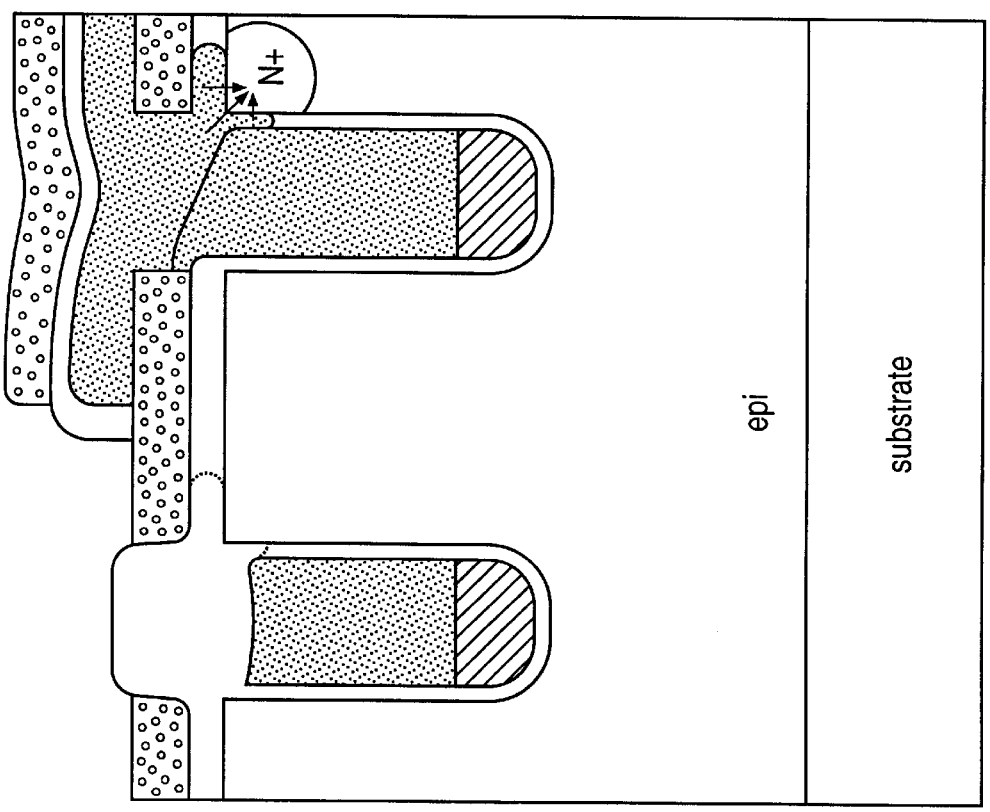

FIGS. 24A–24F illustrate the processing mechanism that causes the diode short as an overetch first polysilicon layer or a misshapen, distorted trench. In FIG. 24A, the active cell and gate bus region are filled with a first layer of N+doped polysilicon and are then etched back to produce the structure shown in FIG. 24B. If the etchback of the polysilicon is nonuniform, one side of the trench oxide may be exposed, as shown in FIG. 24C, which then is attacked and etched during dip which removes the top oxide. In FIG. 24D, the second polysilicon layer is deposited and patterned by a mask, leaving the active cell on the left and the gate bus on the right. After top oxidization, shown in FIG. 24E, the active cell on the left oxidizes and heals itself, but in the gate bus region the polysilicon touching the silicon dopes an N+plume leading to the diode-like gate short of FIG. 24F. Uniform etchback of the polysilicon and unifornly shaped trenches avoid this problem.

Figure 25B:
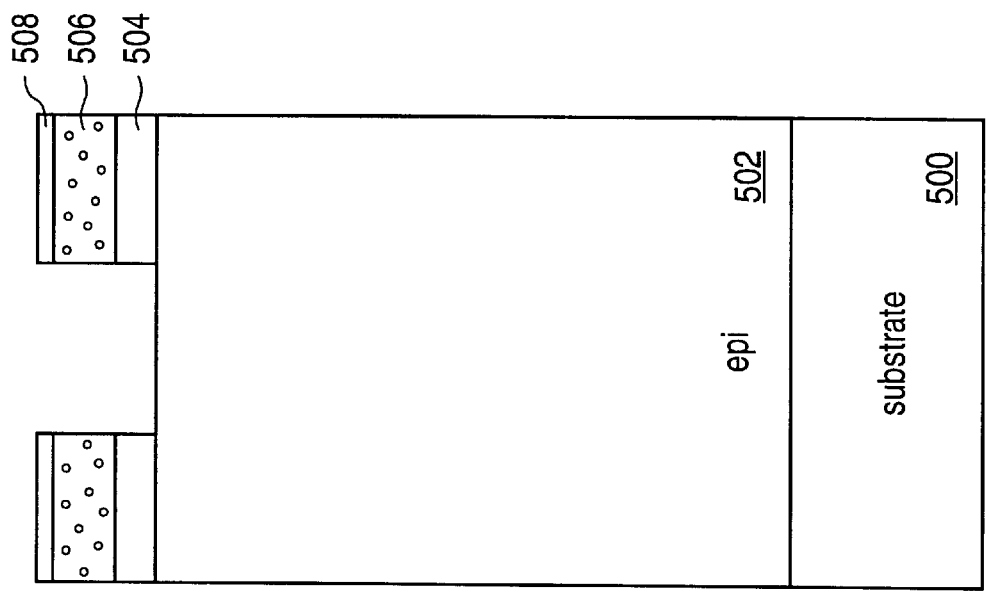
Figure 25A:
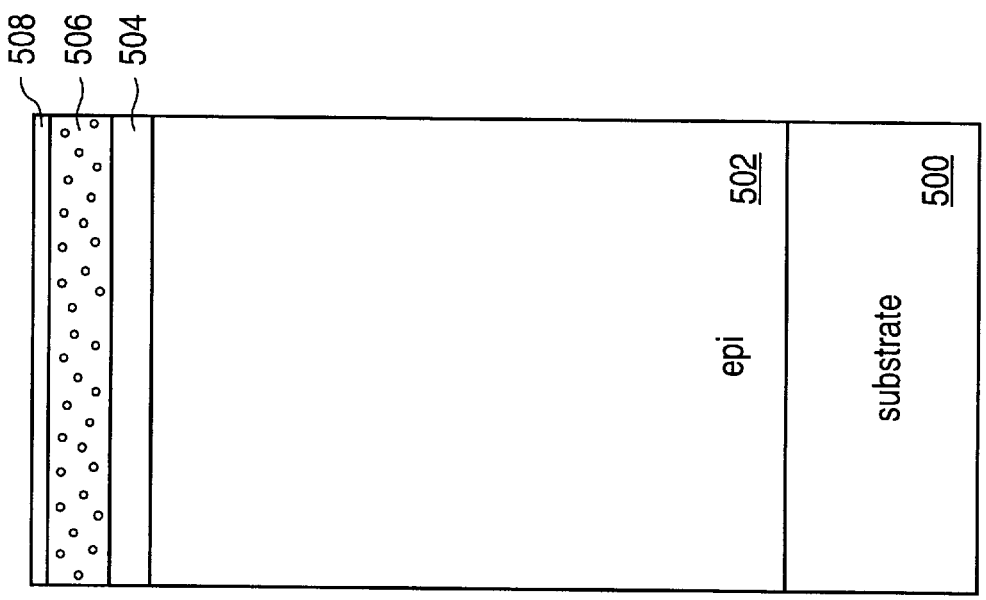

FIGS. 25A–25H describe a process for avoiding these problems by the use of a nitride sidewall spacer. The process starts with an epi layer 502 that is grown on a substrate 500. A thin oxide layer 504 is grown on the top surface of epi layer 502 and a nitride layer 506 (or some other "hard" layer) and a second oxide layer 508 are formed in succession over oxide layer 504. Thus layers 504, 506 and 508 form an oxide-nitride-oxide (ONO) sandwich, well known in the field. The resulting structure is illustrated in FIG. 25A.

As shown in FIG. 25B, an opening is etched in the ONO sandwich. A nitride layer 510 is then deposited over the top of the structure, yielding the arrangement shown in FIG. 25C. Nitride layer 510 is etched inisotropically. Since the vertical thickness of nitride layer 510 is much greater near the edges of the ONO sandwich, the anisotropic etch leaves sidewall spacers 512 at the exposed edge of oxide layer 504 and nitride layer 506. This structure, following the removal of oxide layer 508 is shown in FIG. 25D.

Figure 25E:
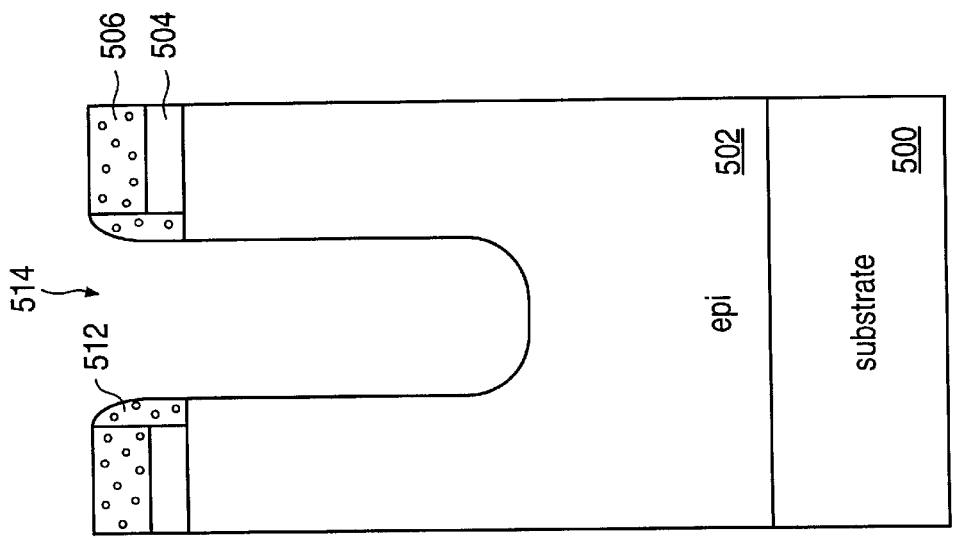
Figure 25D:
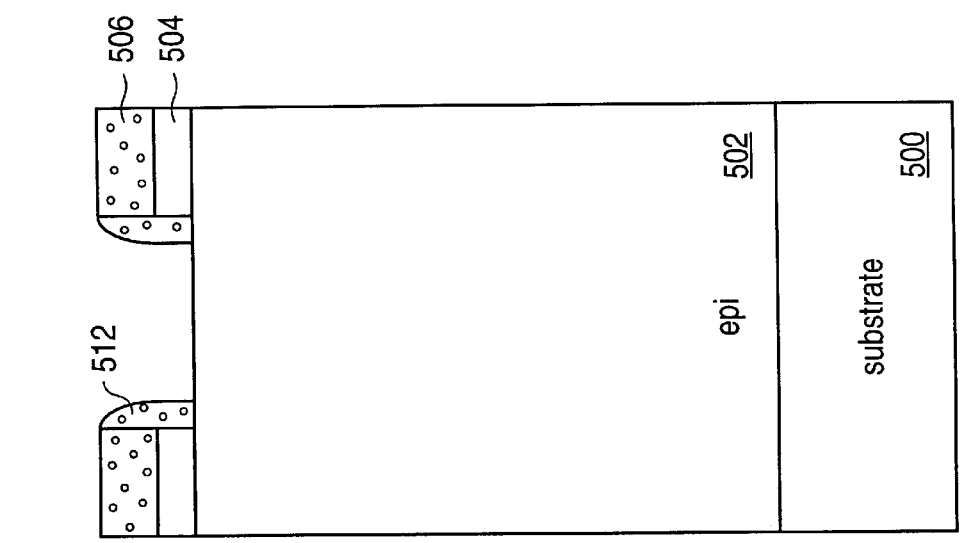
Figure 25C:
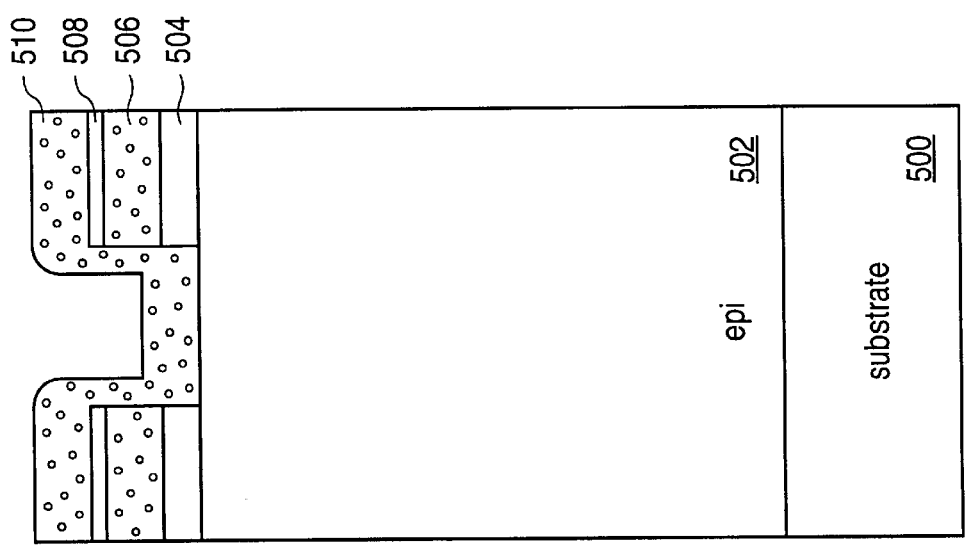

As shown in FIG. 25E, a trench 514 is then etched, and the typical sacrificial gate oxide layer (not shown) is formed and removed. FIG. 25F shows the structure after the directional deposition of an oxide layer 516, which leaves a thick oxide portion 518 at the bottom of the trench 514. This is done after the formation of a gate oxide layer 520. The trench is then filled with a polysilicon layer 522, which is etched back, taking care not to attack the underlying oxide layer 520. The top region where the polysilicon and silicon nearly touch will be oxidized further later in the process. Also, some oxide will grow under the nitride sidewall cap, like a "bird's beak". This structure is shown in FIG. 25G. Oxide layer 516 is then removed, producing the embodiment shown in FIG. 25H.

Figure 26B:
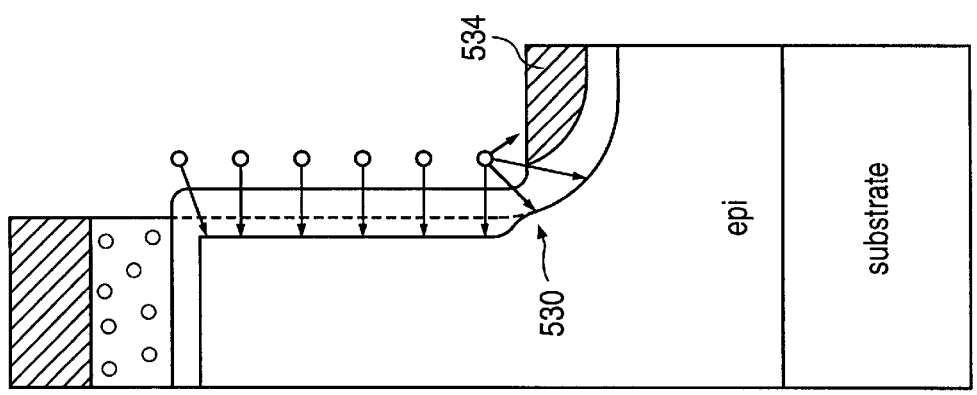
FIGS. 26A and 26B illustrate a problem that can occur during the formation of the gate oxide layer in a thick bottom oxide device.
Figure 26A:
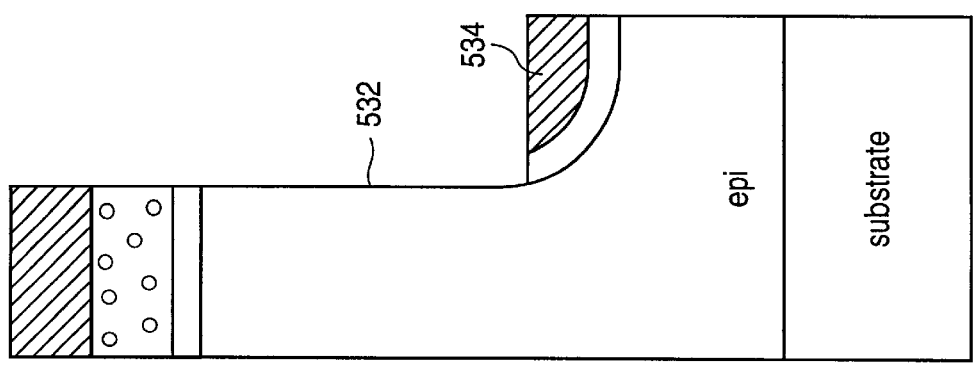

As shown in FIGS. 26A and 26B, growing the gate oxide on the sidewalls of the trench can lead to a "kink" in the sidewall of the trench, shown as kink 530 in FIG. 26B. The problem is that, as shown in FIG. 26A, the oxide grows uniformly on the exposed sidewall 532 of the trench. However, where the thick oxide 534 begins at the bottom of the trench, owing to the geometry of the structure, the oxidation does not proceed in a linear fashion. This creates a reduced thickness of the oxide layer at kink 530.

Figure 27C:
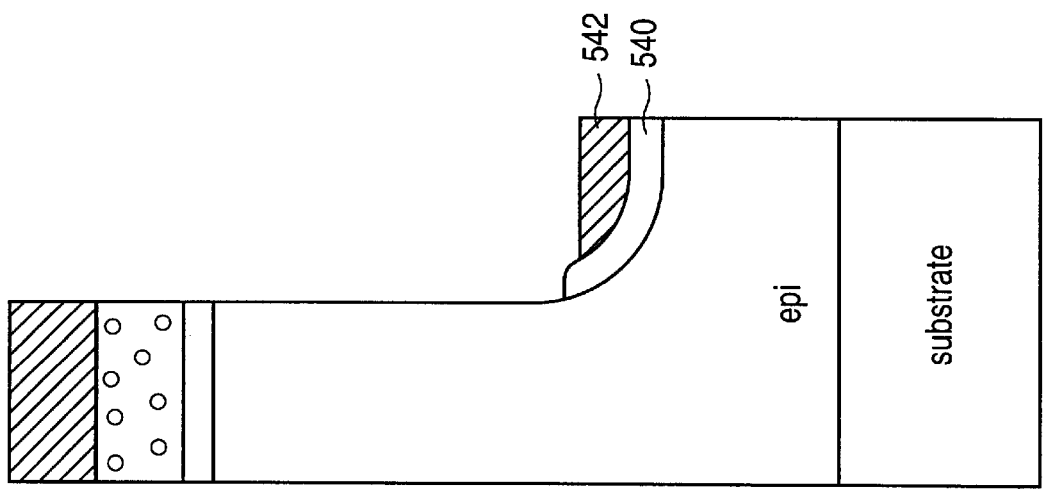
FIGS. 27A–27D illustrate a method of avoiding the problem illustrated in FIGS. 26A and 26B.
Figure 27B:
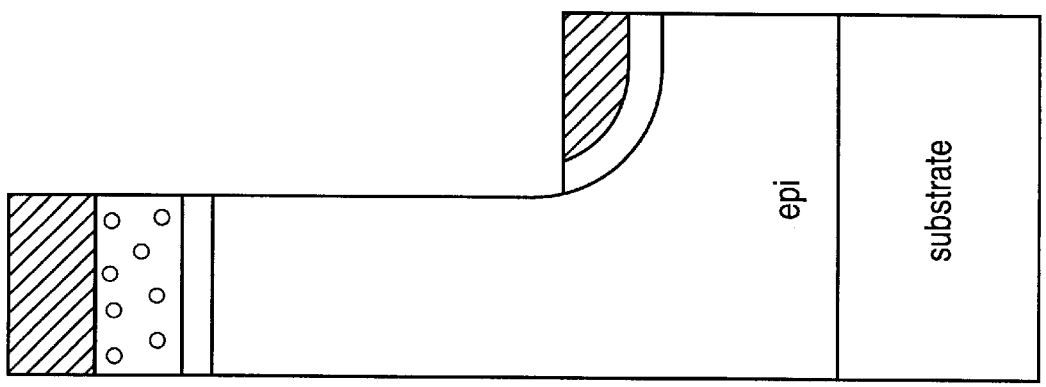
Figure 27A:
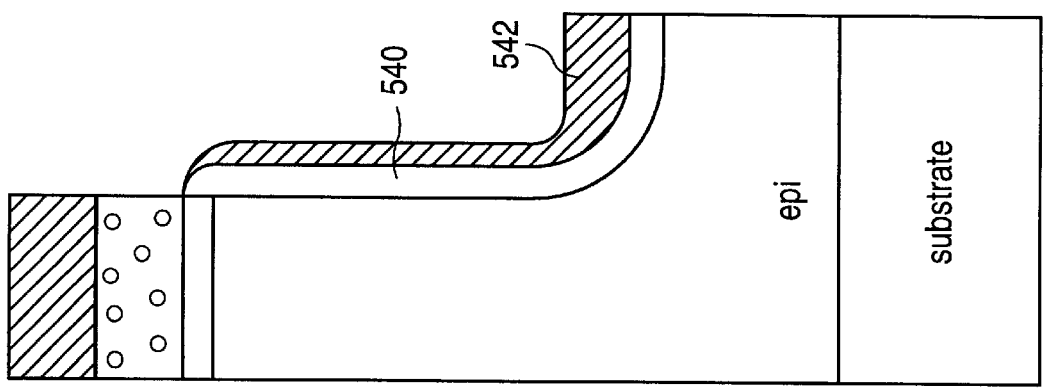
Figure 27D:
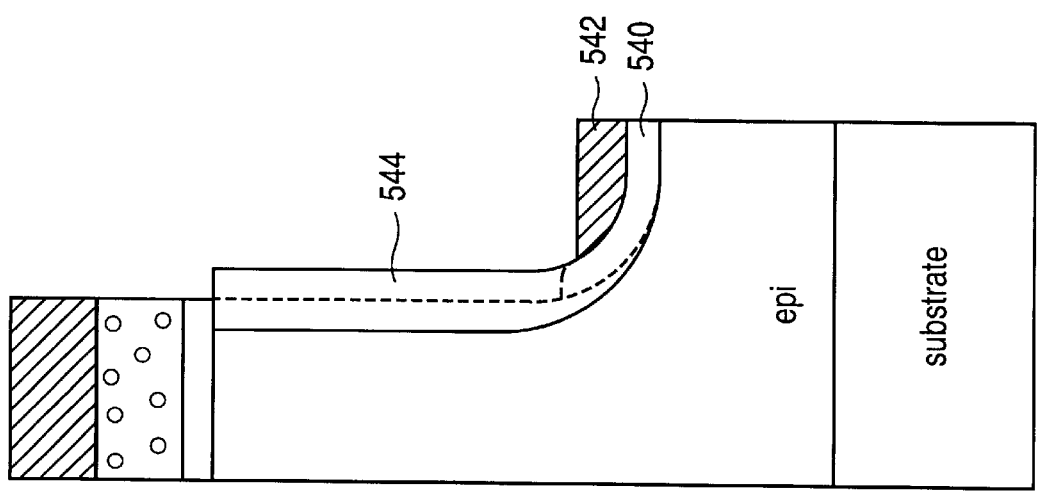

A solution to this problem is illustrated in FIGS. 27A–27D. FIG. 27A shows the structure after the thermal growth of an oxide lining 540 and the directional deposition of an oxide layer 542, as described above. Lining 540 and layer 542 are removed from the sidewall of the trench as shown in FIG. 27B. The structure is then dipped in 170 HF acid. Since oxide deposited by deposition etches faster than thermally grown oxide, the structure appears as in FIG. 27C following the dip, with the top surface of lining 540 being slightly above the top surface of the oxide layer 542. When the gate oxide layer is thermally grown on the sidewalls of the trench, the resulting oxide is of a relatively uniform thickness. There is no "kink" in the wall of the trench. FIG. 27D shows the arrangement after a gate oxide layer 544 has been grown on the sidewall of the trench. The dotted line indicates the original position of the silicon prior to oxidation.

FIGS. 28–33 illustrate various devices that can be fabricated using the principles of this invention.

Figure 28:
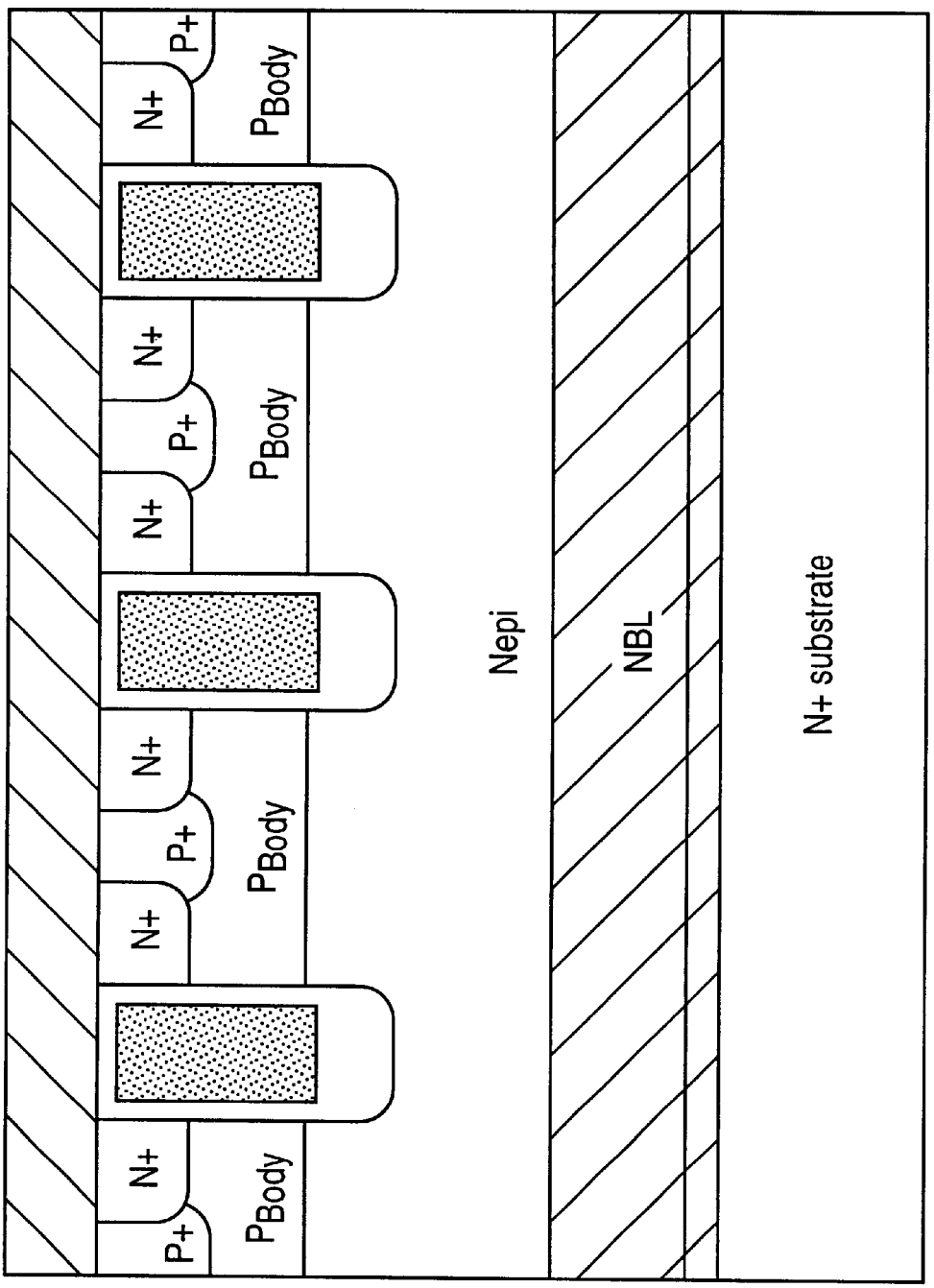
FIGS. 28–33 illustrate different types of trench power MOSFETs that can be fabricated in accordance with this invention.
Figure 29:
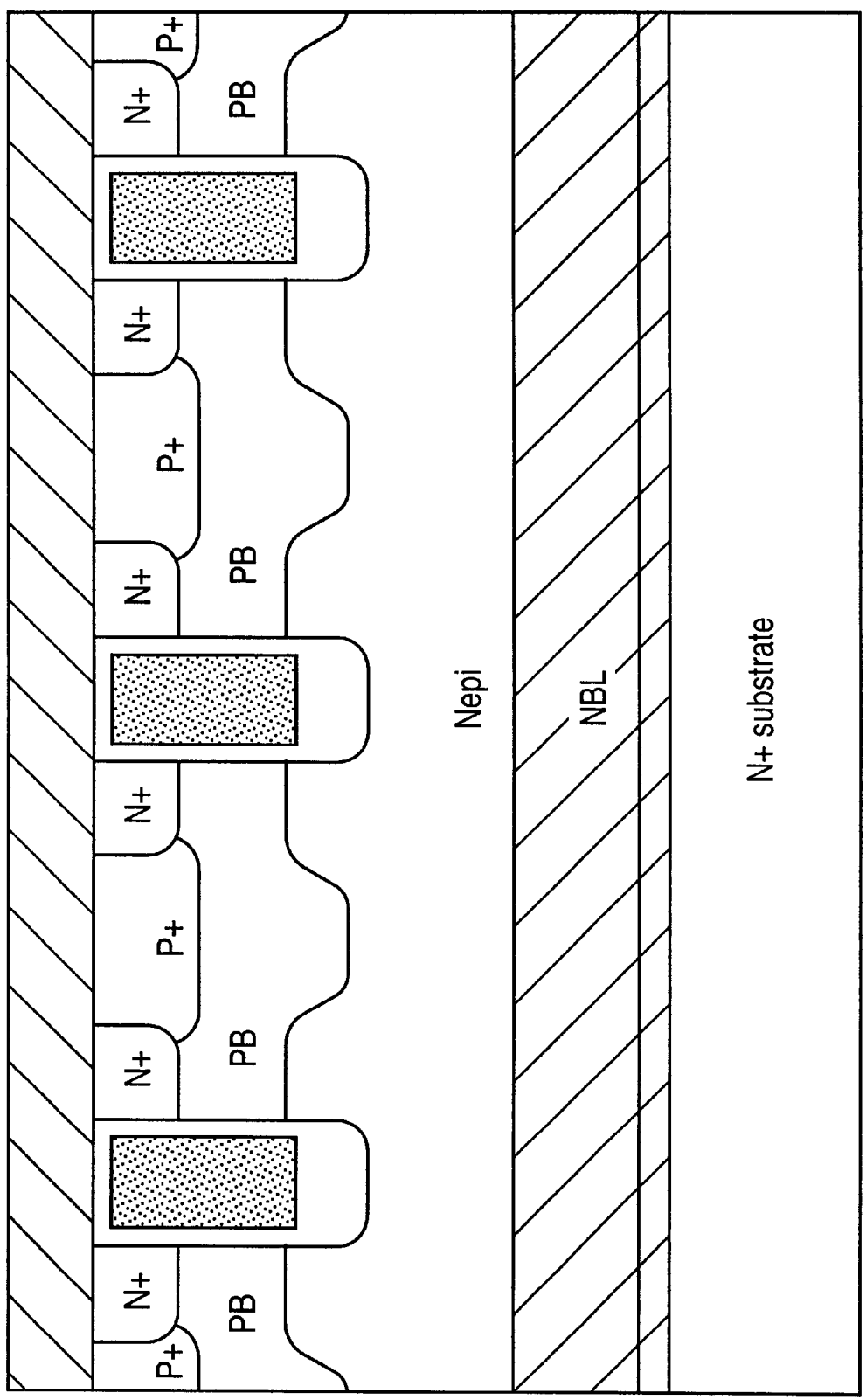
Figure 30:
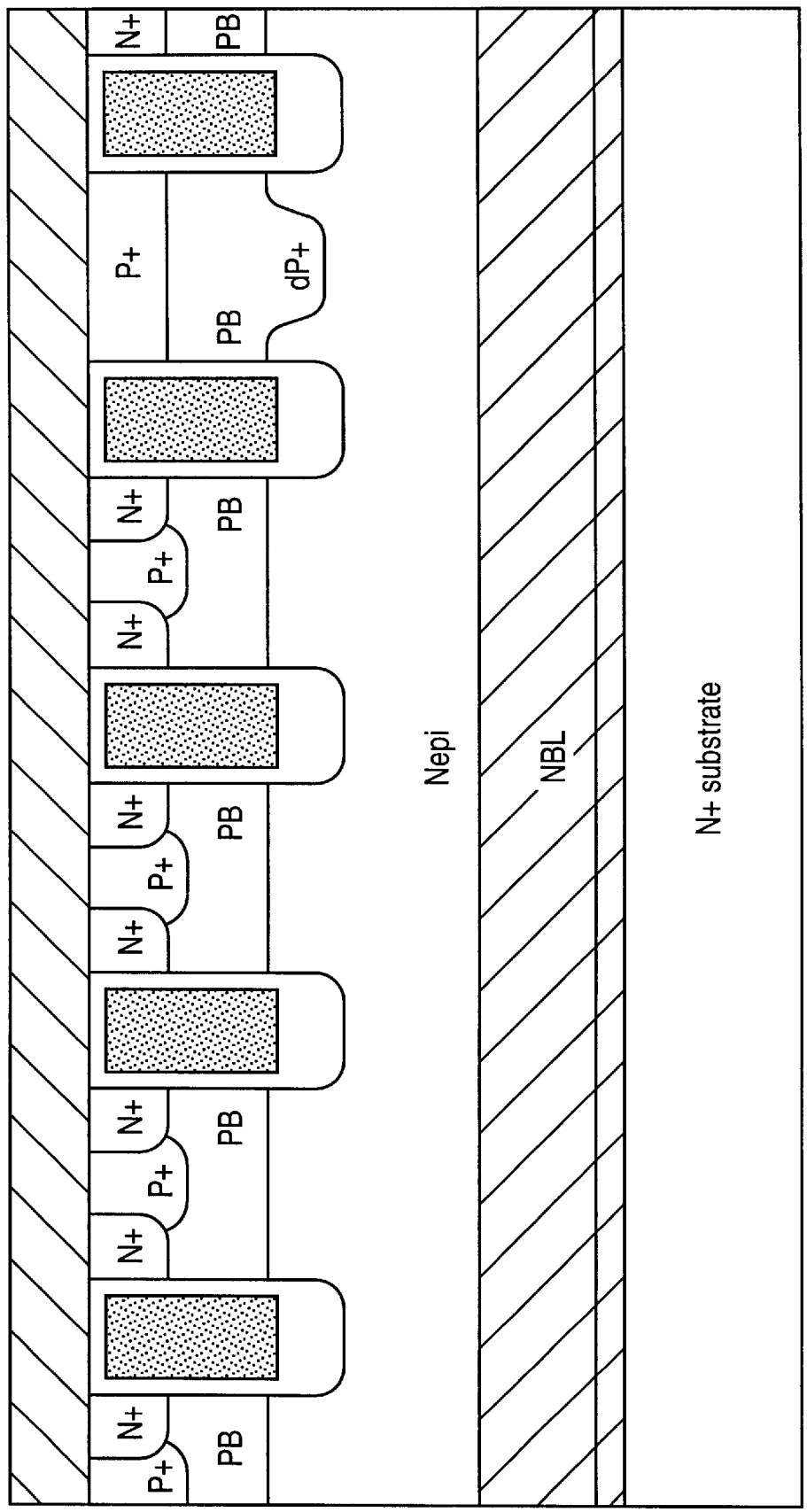

FIG. 28 shows a power MOSFET having a flat-bottomed P–body region and an N buried layer at the interface between the epi layer and substrate. FIG. 28 illustrates a device combining the thick trench bottom oxide with a contact that extends entirely across the mesa between trenches although a contact mask and nonplanar top oxide layer could be utilized. FIG. 29 shows a MOSFET that is similar to the one shown in FIG. 28 except that each MOSFET cell contains a deep P+region, in accordance with the teachings of U.S. Pat. No. 5,072,266 to Bulucea et al. The embodiment of FIG. 30 has a flat-bottomecl P–body region in the MOSFET cells as well as a diode cell containing a deep P+region which is used to voltage-clamp the MOSFET cells. This type of arrangement is taught in application Ser. No. 08/846,688, incorporated herein by reference.

Figure 31:
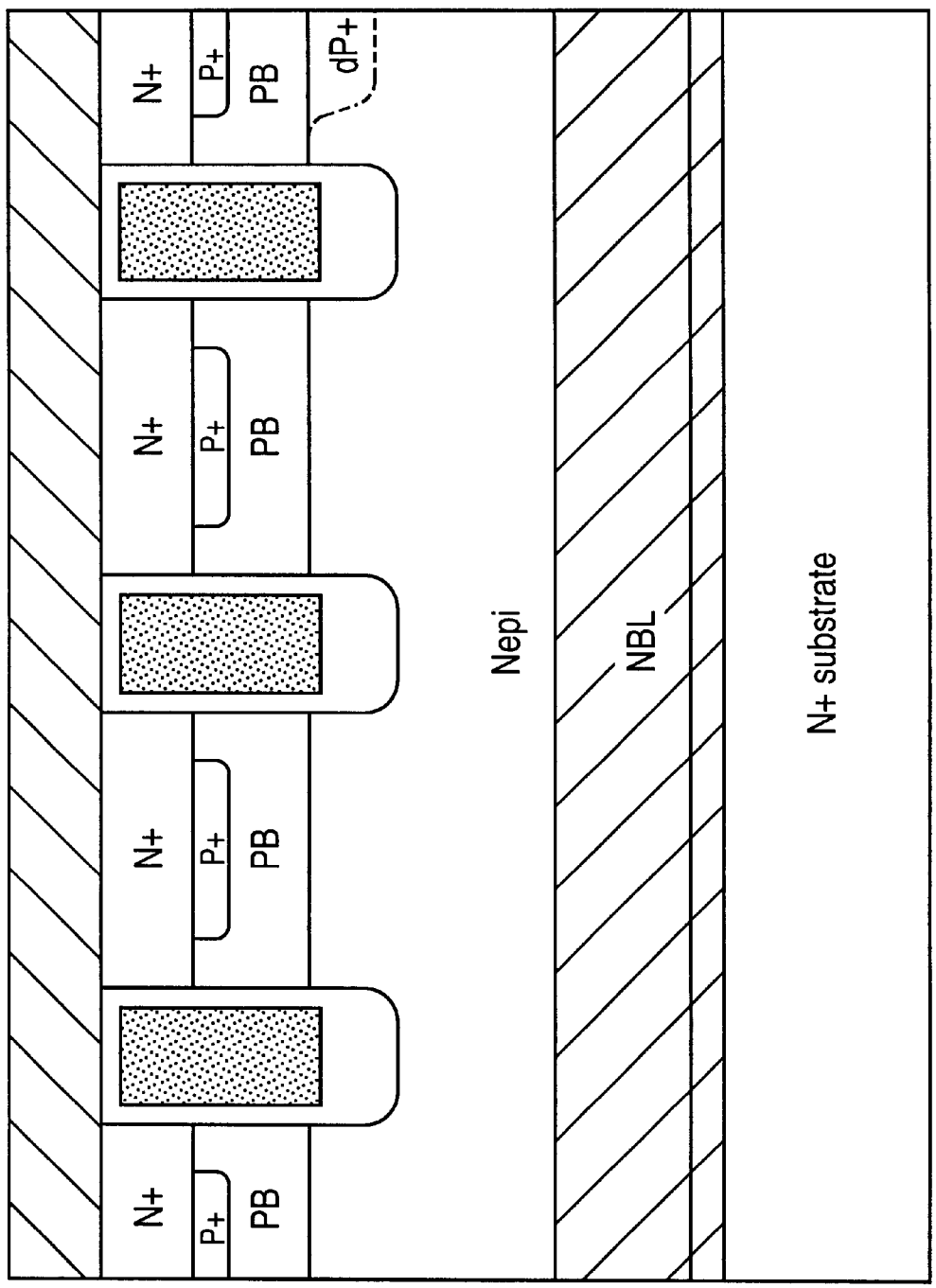

In the device shown in FIG. 31 there is no contact between the P-body region and the overlying metal layer in the individual MOSFET cells. Instead, the body is contacted in the third dimension, as taught in U.S. Pat. No. 5,877,538 to Williams et al., which is incorporated herein by reference. Note that one of the MOSFET cells contains a deep P+ region to limit the strength of the electric field at the bottoms of the trenches. Again, the planarized top oxide layer using a self-aligned contact is preferred but not required.

Figure 32:
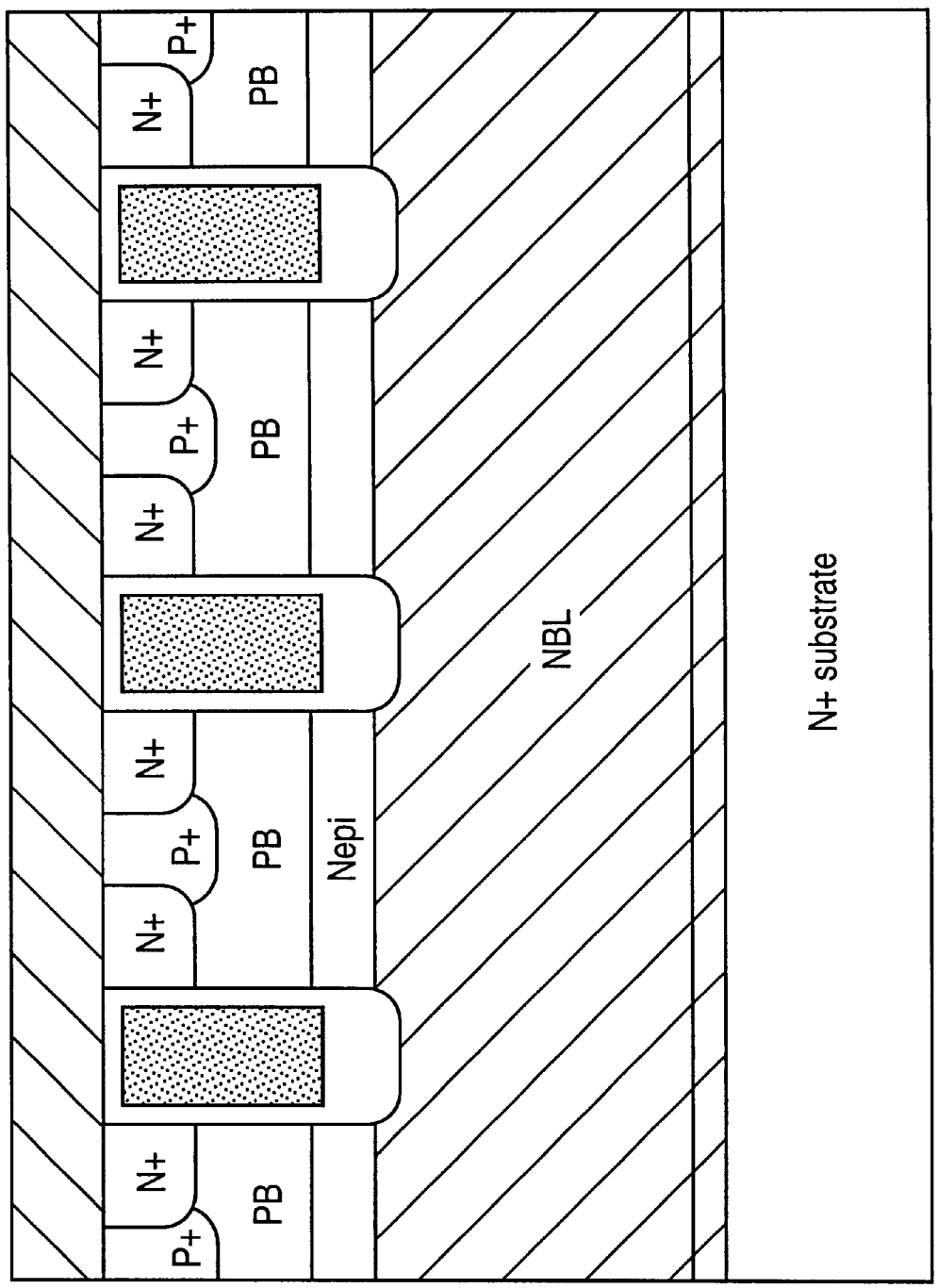

In the embodiment of FIG. 32 the trenches extend in to the N-buried layer so that only the thick oxide regoon overlaps the heavily doped buried layer.

Figure 33:
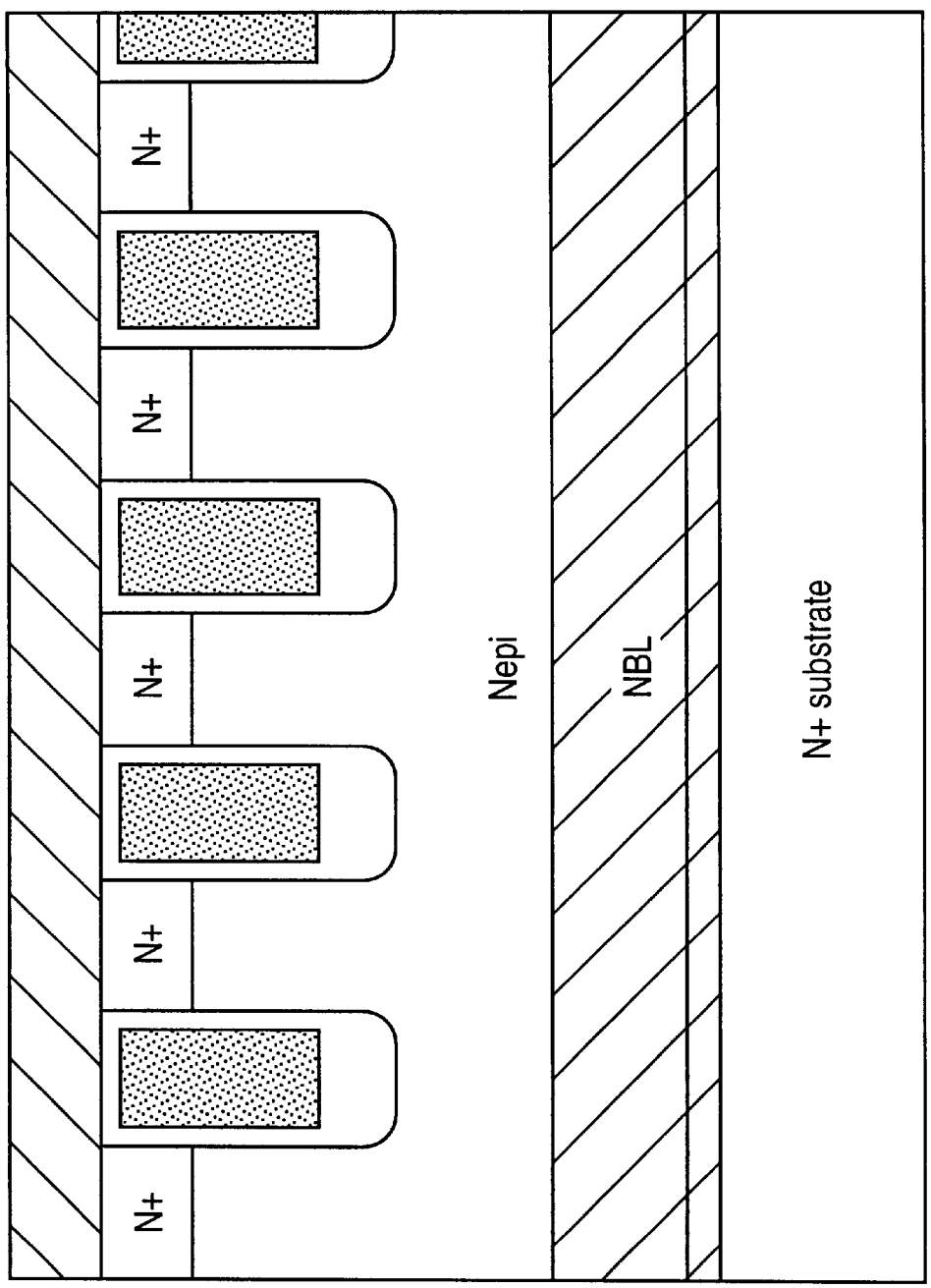

The embodiment of FIG. 33 is an accumulation mode MOSFET (ACCUFET), such as the one taught in U.S. Pat. No. 5,856,692 to Williams et al., which is incorporated herein by reference.

Figure 34:
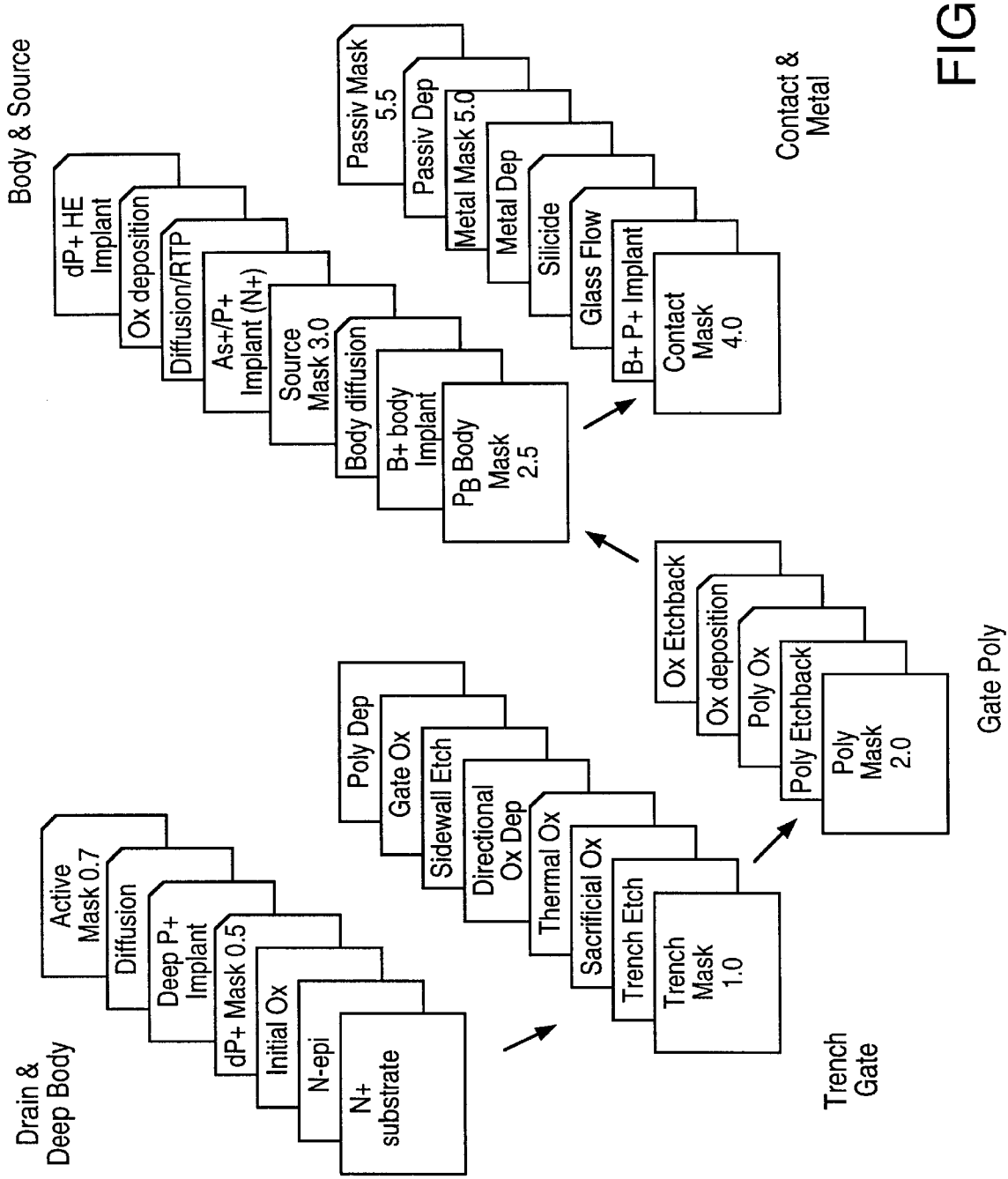
FIG. 34 illustrates a flow diagram of a process sequence of fabricating a trench power MOSFET using a conventional contact mask and incorporating a thick bottom oxide layer.

FIG. 34 is a conceptual drawing showing a process flow for a trench MOSFET using a conventional contact mask and incorporating a thick trench bottom oxide. The steps of the process generally include the formation of the drain and deep P+ regions, the etching of the trench and formation of the gate, the implantation of the body and source regions, and the opening of contacts and deposition of a metal layer. In FIG. 34 the boxes with the corners clipped represent optional steps. Thus, the introduction of a deeper body region by implant or by implant and diffusion is consistent with this process.

Figure 35G:
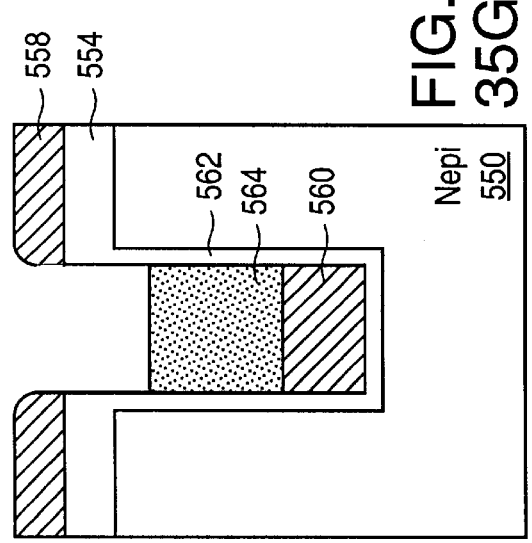

This process is illustrated in FIGS. 35A–35L. A trench 552 is formed in an N epi layer 550, using an oxide layer 554 as a mask. An oxide lining 556 is formed on the walls of the trench 552 (FIG. 35B), and a directional oxide deposition is carried out as described above, forming an oxide layer 558 having a thick portion 560 at the bottom of the trench (FIG. 35C). The sidewalls of trench 552 are then etched (FIG. 35D), and a gate oxide layer is thermally grown on the walls of trench 552 (FIG. 35E).

Figure 35H:
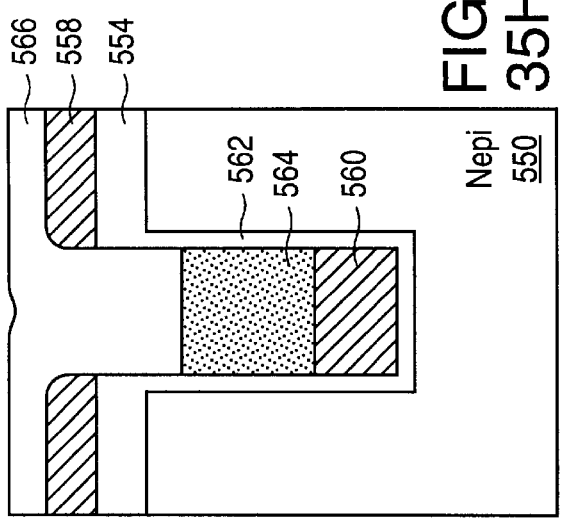
Figure 35I:
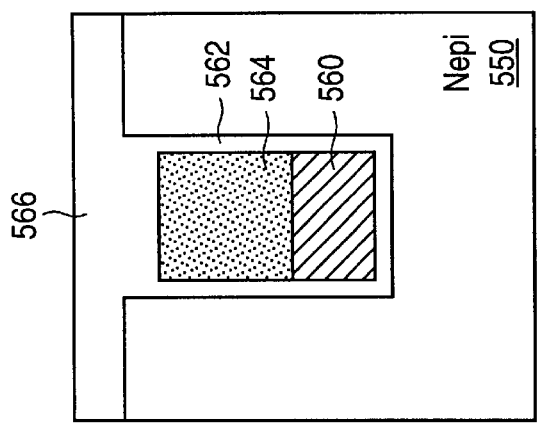
Figure 35J:
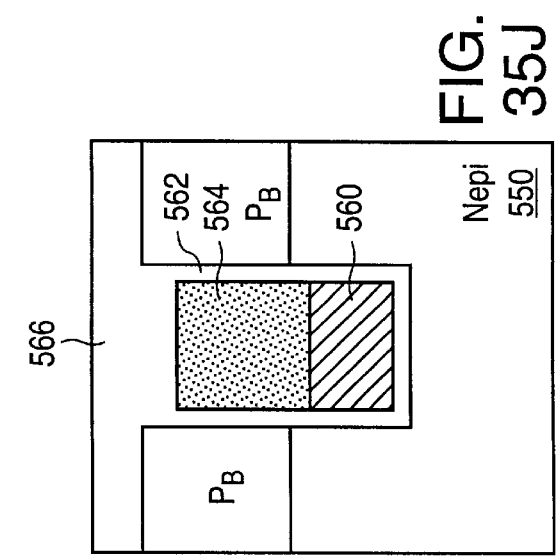
Figure 35K:
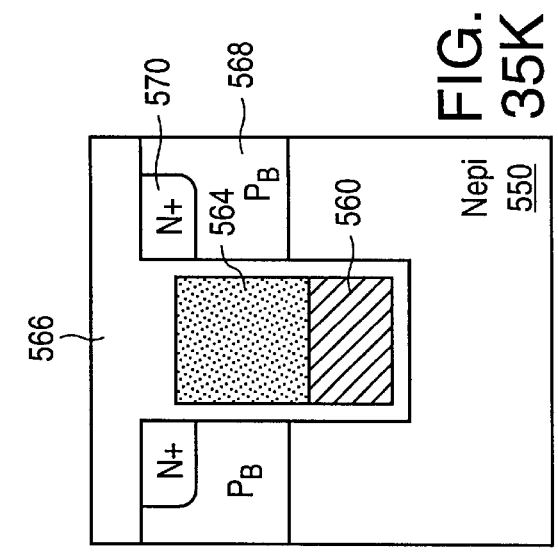
Figure 35L:
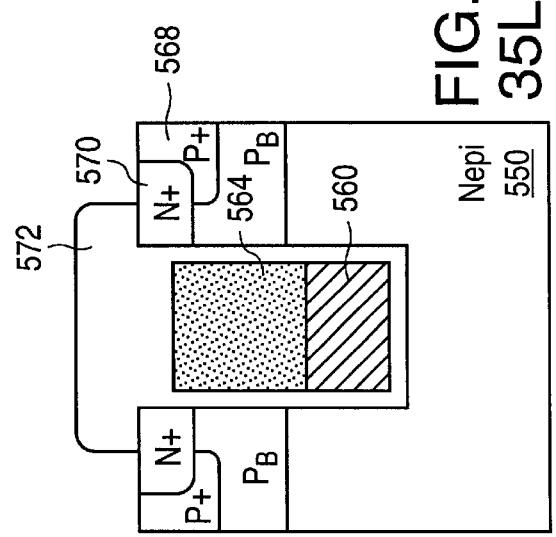

A polysilicon layer 564 is then deposited to fill the trench 552 (FIG. 35F). Polysilicon layer 564 is etched back into the trench (FIG. 35G). An oxide layer 566 is deposited over the top surface of the structure and extends down into the trench to the top surface of polysilicon layer 564 (FIG. 35H). Oxide layer 566 is then etched back (FIG. 35), and a P-type dopant such as boron is implanted to form P body region 568. The top surface is then masked (not shown), and an N-type dopant such as arsenic or phosphorus is implanted to form N+source regions 570. Another oxide layer 572 is deposited on the top surface and patterned, yielding the structure shown in FIG. 35L. The contact can then be filled by the top metal or alternatively filled with a planarizing metal such as tungsten first, or with a barrier metal such as Ti/TiN.

FIGS. 36–39 illustrate several embodiments in which the polysilicon gate is "keyhole" shaped in cross-section. The thicker gate oxide extends not only along the bottom of the trench but also along the sidewalls of the trench towards the junction between the P body region and the N epi layer. The thickened gate oxide along the sidewalls of the trench helps to soften the electric field at that junction.

Figure 36:
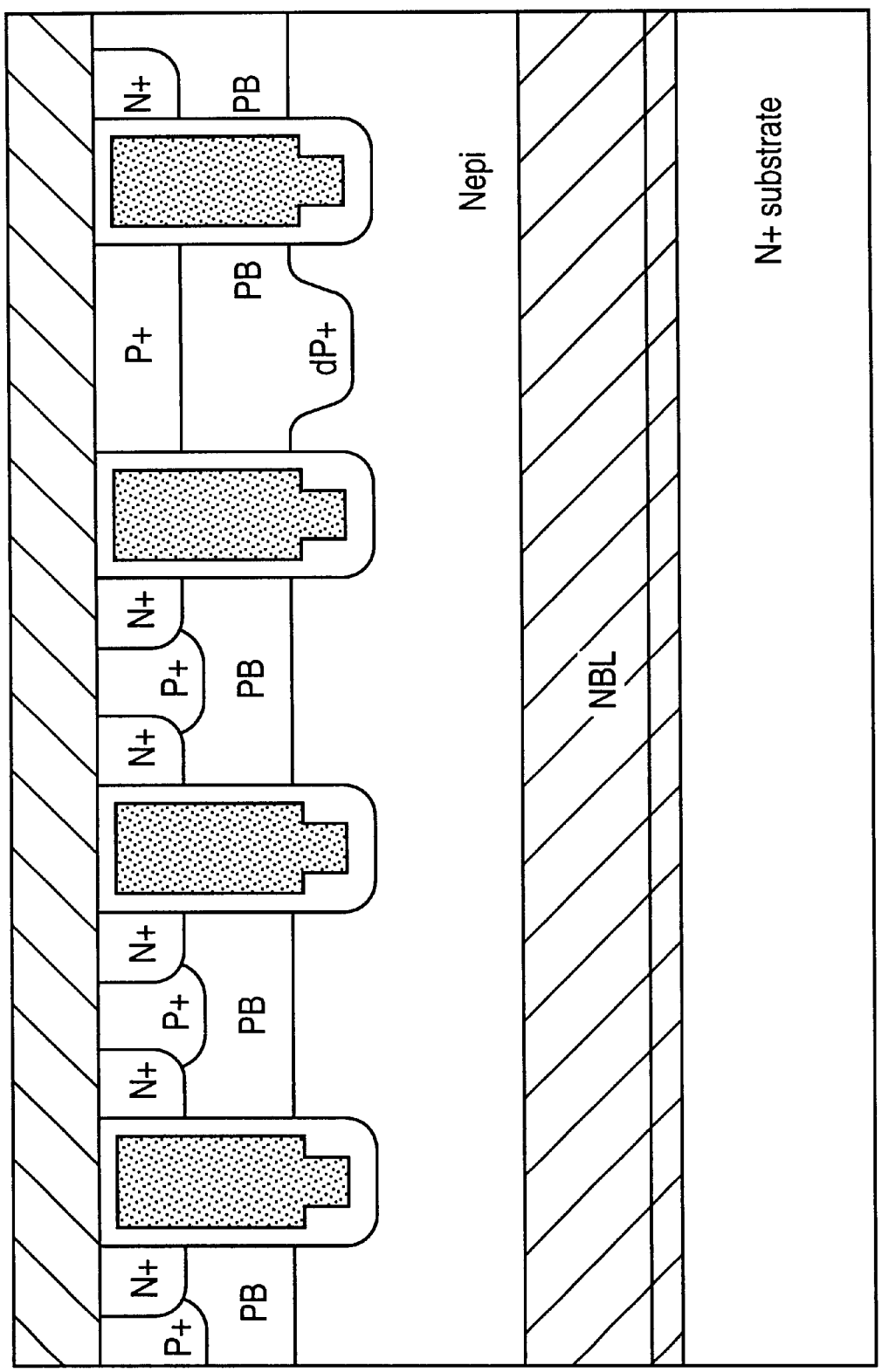
FIGS. 36–39 are cross-sectional views showing trench power MOSFETs having "keyhole" shaped gate electrodes.
Figure 37:
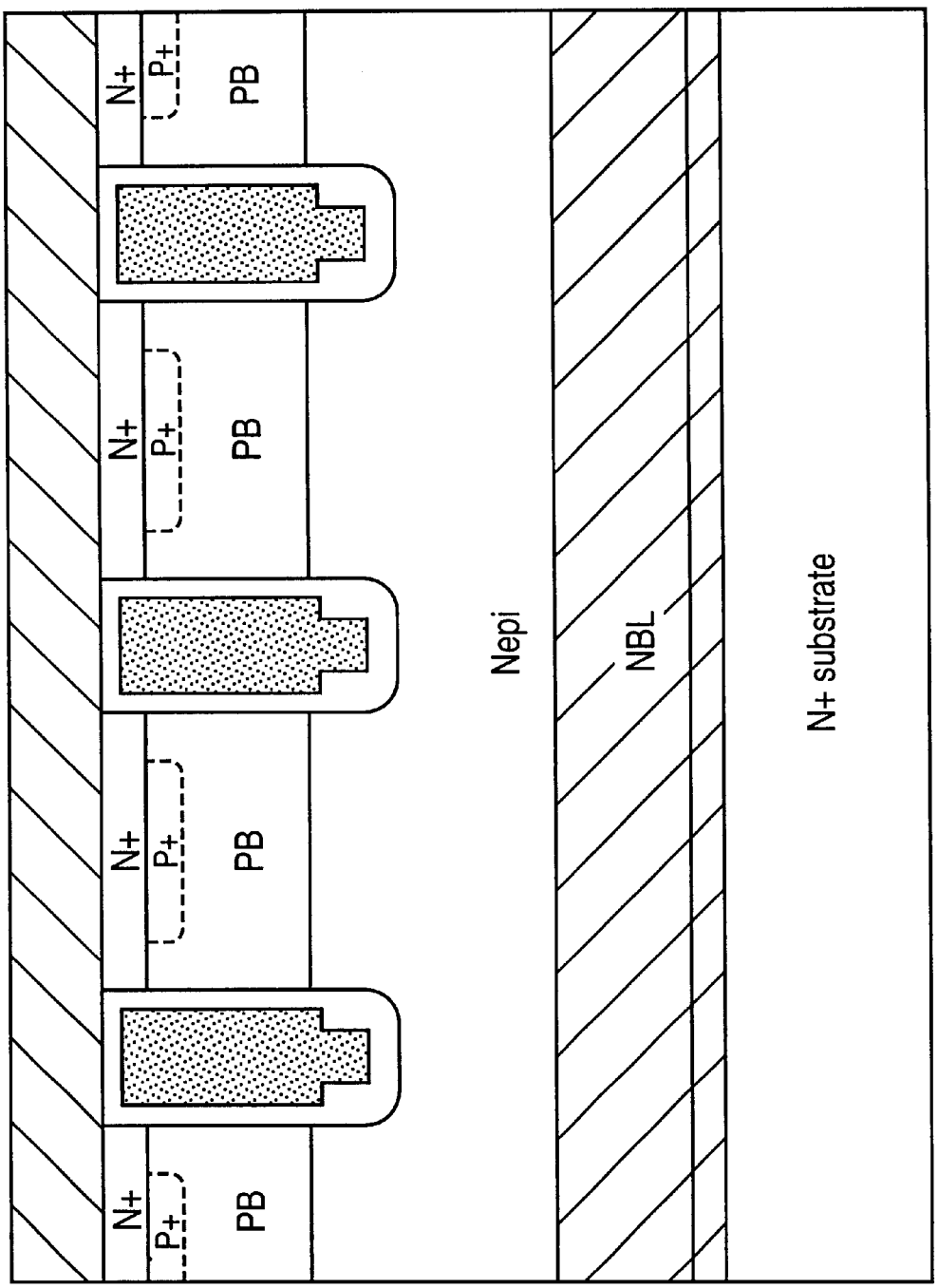
Figure 38:
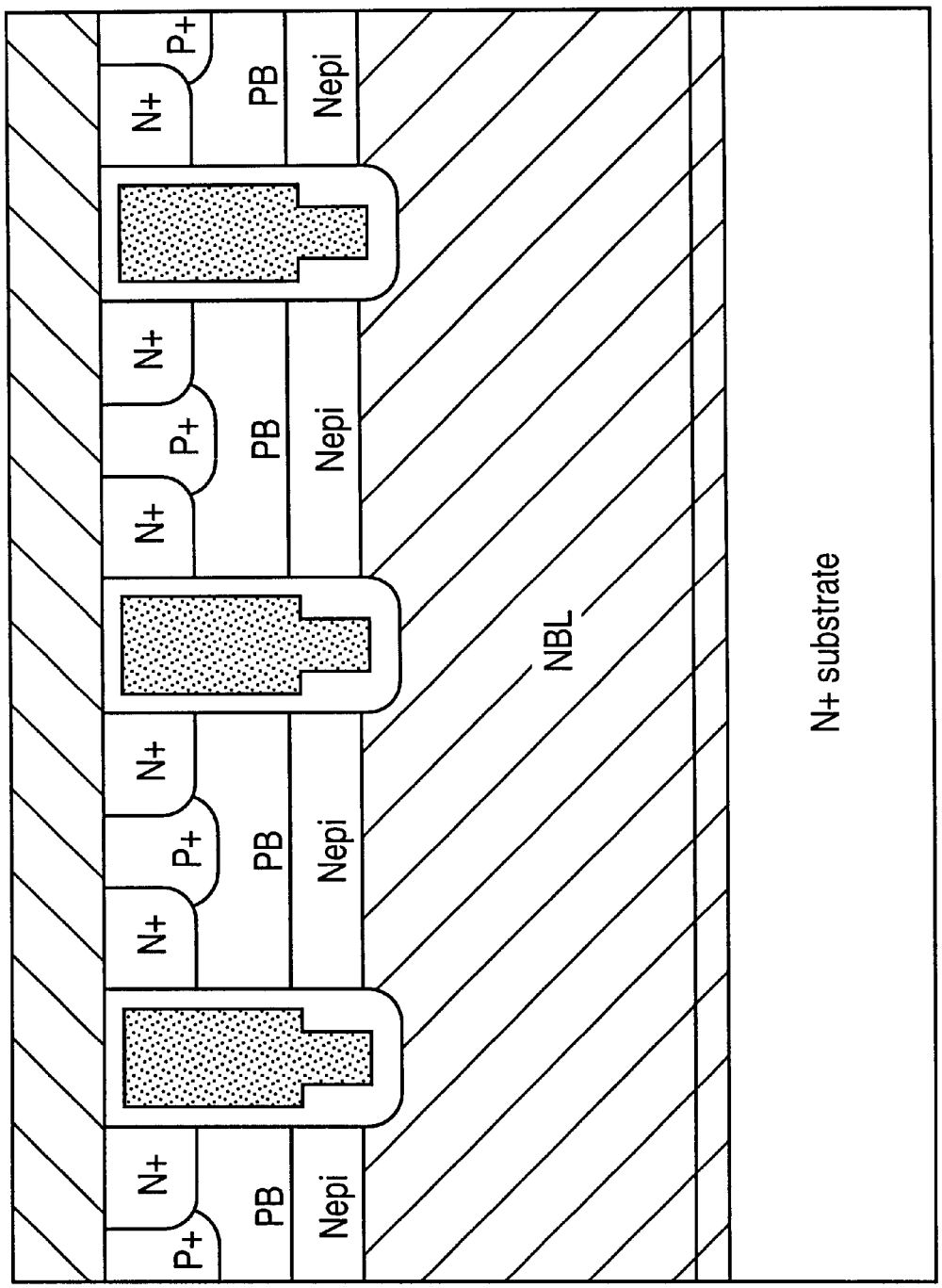
Figure 39:
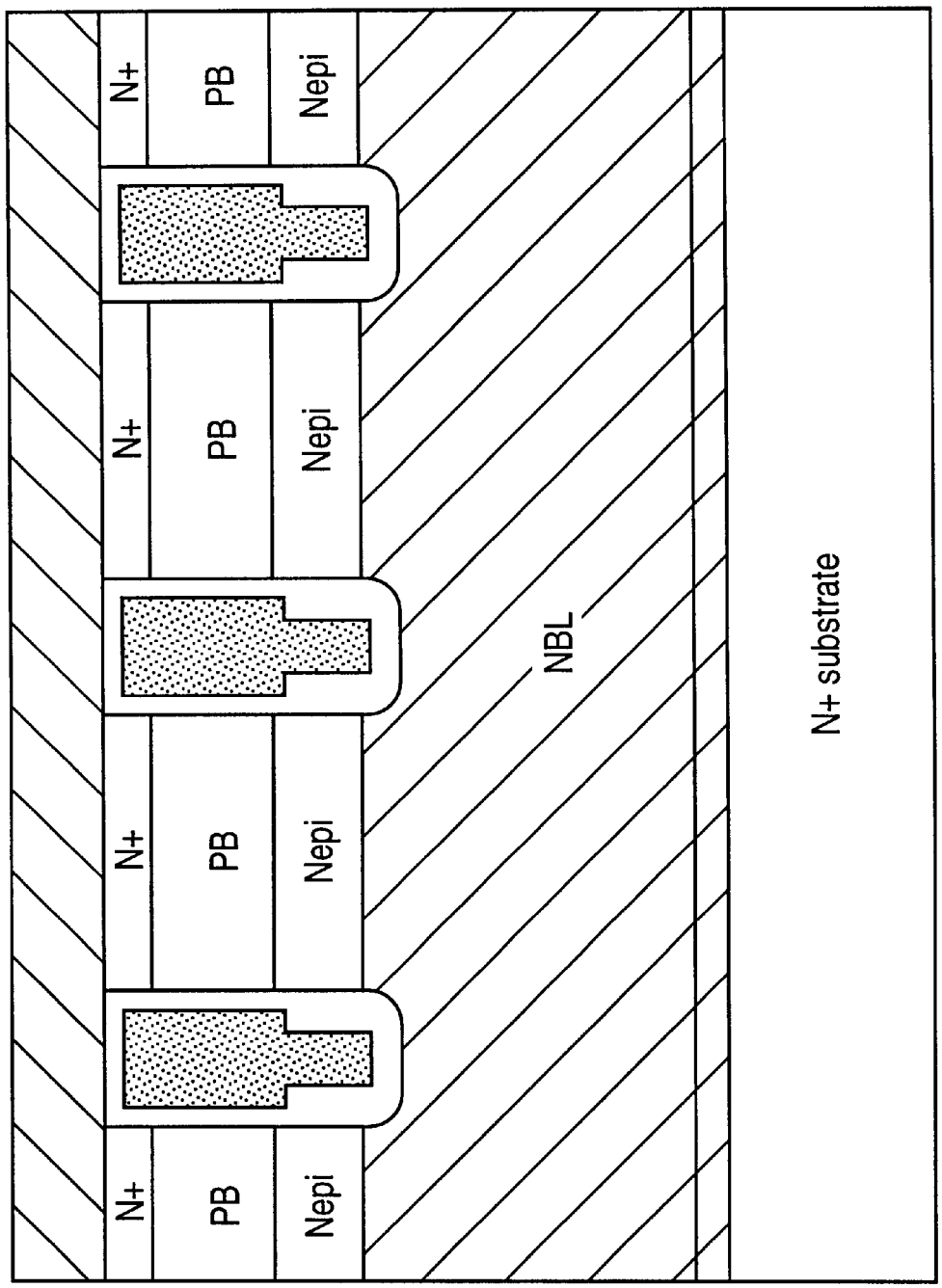

FIG. 36 shows a MOSFET having flat-bottomed P body regions and a diode cell incorporated at periodic intervals among the MOSFET cells. In the preferred version of this MOSFET a keyhole-shaped gate is employed. FIG. 37 shows an embodiment where the P body does not extend to the surface but instead is contacted in the third dimension. A shallow P+region is shown within the mesa at a depth greater than the N+source regions. FIG. 38 shows an embodiment wherein the trenches extend into an N buried layer formed at the interface between the epi layer and the substrate. FIG. 39 shows an embodiment where the P body is contacted in the third dimension, and the trenches extend into an N buried layer.

Figure 40C:
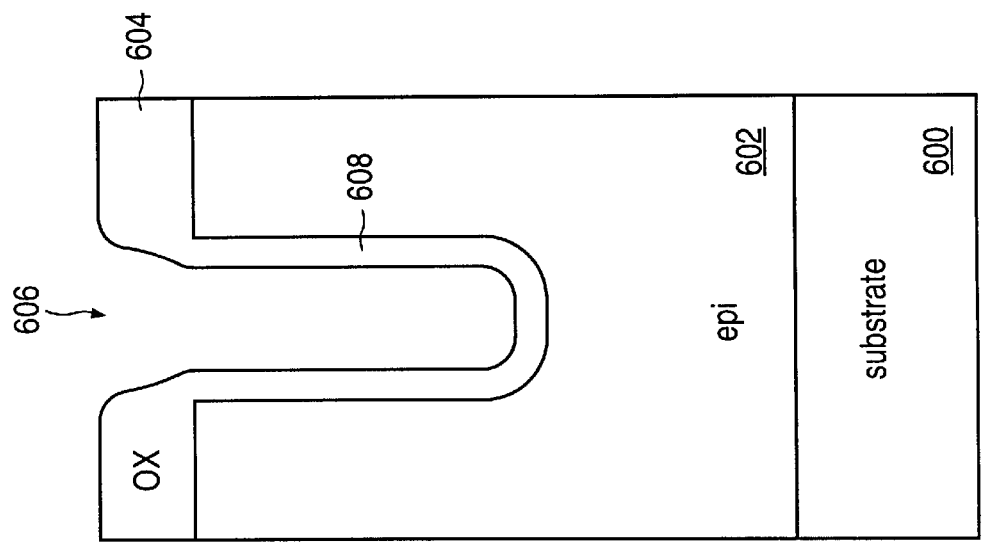
Figure 40B:
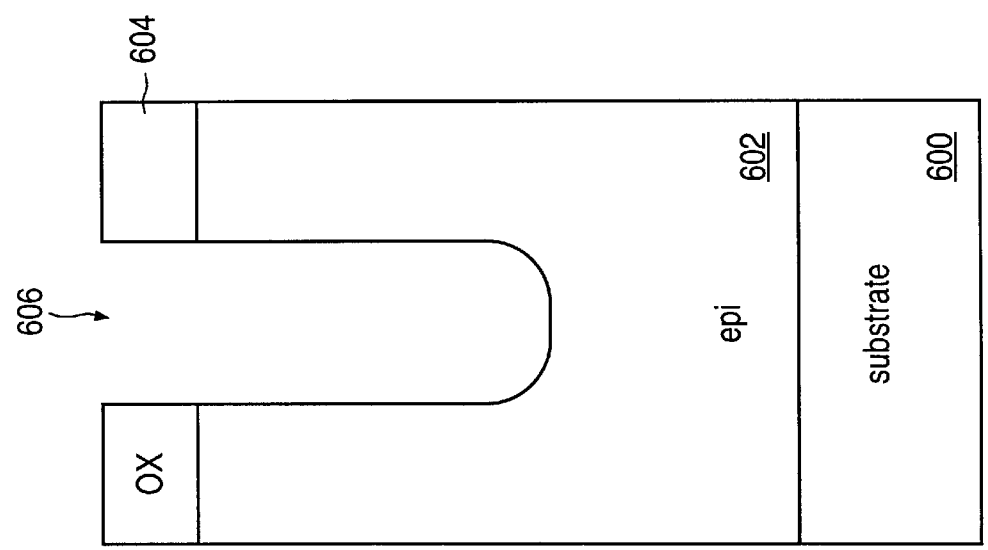
Figure 40A:
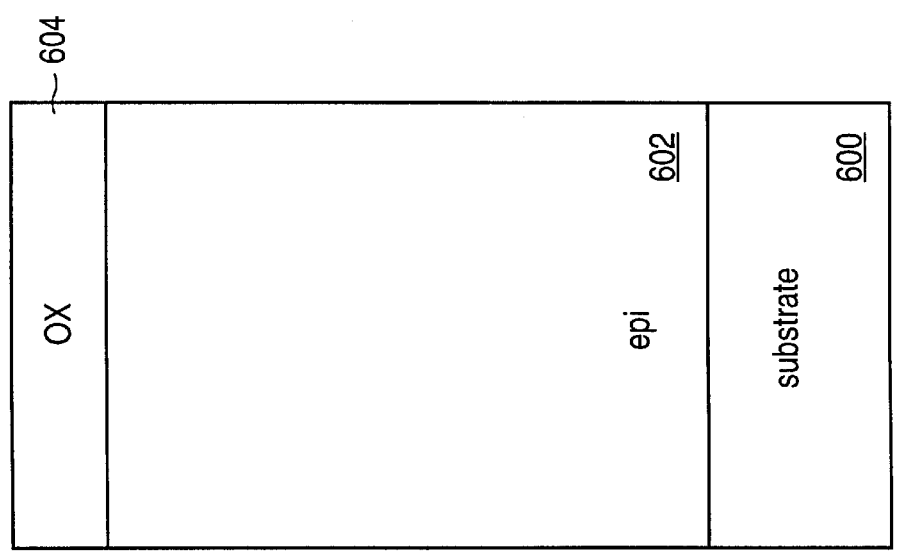
Figure 40I:
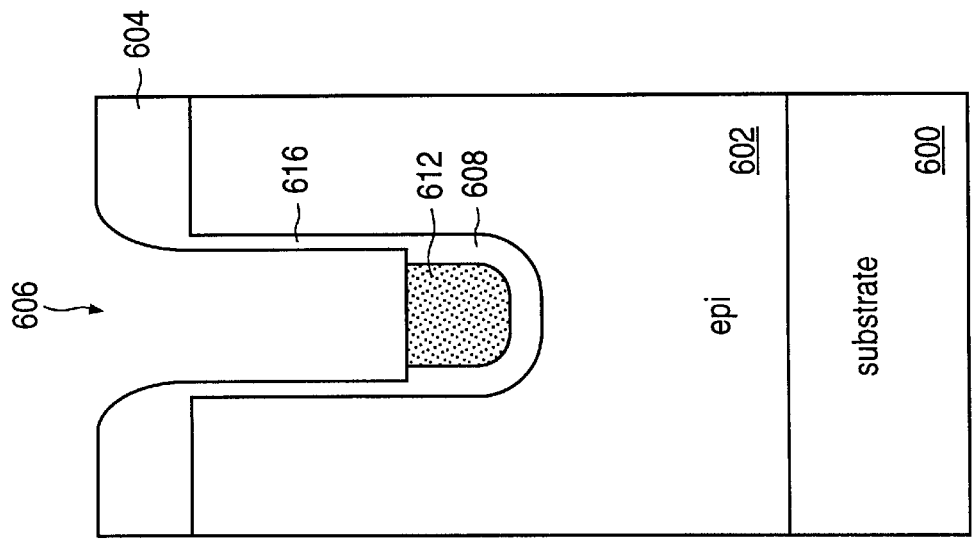

A process sequence for forming a device having a keyhole shaped trench is illustrated in FIGS. 40A–40L. The process starts with an epi layer 602 grown on a substrate 600. An oxide layer 604 is formed at the top surface of epi layer 602, as shown in FIG. 40A. Oxide layer 604 is patterned and a trench 606 is etched, as shown in FIG. 40B. A sacrificial oxide layer (not shown) is formed on the walls of the trench and removed. An oxide lining 608 is then grown on the walls of trench 606 (as shown in FIG. 40C).

Figure 40H:
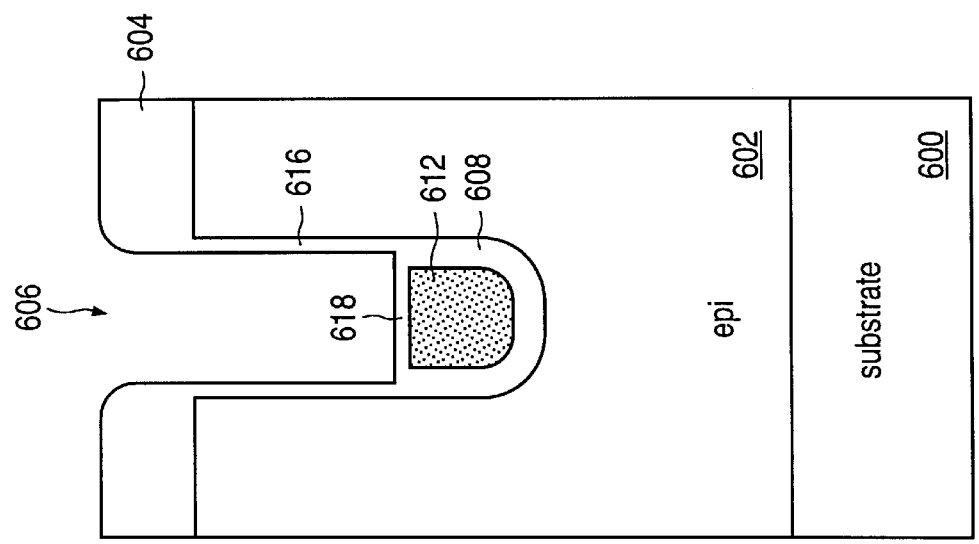
Figure 40G:
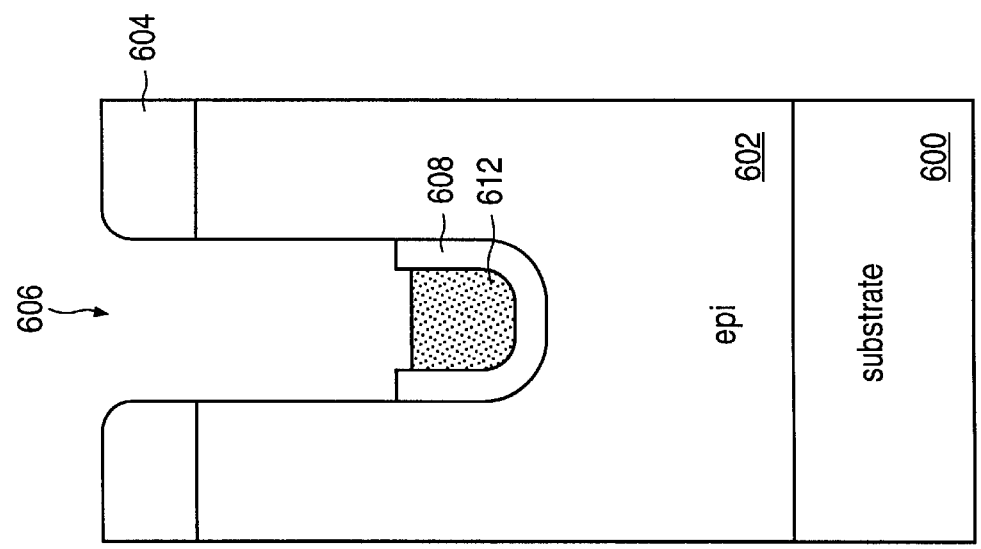

As shown in FIGS. 40D and 40E, a polysilicon layer 610 is deposited to fill the trench 606 and then etched back such that a portion 612 remains at the bottom of the trench. The oxide lining 608 is then etched from the walls of the trench 606, as shown in FIG. 40F. An anisotropic silicon etch is then performed to depress the top surface of polysilicon portion 612 below the top surface of oxide lining 608, as shown in FIG. 40G. A thermal oxidation process is then applied, forming an oxide layer 616 on the walls of the trench 606 and an oxide layer 618 at the top surface of polysilicon portion 612. The result is shown in FIG. 40H. Oxide layer 618 is then etched, a portion of oxide layer 616 being removed in the process, producing the structure shown in FIG. 40I.

Figure 40L:
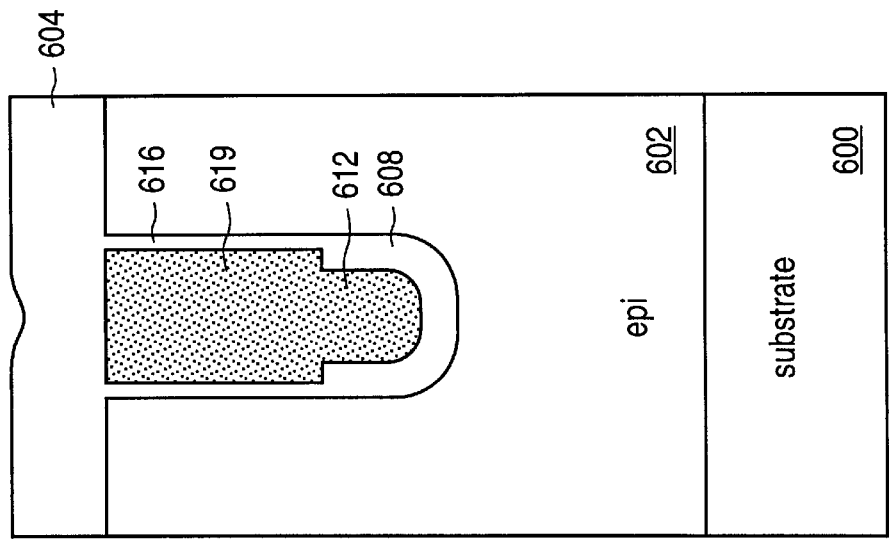
Figure 40K:
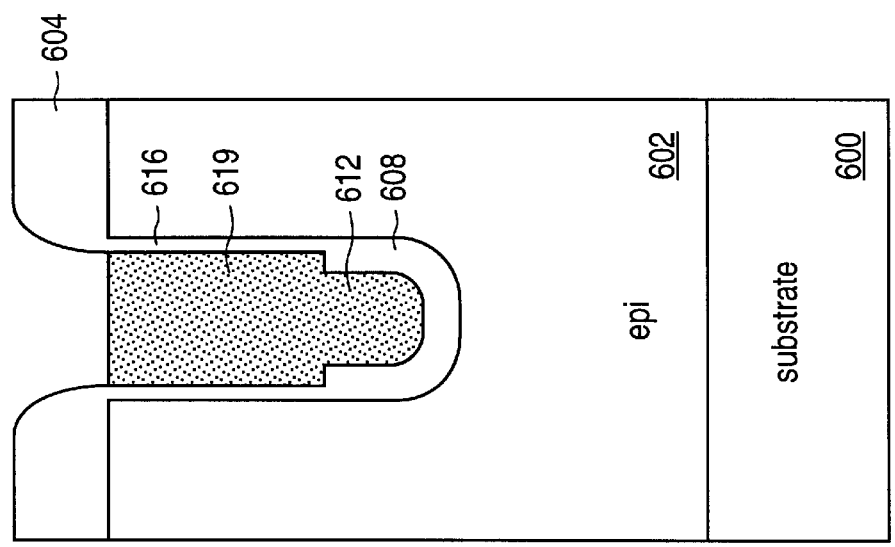
Figure 40J:
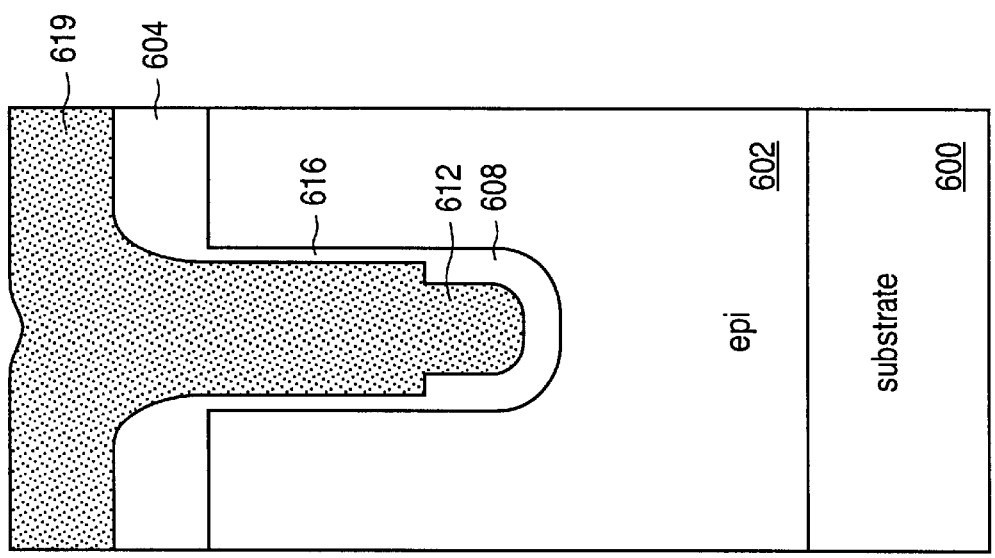

A second polysilicon layer 619 is then deposited over the entire structure, as shown in FIG. 40J. Polysilicon layer 619 is etched back, as shown in FIG. 40K. The top surface of polysilicon layer 619 is then oxidized, as shown in FIG. 40L.

Figure 41C:
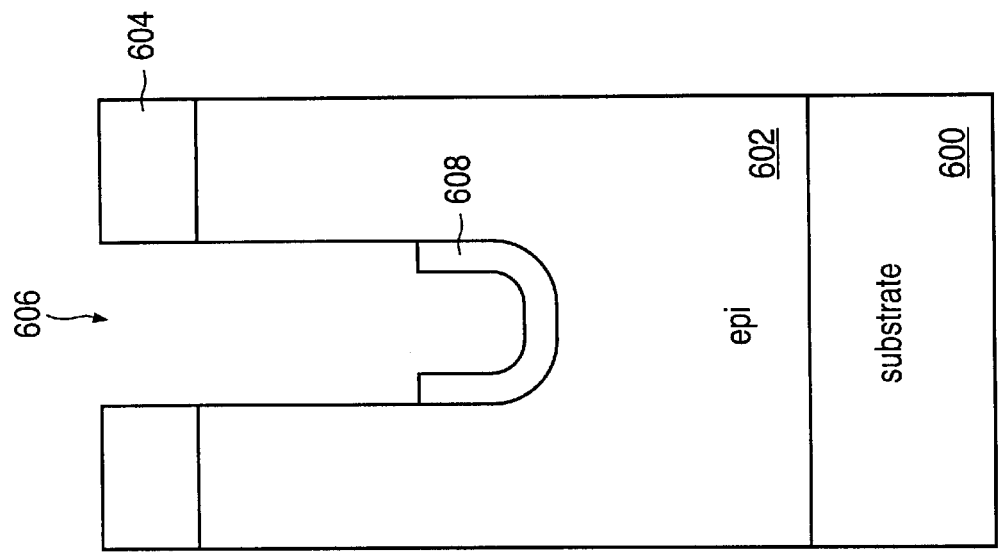
FIGS. 41A–41F illustrate an alternative process sequence of fabricating a MOSFET having a keyhole-shaped gate electrode.
Figure 41B:
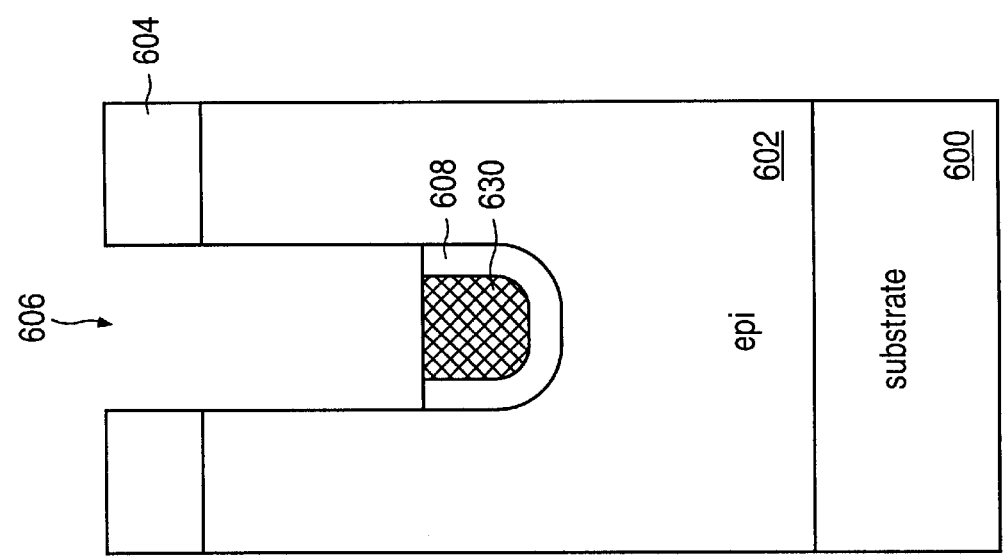
Figure 41A:
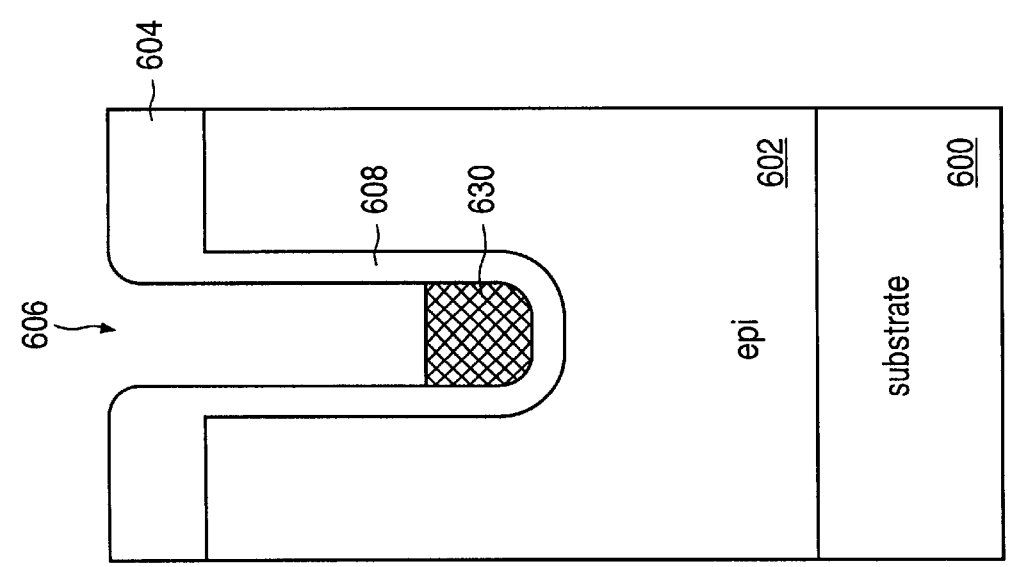

A variation of this process is illustrated in FIGS. 41A–41F. After the oxide lining 608 has been formed on the walls of the trench, as shown in FIG. 40C, a photoresist layer is applied, developed, and washed away, leaving only a portion 630 at the bottom of the trench 606. This is shown in FIG. 41A. Oxide lining 608 is then etched from the walls of the trench 606, as shown in FIG. 41B and the portion 630 of the photoresist layer is removed from the bottom of the trench. This yields the structure shown in FIG. 41C.

Figures 41D, 41E, 41F:
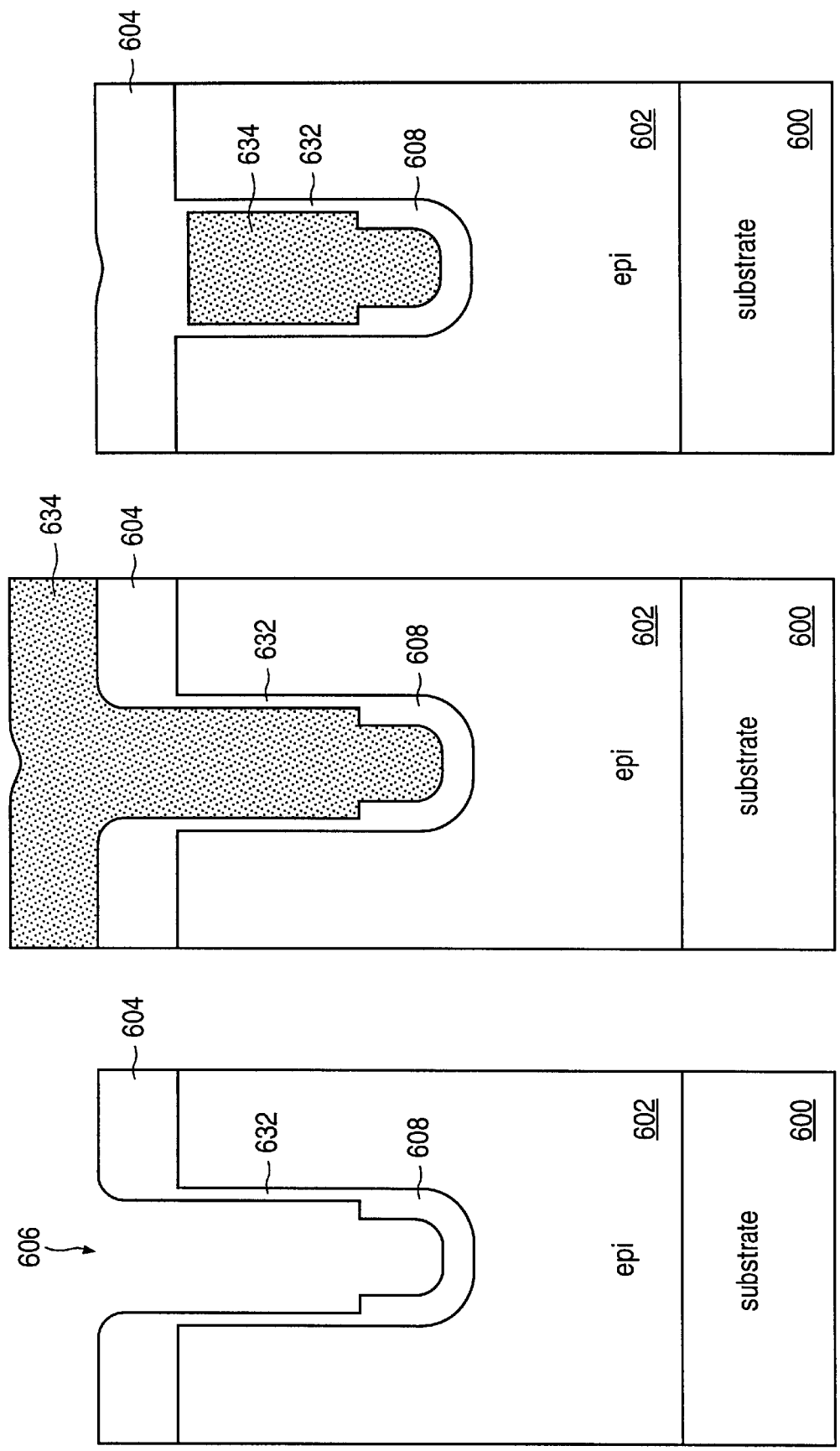

A gate oxide layer 632 is thermally grown on the walls of trench 606, and trench 606 is filled with a polysilicon layer 634, as shown in FIGS. 41D and 41E. Polysilicon layer 634 is etched back to the level of the top surface of the epi layer 602. Polysilicon layer 634 is then oxidized thermally to produce the device shown in FIG. 41F.

Figure 42C:
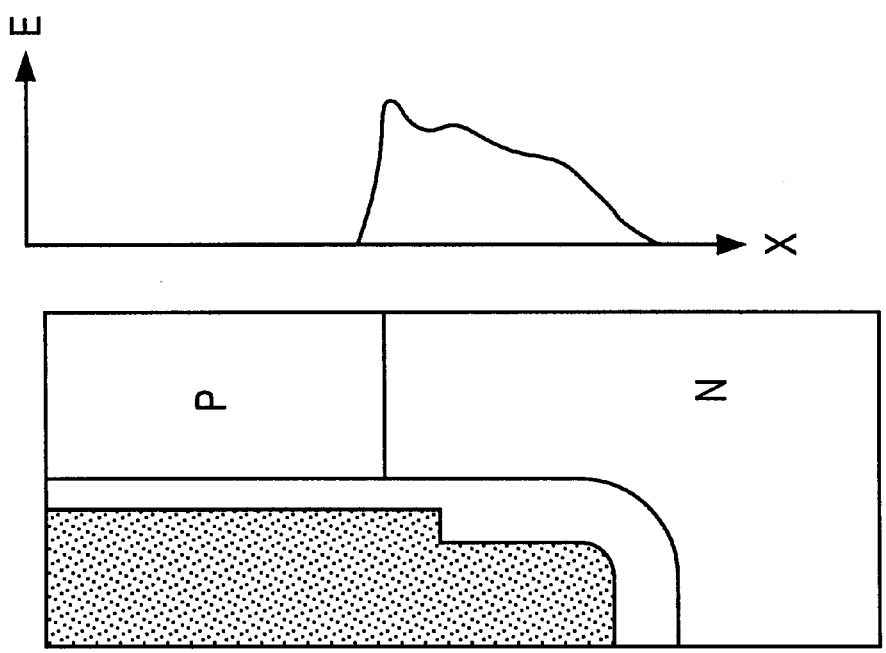

FIGS. 42A–42C show a comparison of the strength of the electric field along the sidewall of the trench in a prior art trench device with the strength of the electric field in embodiments of this invention. FIG. 41A shows that in the prior art device the electric field has two sharp peaks which occur, respectively, at the body-drain junction and the bottom of the gate electrode. FIG. 42B shows a device having a thick oxide layer on the bottom of the trench. As indicated, the electric field still has a sharp peak at the body-drain junction but the peak at the bottom of the gate electrode is somewhat lower than in the prior art device. Finally, FIG. 42C shows a device having a keyhole shaped gate electrode. In this case, the electric field still reaches a peak at the body-drain junction but the sharp peak at the bottom of the gate electrode is eliminated.

While numerous embodiments in accordance with this invention have been described, it will be understood that these embodiments are illustrative only and not limiting of the broad scope or the broad principles of this invention.

We claim:

1. A process of manufacturing a trench gate semiconductor device comprising:
   providing a semiconductor material;
   forming a trench at a surface of the semiconductor material;
   placing the semiconductor material in a reaction chamber;
   producing charged particles of a dielectric within the chamber;
   creating an electric field in the reaction chamber, the electric field causing the charged particles to move towards the semiconductor material such that the dielectric is deposited at a greater thickness on a bottom of the trench than on a sidewall of the trench;
   depositing a conductive material in the trench to form a gate electrode; and
   removing the dielectric from the sidewall of the trench.

2. The process of claim 1 wherein removing the dielectric comprises etching.

3. The process of claim 1 comprising, after removing the dielectric, heating the semiconductor material to form a thin oxide layer on the sidewall of the trench.

4. The process of claim 3 wherein depositing a conductive material in the trench comprises filling the trench with a first polysilicon layer.

5. The process of claim 4 comprising removing a portion of the first polysilicon layer such that a surface of the first polysilicon layer is approximately coplanar with the surface of the semiconductor material.

6. The process of claim 5 comprising oxidizing the first polysilicon layer to form a second oxide layer.

7. The process of claim 6 comprising depositing a glass layer on the second oxide layer.

8. The process of claim 4 comprising removing a portion of the first polysilicon layer such that a surface of the first polysilicon layer is at a level below the surface of the semiconductor material.

9. The process of claim 8 comprising oxidizing the first polysilicon layer to form a second oxide layer.

10. The process of claim 9 comprising depositing a glass layer on the second oxide layer.

11. The process of claim 8 comprising depositing a second polysilicon layer on the first polysilicon layer, the second polysilicon layer covering a portion of the thin oxide layer at an upper corner of the trench.

12. The process of claim 11 comprising removing a portion of the second polysilicon layer while leaving the second polysilicon layer covering the portion of the thin oxide layer at the upper corner of the trench.

13. The process of claim 12 comprising forming a second oxide layer over the second polysilicon layer.

14. The process of claim 4 comprising depositing a photoresist layer over the dielectric.

15. The process of claim 14 comprising removing a first portion of the photoresist layer while leaving a second portion of the photoresist layer overlying the dielectric at the bottom of the trench before removing the dielectric from the sidewall of the trench.

16. The process of claim 4 comprising removing a portion of the first polysilicon layer such that a surface of the first polysilicon layer is at a level above the surface of the semiconductor material.

17. The process of claim 16 comprising oxidizing the first polysilicon layer to form a second oxide layer.

18. The process of claim 17 wherein after oxidizing the first polysilicon layer the second oxide layer extends from a level above the surface of the semiconductor material into the trench.

19. A process of manufacturing a trench gate semiconductor device comprising:
    providing a semiconductor material;
    forming a trench at a surface of the semiconductor material;
    placing the semiconductor material in a reaction chamber;
    producing charged particles of a dielectric within the chamber;
    creating an electric field in the reaction chamber, the electric field causing the charged particles to move towards the semiconductor material such that the dielectric is deposited at a greater thickness on a bottom of the trench than on a sidewall of the trench;
    depositing a conductive material in the trench to form a gate electrode; and
    forming a second trench in the semiconductor material, wherein the electric field causes the charged particles to move towards the semiconductor material such that the dielectric is deposited at a greater thickness on a bottom of the second trench than on a sidewall of the second trench.

20. The process of claim 19 wherein depositing the conductive material comprises depositing polysilicon such that the polysilicon fills both the first and second trenches and overlies the semiconductor material between the first and second trenches.

21. The process of claim 20 comprising depositing a hard layer over the polysilicon in the area of the second trench.

22. The process of claim 21 comprising etching a portion of the polysilicon in the area of the first trench, the hard layer acting as a mask layer in the area of the second trench, the etching forming an exposed edge of the polysilicon between the areas of the first and second trenches.

23. The process of claim 22 comprising heating the polysilicon so as to form an oxide layer in the area of the first trench.

24. The process of claim 23 wherein the heating forms a second oxide layer in the exposed edge of the polysilicon, the polysilicon in the area of the second trench forming a gate bus.

25. A process of manufacturing a trench gate semiconductor device comprising:

providing a semiconductor material;

forming a trench at a surface of the semiconductor material;

placing the semiconductor material in a reaction chamber;

producing charged particles of a dielectric within the chamber;

creating an electric field in the reaction chamber, the electric field causing the charmed particles to move towards the semiconductor material such that the dielectric is deposited at a greater thickness on a bottom of the trench than on a sidewall of the trench;

depositing a conductive material in the trench to form a gate electrode;

and further comprising, before forming the trench:

depositing at least one layer on the surface of the semiconductor materal, the at least one layer comprising a hard layer;

removing a portion of the at least one layer to expose an area of the surface of the semiconductor material, leaving exposed edges of the at least one layer;

depositing a nitride layer, the nitride layer covering the at least one hard layer, the exposed area of the surface of the semiconductor material, and the exposed edges of the at least one hard layer; and etching the nitride layer anisotropically so as to remove the nitride layer from a top surface of the at least one hard layer and a portion of the exposed area of the surface of the semiconductor material while leaving a portion of the nitride layer covering the exposed edges of the at least one hard layer.

26. The process of claim 25 wherein depositing the at least one hard layer comprises depositing a second nitride layer.

27. The process of claim 26 wherein depositing the at least one hard layer comprises depositing an oxide-nitride-oxide sandwich.

* * * * *